(12) United States Patent
Ikeda et al.

(10) Patent No.: US 9,837,478 B2
(45) Date of Patent: Dec. 5, 2017

(54) DISPLAY DEVICE AND MANUFACTURING METHOD THEREOF

(71) Applicant: Semiconductor Energy Laboratory Co., Ltd., Atsugi-shi, Kanagawa-ken (JP)

(72) Inventors: Hisao Ikeda, Kanagawa (JP); Toshiki Sasaki, Kanagawa (JP); Satoshi Seo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/276,979

(22) Filed: Sep. 27, 2016

(65) Prior Publication Data

US 2017/0098689 A1    Apr. 6, 2017

(30) Foreign Application Priority Data

Oct. 1, 2015 (JP) .................................. 2015-195939

(51) Int. Cl.
*H01L 27/32* (2006.01)
*G02F 1/1335* (2006.01)
(Continued)

(52) U.S. Cl.
CPC ........ *H01L 27/3267* (2013.01); *G02F 1/1368* (2013.01); *G02F 1/133553* (2013.01);
(Continued)

(58) Field of Classification Search
CPC ............... H01L 27/3267; H01L 27/323; H01L 27/3225; H01L 29/7869; G02F 1/133553;
(Continued)

(56) References Cited

U.S. PATENT DOCUMENTS 6,281,952 B1 *   8/2001   Okamoto .......... G02F 1/133514
                                                 349/106
6,493,051 B2 * 12/2002   Ha .................... G02F 1/133555
                                                 349/113
(Continued)

FOREIGN PATENT DOCUMENTS

CN      001967328 A     5/2007
JP      2001-066593 A   3/2001
(Continued)

OTHER PUBLICATIONS

Shieh.H, "Transflective display by Hybrid OLED and LCD", LEOS 2005 (IEEE Lasers and Electro-Optics Society Annual Meeting), Oct. 22, 2005, pp. 650-651, IEEE.
(Continued)

*Primary Examiner* — Joseph L Williams
*Assistant Examiner* — Jose M Diaz
(74) *Attorney, Agent, or Firm* — Fish & Richardson P.C.

(57) ABSTRACT

Provided is a novel display device that is highly convenient or reliable or a display device with low power consumption and high display quality. The display device includes a first pixel and a second pixel. The first pixel and the second pixel are adjacent to each other. Each of the first pixel and the second pixel includes a first display region and a second display region. The first display region is configured to reflect incident light. The second display region is positioned inside the first display region and configured to emit light. A position of the second display region inside the first display region in the first pixel and a position of the second display region inside the first display region in the second pixel are different from each other.

20 Claims, 59 Drawing Sheets

(51) Int. Cl.
*G02F 1/1368* (2006.01)
*H01L 29/786* (2006.01)
*G02F 1/1333* (2006.01)

(52) U.S. Cl.
CPC ............... *G02F 1/13338* (2013.01); *G02F 2001/13685* (2013.01); *G02F 2001/133342* (2013.01); *G02F 2001/133565* (2013.01); *H01L 27/323* (2013.01); *H01L 27/3225* (2013.01); *H01L 29/7869* (2013.01)

(58) Field of Classification Search
CPC .. G02F 1/1368; G02F 1/13338; G02F 1/1336; G02F 2001/133342; G02F 2001/13685; G02F 2001/133565; G04G 9/0041
See application file for complete search history.

(56) References Cited

U.S. PATENT DOCUMENTS

| | | | |
|---|---|---|---|
| 6,556,260 | B1 | 4/2003 | Itou et al. |
| 6,714,268 | B2 | 3/2004 | Wang et al. |
| 6,750,932 | B2 * | 6/2004 | Kim ............... G02F 1/133615 349/113 |
| 6,912,021 | B2 | 6/2005 | Kimura |
| 7,038,641 | B2 | 5/2006 | Hirota et al. |
| 7,084,936 | B2 | 8/2006 | Kato |
| 7,102,704 | B2 | 9/2006 | Mitsui et al. |
| 7,176,991 | B2 | 2/2007 | Mitsui et al. |
| 7,239,361 | B2 | 7/2007 | Kato |
| 7,248,235 | B2 | 7/2007 | Fujii et al. |
| 7,304,696 | B2 | 12/2007 | Yamagishi |
| 7,385,654 | B2 | 6/2008 | Mitsui et al. |
| 7,724,327 | B2 * | 5/2010 | Tai ............... G02F 1/133555 349/114 |
| 8,159,449 | B2 | 4/2012 | Kimura et al. |
| 9,189,997 | B2 | 11/2015 | Kimura et al. |
| 9,349,325 | B2 | 5/2016 | Yamazaki et al. |
| 9,666,654 | B2 * | 5/2017 | Ha ............... H01L 27/3262 |
| 2003/0052869 | A1 | 3/2003 | Fujii et al. |
| 2003/0102801 | A1 | 6/2003 | Senbonmatsu |
| 2003/0201960 | A1 | 10/2003 | Fujieda |
| 2006/0072047 | A1 | 4/2006 | Sekiguchi |
| 2008/0180618 | A1 | 7/2008 | Fujieda |
| 2010/0171905 | A1 | 7/2010 | Huang |
| 2013/0328948 | A1 * | 12/2013 | Kunkel ............... G09G 3/22 345/690 |
| 2015/0279918 | A1 | 10/2015 | Teraguchi et al. |
| 2016/0042702 | A1 | 2/2016 | Hirakata et al. |
| 2016/0283028 | A1 | 9/2016 | Yamazaki et al. |
| 2016/0299387 | A1 | 10/2016 | Yamazaki et al. |
| 2017/0040402 | A1 | 2/2017 | Yasumoto et al. |
| 2017/0040403 | A1 | 2/2017 | Kuwabara |
| 2017/0040404 | A1 | 2/2017 | Kusunoki |

FOREIGN PATENT DOCUMENTS

| | | |
|---|---|---|
| JP | 2002-196702 A | 7/2002 |
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-108771 A | 4/2007 |
| JP | 2007-232882 A | 9/2007 |
| JP | 4161574 B2 | 10/2008 |
| JP | 2011-248351 A1 | 12/2011 |
| JP | 2013-221965 A | 10/2013 |
| KR | 2004-0074658 A | 8/2004 |
| TW | 588185 | 5/2004 |
| WO | WO-2004-053819 A | 6/2004 |

OTHER PUBLICATIONS

Lee.J et al., "High ambient-contrast-ratio display using tandem reflective liquid crystal display and organic light-emitting device", Optics Express, Nov. 14, 2005, vol. 13, No. 23, pp. 9431-9438.
International Search Report (Application No. PCT/IB2016/055648) dated Dec. 13, 2016.
Written Opinion (Application No. PCT/IB2016/055648) dated Dec. 13, 2016.

* cited by examiner

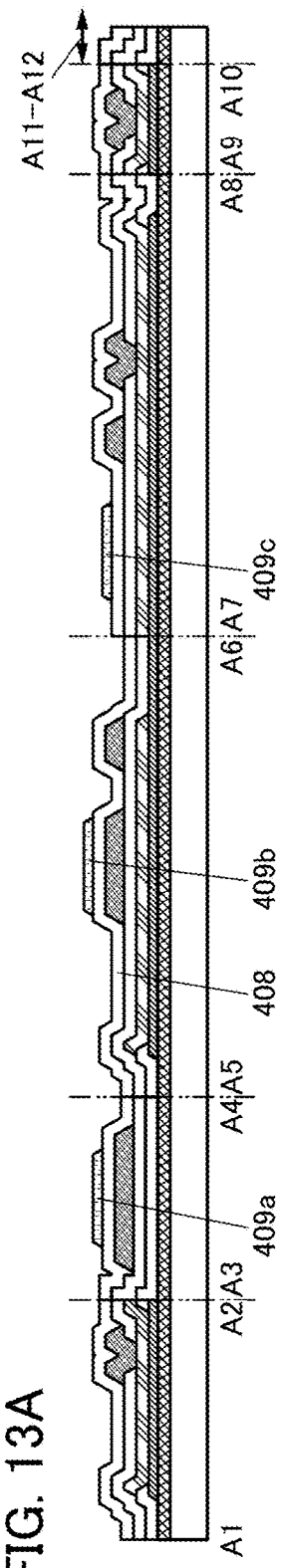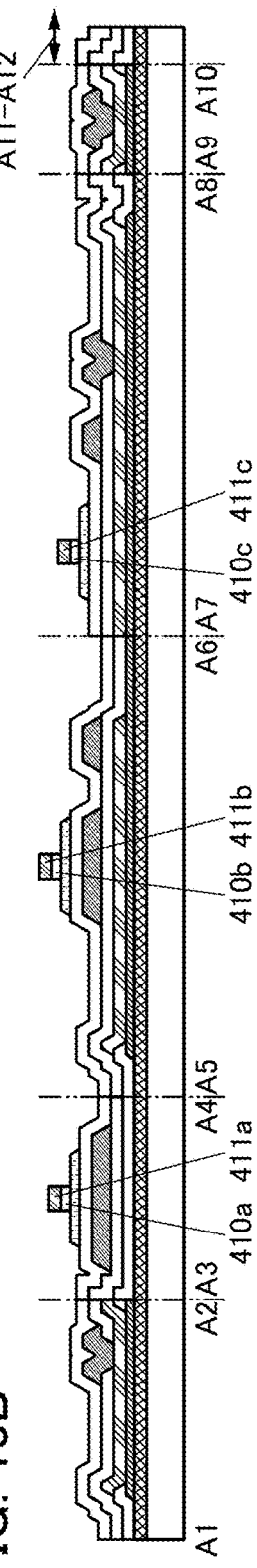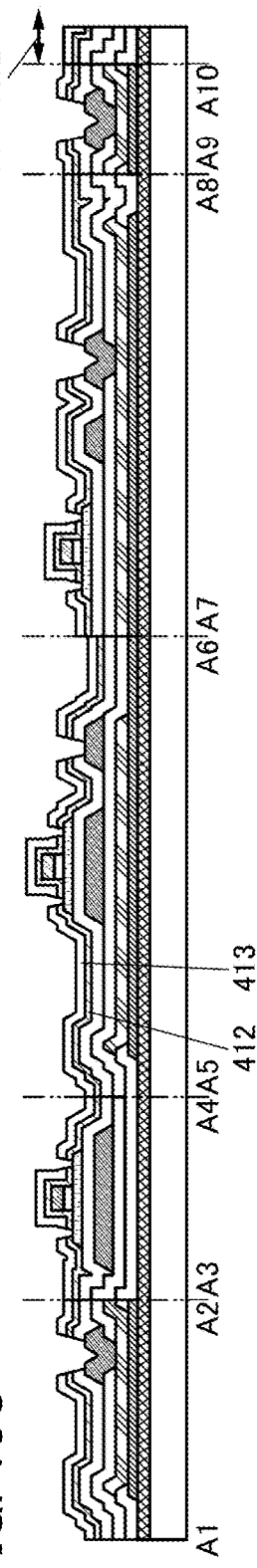

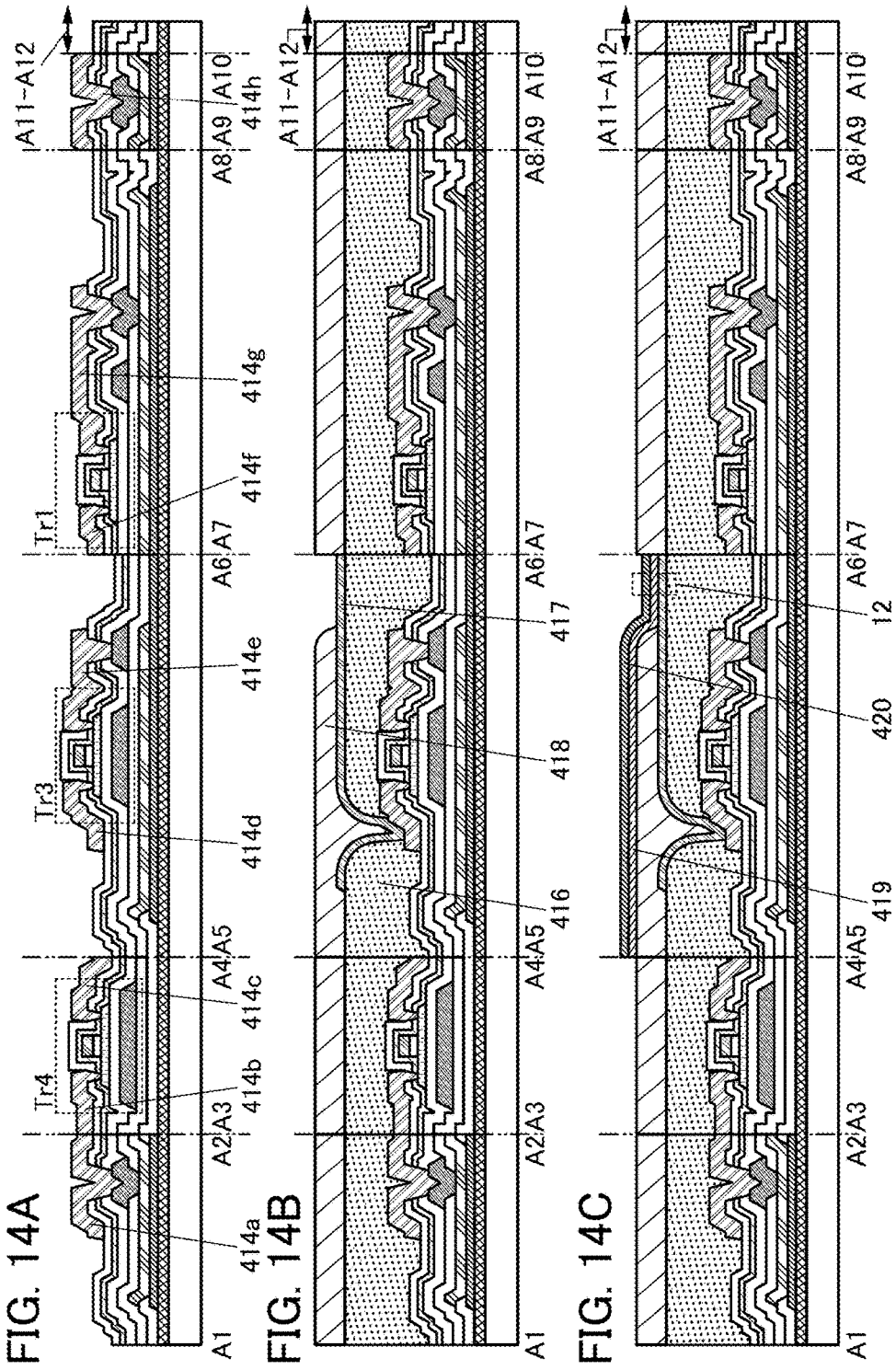

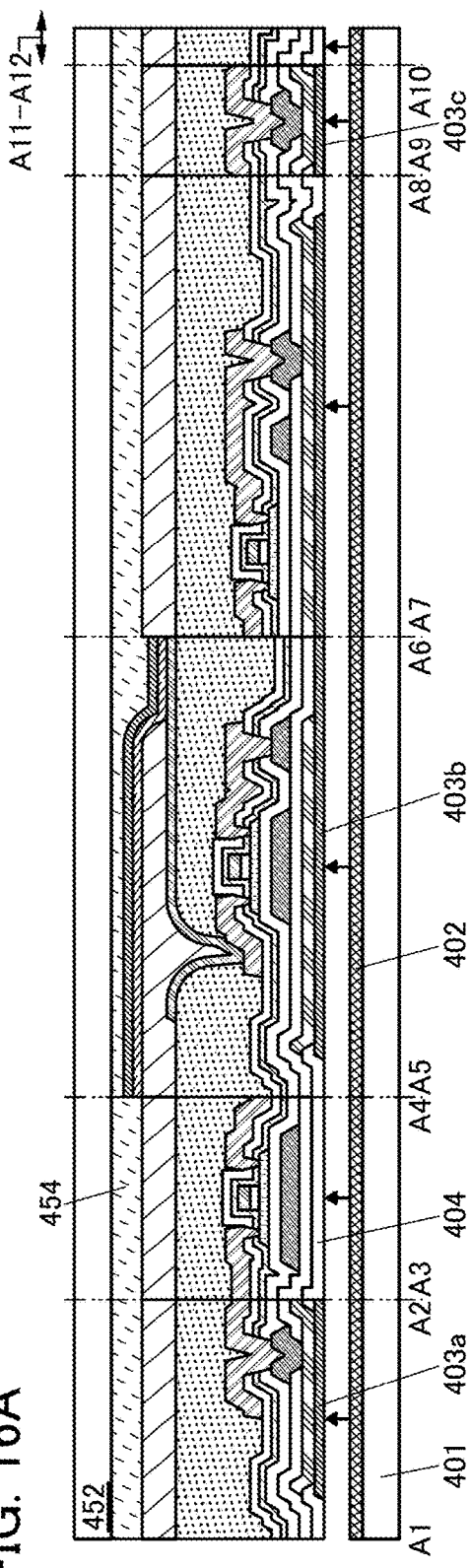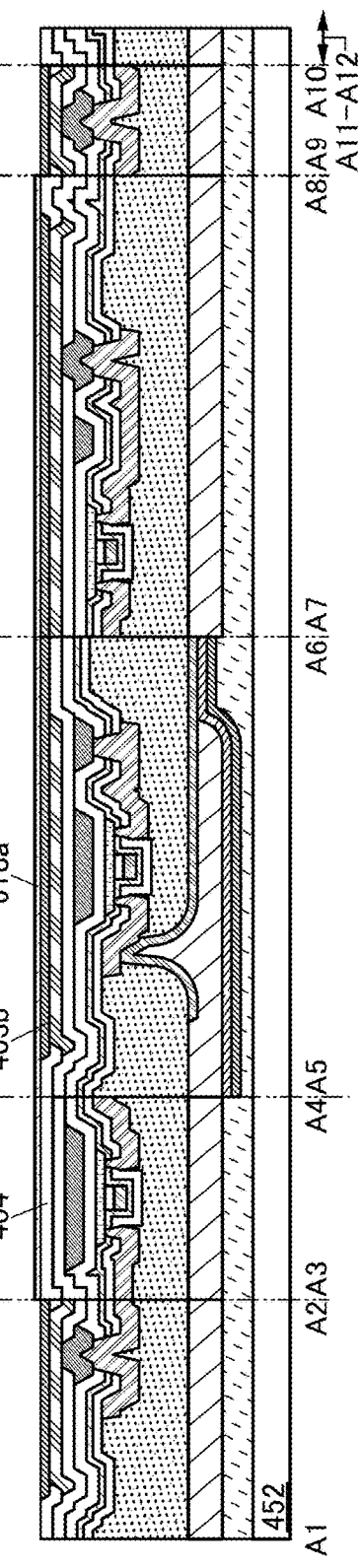
FIG. 16A
FIG. 16B

100F

100F

FIG. 38A
300B
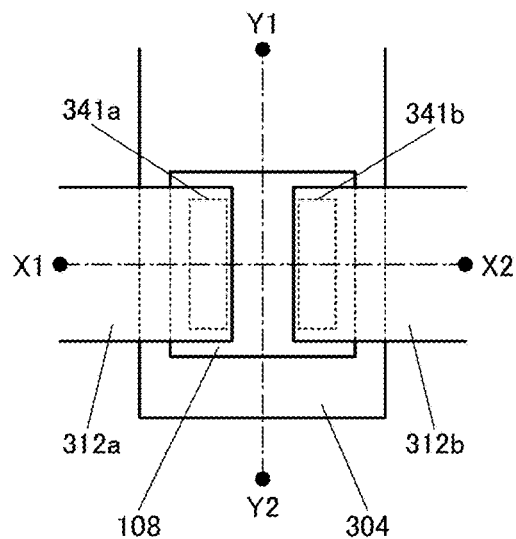
FIG. 38B
300B
FIG. 38C
300B
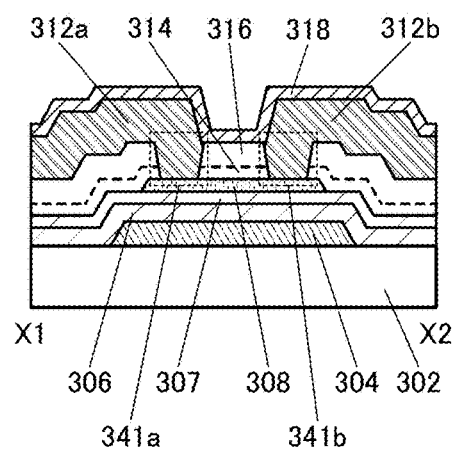
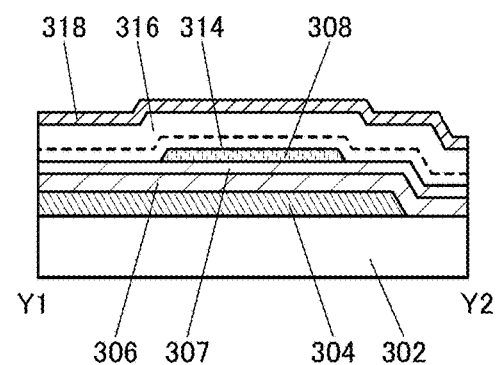

300E

300E

300F

300F

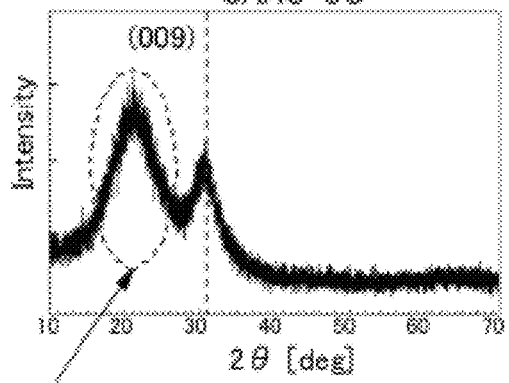
FIG. 42A out-of-plane method CAAC-OS
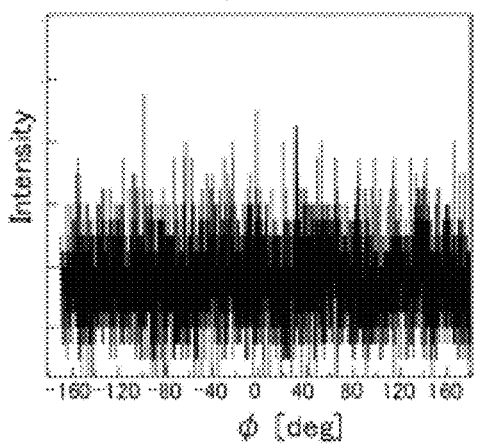
FIG. 42B in-plane method φ scan CAAC-OS
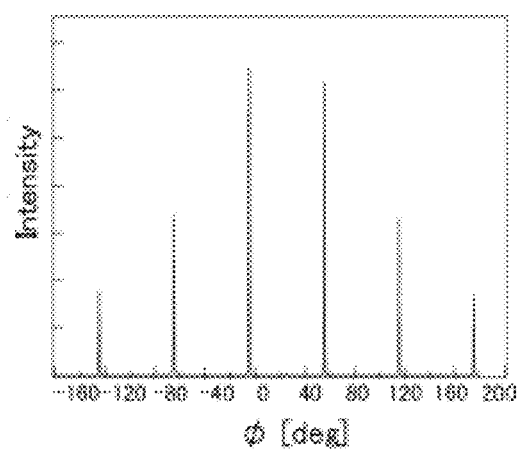
FIG. 42C in-plane method φ scan single-crystal OS
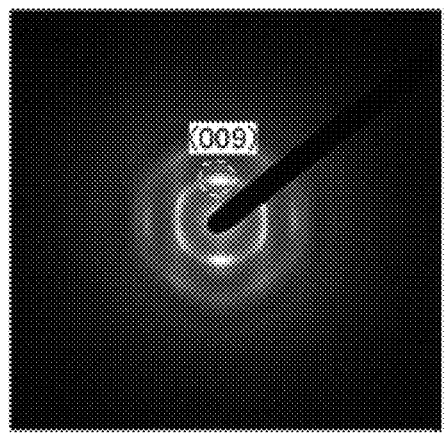
FIG. 42D
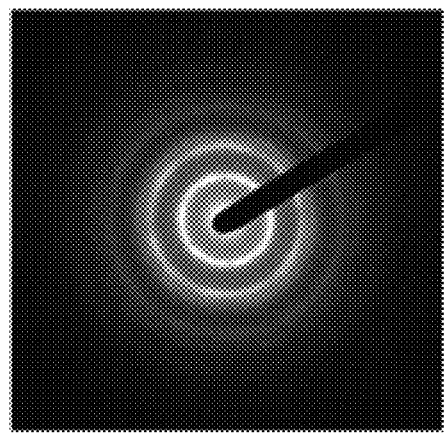
FIG. 42E

9100

9101

9103

9102

9104

DISPLAY DEVICE AND MANUFACTURING METHOD THEREOF

TECHNICAL FIELD

One embodiment of the present invention relates to a display device and a manufacturing method thereof.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, a memory device, a method for driving any of them, and a method for manufacturing any of them.

BACKGROUND ART

A liquid crystal display device in which a surface-emitting light source is provided as a backlight and combined with a transmissive liquid crystal display device in order to reduce power consumption and suppress a reduction in display quality is known (see Patent Document 1).

REFERENCE

Patent Document

[Patent Document 1] Japanese Published Patent Application No. 2011-248351

DISCLOSURE OF INVENTION

An object of one embodiment of the present invention is to provide a novel display device that is highly convenient or reliable.

Another object of one embodiment of the present invention is to provide a display device with low power consumption and high display quality. Another object of one embodiment of the present invention is to provide a novel display device.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a display device including a first pixel and a second pixel. The first pixel and the second pixel are adjacent to each other. Each of the first pixel and the second pixel includes a first display region and a second display region. The first display region is configured to reflect incident light. The second display region is positioned inside the first display region and configured to emit light. A position of the second display region inside the first display region in the first pixel and a position of the second display region inside the first display region in the second pixel are different from each other.

Another embodiment of the present invention is a display device including a first pixel and a second pixel. The first pixel and the second pixel are adjacent to each other. Each of the first pixel and the second pixel includes a first display region, a second display region, a first display element, and a second display element. The first display region is configured to reflect incident light. The second display region is positioned inside the first display region and configured to emit light. The first display element is provided to overlap with the first display region. The second display element is provided to overlap with the second display region. A position of the second display region inside the first display region in the first pixel and a position of the second display region inside the first display region in the second pixel are different from each other.

In the above structure, it is preferable that the first display element include a liquid crystal layer and the second display element include a light-emitting layer.

In the above structure, colors of light emitted from the second display element in the first pixel and the second display element in the second pixel are preferably different.

In the above structure, it is preferable that the first display element and the second display element be connected to different transistors and independently controlled.

In the above structure, the transistor preferably includes an oxide semiconductor film in a channel region.

In the above structure, the interval between the second display region in the first pixel and the second display region in the second pixel is preferably greater than or equal to 20 µm.

Another embodiment of the present invention is a display module including a touch sensor and the display device with any one of the above structures.

Another embodiment of the present invention is an electronic device including a battery and the display device with any one of the above structures or the display module.

With one embodiment of the present invention, a novel display device that is highly convenient or reliable can be provided. With one embodiment of the present invention, a display device with low power consumption and high display quality can be provided. With one embodiment of the present invention, a novel display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 13A to 13C are cross-sectional views illustrating a manufacturing process of a display device.

FIGS. 14A to 14C are cross-sectional views illustrating a manufacturing process of a display device.

FIGS. 16A and 16B are cross-sectional views illustrating a manufacturing process of a display device.

FIGS. 38A to 38C are a top view and cross-sectional views illustrating one embodiment of a transistor.

FIGS. 42A to 42E show structural analysis results of a CAAC-OS and a single-crystal oxide semiconductor by XRD and selected-area electron diffraction patterns of a CAAC-OS.

BEST MODE FOR CARRYING OUT THE INVENTION

Figure 1:
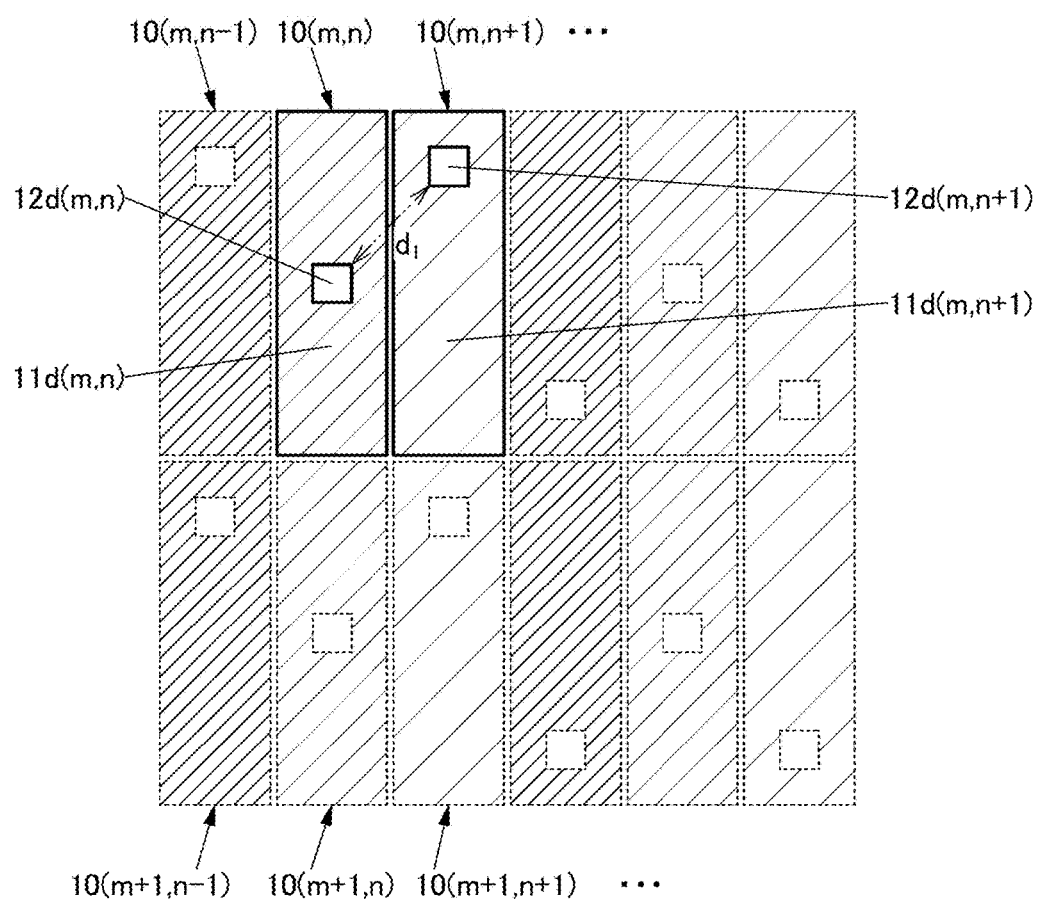
FIG. 1 is a schematic view illustrating a display region of a display element.

Embodiments will be described below with reference to drawings. However, the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, and the region are exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the terms "film" and "layer" can be interchanged with each other. For example, in some cases, the term "conductive film" can be used instead of the term "conductive layer", and the term "insulating layer" can be used instead of the term "insulating film".

Unless otherwise specified, off-state current in this specification and the like refers to drain current of a transistor in an off state (also referred to as a non-conducting state and a cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to drain current that flows when the gate-source voltage $V_{gs}$ is lower than the threshold voltage $V_{th}$.

The off-state current of a transistor depends on $V_{gs}$ in some cases. Therefore, "the off-state current of a transistor is I or lower" may mean that the off-state current of the transistor is I or lower at a certain $V_{gs}$. The off-state current of a transistor may refer to off-state current at a given $V_{gs}$, at $V_{gs}$ in a given range, at $V_{gs}$ at which sufficiently low off-state current is obtained, or the like.

As an example, an assumption is made that an n-channel transistor has a threshold voltage $V_{th}$ of 0.5 V and a drain current of $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it may be said that the off-state current of the transistor is $1\times10^{-19}$ A or lower. Since the drain current of the transistor is $1\times10^{-22}$ A or lower at a certain $V_{gs}$, it may be said that the off-state current of the transistor is $1\times10^{-22}$ A or lower.

In this specification and the like, the off-state current of a transistor with a channel width W is sometimes represented by a current value per channel width W or by a current value per given channel width (e.g., 1 μm). In the latter case, the off-state current may be represented by current per length (e.g., A/μm).

The off-state current of a transistor depends on temperature in some cases. Unless otherwise specified, the off-state current in this specification may be off-state current at room temperature, 60° C., 85° C., 95° C., or 125° C. Alternatively, the off-state current may be off-state current at a temperature at which the reliability of a semiconductor device or the like including the transistor is ensured or a temperature at which the semiconductor device or the like including the transistor is used (e.g., a temperature in the range of 5° C. to 35° C.). The state in which the off-state current of a transistor is I or lower may indicate that the off-state current of the transistor at room temperature, 60° C., 85° C., 95° C., 125° C., a temperature at which the reliability of a semiconductor device or the like including the transistor is ensured, or a temperature at which the semiconductor device or the like including the transistor is used (e.g., a temperature in the range of 5° C. to 35° C.) is I or lower at a certain $V_{gs}$.

The off-state current of a transistor depends on the voltage $V_{ds}$ between its drain and source in some cases. Unless otherwise specified, the off-state current in this specification may be off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at $V_{ds}$ at which the reliability of a semiconductor device or the like including the transistor is ensured or at $V_{ds}$ used in the semiconductor device or the like including the transistor. The state in which the off-state current of a transistor is I or lower may indicate that the off-state current of the transistor at $V_{ds}$ of 0.1 V, 0.8 V, 1 V, 1.2 V, 1.8 V, 2.5 V, 3 V, 3.3 V, 10 V, 12 V, 16 V, or 20 V, at $V_{ds}$ at which the reliability of a semiconductor device or the like including the transistor is ensured, or at $V_{ds}$ used in the semiconductor device or the like including the transistor is I or lower at a certain $V_{gs}$.

In the above description of the off-state current, a drain may be replaced with a source. That is, the off-state current sometimes refers to current that flows through a source of a transistor in the off state.

In this specification and the like, the term "leakage current" sometimes expresses the same meaning as "off-state current". In this specification and the like, the off-state current sometimes refers to current that flows between a source and a drain of a transistor in the off state, for example.

In this specification and the like, a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. Alternatively, an "insulator" in this specification and the like can be called a "semi-insulator" in some cases.

In this specification and the like, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, an impurity in a semiconductor refers to an element that is not a main component of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor includes an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Furthermore, when the semiconductor includes silicon, examples of an impurity which changes the characteristics of the semiconductor include oxygen, Group 1 elements except hydrogen, Group 2 elements, Group 13 elements, and Group 15 elements.

In this specification and the like, pixels are dots that constitute an image and each pixel is a smallest unit of a color element that can control the brightness. For example, in the case of a display device including RGB (R: red, G: green, and B: blue) color elements, an R pixel, a G pixel, and a B pixel are a smallest unit of an image. Note that depending on circumstances, the pixel is called a subpixel in some cases.

In this specification and the like, a blue wavelength range refers to a wavelength range of greater than or equal to 400 nm and less than 490 nm, and blue light emission has at least one emission spectrum peak in the wavelength range. A green wavelength range refers to a wavelength range of greater than or equal to 490 nm and less than 550 nm, and green light emission has at least one emission spectrum peak in the wavelength range. A yellow wavelength range refers to a wavelength range of greater than or equal to 550 nm and less than 590 nm, and yellow light emission has at least one emission spectrum peak in the wavelength range. A red wavelength range refers to a wavelength range of greater than or equal to 590 nm and less than or equal to 740 nm, and red light emission has at least one emission spectrum peak in the wavelength range.

Embodiment 1

In this embodiment, a display device of one embodiment of the present invention is described with reference to FIG. 1 to FIG. 25.

<1-1. Structure of Display Device>

First, the structure of a display device is described with reference to FIG. 5. A display device 500 illustrated in FIG. 5 includes a pixel portion 502, and gate driver circuit portions 504a and 504b and a source driver circuit portion 506 which are placed outside the pixel portion 502.

[Pixel Portion]

The pixel portion 502 includes pixel circuits 10(X, Y) arranged in X rows (X is a natural number of 2 or more) and Y columns (Y is a natural number of 2 or more). Each of the pixel circuits 10(X, Y) includes two display elements having different functions. One of the two display elements has a function of reflecting incident light, and the other has a function of emitting light. Note that the details of the two display elements are described later.

[Gate Driver Circuit Portion]

Some or all of the gate driver circuit portions 504a and 504b and the source driver circuit portion 506 are preferably formed over a substrate over which the pixel portion 502 is formed. Thus, the number of components and the number of terminals can be reduced. In the case where some or all of the gate driver circuit portions 504a and 504b and the source driver circuit portion 506 are not formed over the substrate over which the pixel portion 502 is formed, a separately prepared driver circuit board (e.g., a driver circuit board formed using a single-crystal semiconductor film or a polycrystalline semiconductor film) may be formed in the display device 500 by chip on glass (COG) or tape automated bonding (TAB).

The gate driver circuit portions 504a and 504b have a function of outputting a signal (a scan signal) for selecting the pixels 10(X, Y). The source driver circuit portion 506 has a function of supplying a signal (data signal) for driving the display elements included in the pixels 10(X, Y).

The gate driver circuit portion 504a has a function of controlling the potentials of wirings supplied with scan signals (hereinafter, such wirings are referred to as scan lines $G_{E\_1}$ to $G_{E\_X}$) or a function of supplying an initialization signal. The gate driver circuit portion 504b has a function of controlling the potentials of wirings supplied with scan signals (hereinafter, such wirings are referred to as scan lines $G_{L\_1}$ to $G_{L\_X}$) or a function of supplying an initialization signal. Without being limited thereto, the gate driver circuit portions 504a and 504b each can control or supply another signal.

Figure 5:
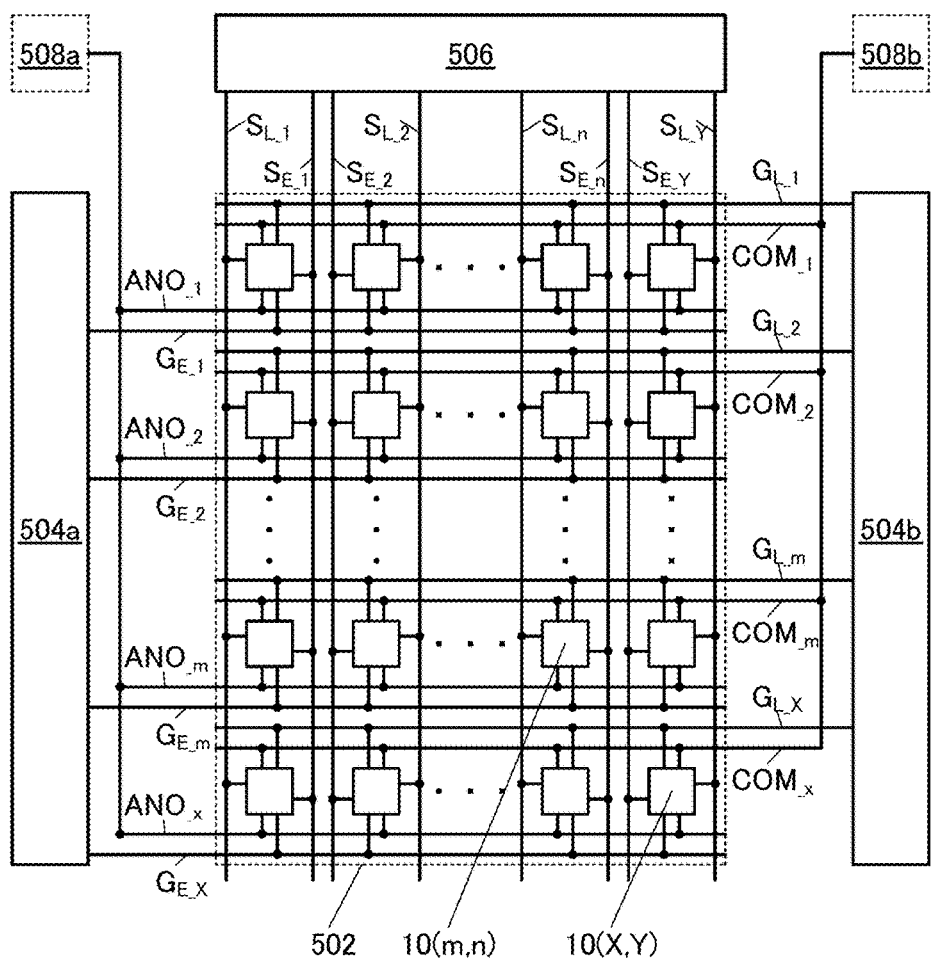
FIG. 5 is a circuit diagram illustrating a display device.

Although the structure in which the two gate driver circuit portions 504a and 504b are provided as gate driver circuit portions is illustrated in FIG. 5, the number of the gate driver circuit portions is not limited thereto, and one or three or more gate driver circuit portions may be provided.

[Source Driver Circuit Portion]

The source driver circuit portion 506 has a function of generating a data signal to be written to the pixels 10(X, Y) on the basis of an image signal, a function of controlling the potentials of wirings supplied with data signals (such wirings are hereinafter referred to as signal lines $S_{L\_1}$ to $S_{L\_Y}$ and signal lines $S_{E\_1}$ to $S_{E\_Y}$), or a function of supplying an initialization signal. Without being limited thereto, the source driver circuit portion 506 may have a function of generating, controlling, or supplying another signal.

The source driver circuit portion 506 includes a plurality of analog switches or the like. The source driver circuit portion 506 can output, as data signals, time-divided image signals obtained by sequentially turning on the plurality of analog switches.

Although the structure where one source driver circuit portion 506 is provided is illustrated in FIG. 5, the number of the source driver circuit portions is not limited thereto, and a plurality of source driver circuit portions may be provided in the display device 500. For example, two source driver circuit portions may be provided so that the signal lines $S_{L\_1}$ to $S_{L\_Y}$ are controlled by one of the source driver circuit portions and the signal lines $S_{E\_1}$ to $S_{E\_Y}$ are controlled by the other of the source driver circuit portions.

[Pixel]

A pulse signal is input to each of the pixels 10(X, Y) through one of the scan lines $G_{L\_1}$ to $G_{L\_X}$ and the scan lines $G_{E\_1}$ to $G_{E\_X}$. A data signal is input to each of the pixels 10(X, Y) through one of the signal lines $S_{L\_1}$ to $S_{L\_Y}$ and the signal lines $S_{E\_1}$ to $S_{E\_Y}$.

For example, the pixel 10(m, n) in the m-th row and the n-th column (m is a natural number of X or less, and n is a natural number of Y or less) is supplied with pulse signals from the gate driver circuit portion 504a through the scan lines $G_{L\_m}$ and $G_{E\_m}$ and supplied with a data signal from the source driver circuit portion 506 through the signal lines $S_{L\_n}$ and $S_{E\_n}$ in accordance with the potentials of the scan lines $G_{L\_m}$ and $G_{E\_m}$.

The pixels 10(m, n) includes two display elements as described above. The scan lines $G_{L\_1}$ to $G_{L\_X}$ are wirings which control the potential of a pulse signal supplied to one of the two display elements. The scan lines $G_{E\_1}$ to $G_{E\_X}$ are wirings which control the potential of a pulse signal supplied to the other of the two display elements.

The signal lines $S_{L\_1}$ to $S_{L\_Y}$ are wirings which control the potential of a data signal supplied to one of the two display elements. The signal lines $S_{E\_1}$ to $S_{E\_Y}$ are wirings which control the potential of a data signal supplied to the other of the two display elements.

[External Circuit]

External circuits 508a and 508b are connected to the display device 500. Note that the external circuits 508a and 508b may be formed in the display device 500.

As shown in FIG. 5, the external circuit 508a is electrically connected to wirings supplied with anode potentials (hereinafter referred to as anode lines $ANO\_1$ to $ANO\_x$) and the external circuit 508b is electrically connected to wirings supplied with common potentials (hereinafter referred to as common lines $COM\_1$ to $COM\_x$).

<1-2. Circuit Configuration of Pixels>

Next, the circuit configuration of the pixels 10(m, n) are described with reference to FIG. 6.

Figure 6:
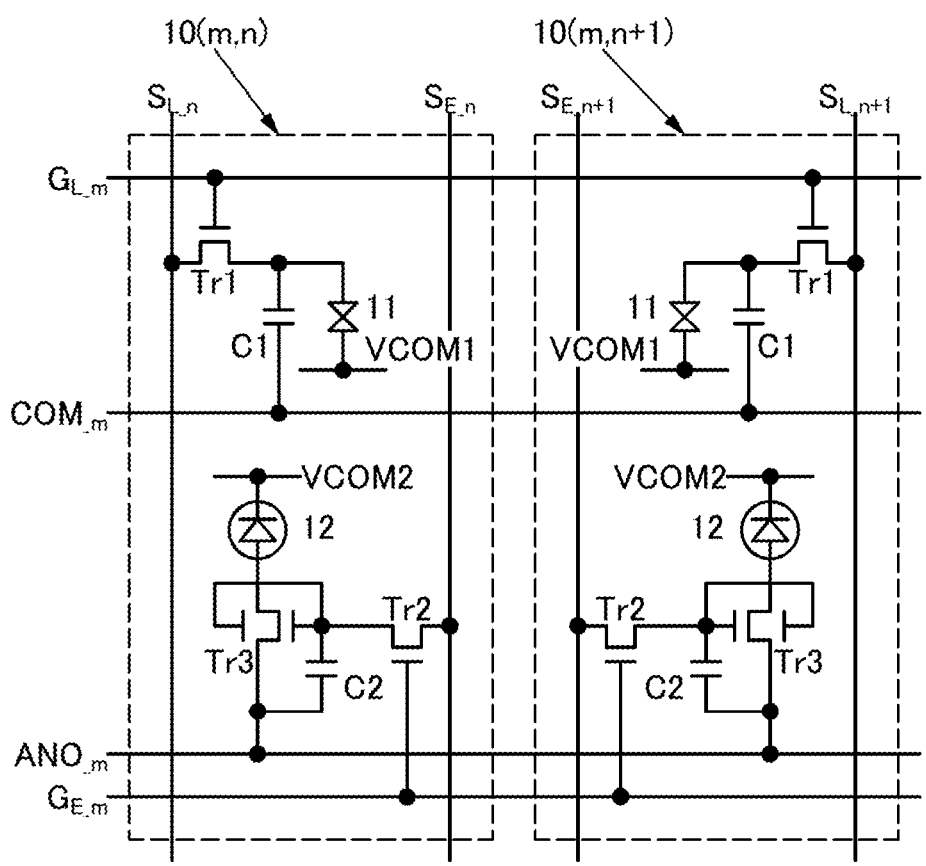
FIG. 6 is a circuit diagram illustrating pixels.

FIG. 6 is a circuit diagram showing the pixel 10(m, n) and an adjacent pixel 10(m, n+1) in a column direction of the pixel 10(m, n) which are included in the display device 500 of one embodiment of the present invention. In this specification and the like, the column direction is a direction in which the value of n of the signal line $S_{L\_n}$ (or the signal line $S_{E\_n}$) increases and decreases and the row direction is a direction in which the value of m of the scan line $G_{L\_m}$ (or the scan line $G_{E\_m}$) increases and decreases.

The pixel 10(m, n) includes a transistor Tr1, a transistor Tr2, a transistor Tr3, a capacitor C1, a capacitor C2, a display element 11, and a display element 12. The pixel 10(m, n+1) has a similar structure. Note that in this specification and the like, the display element 11 is called a first display element and the display element 12 is called a second display element in some cases.

The pixel 10(m, n) is electrically connected to the signal line $S_{L\_n}$, the signal line $S_{E\_n}$, the scan line $G_{L\_m}$, the scan line $G_{E\_m}$, a common line $COM\_m$, a common line VCOM1, a common line VCOM2, and an anode line $ANO\_m$. The pixel 10(m, n+1) is electrically connected to a signal line $S_{L\_n+1}$, a signal line $S_{E\_n+1}$, the scan line $G_{L\_m}$, the scan line $G_{E\_m}$, the common line $COM\_m$, the common line VCOM1, the common line VCOM2, and an anode line $ANO\_m$.

Each of the signal lines $S_{L\_n}$ and $S_{L\_n+1}$, the scan line $G_{L\_m}$, the common line $COM\_m$, and the common line VCOM1 is a wiring for driving the display element 11. Each of the signal lines $S_{E\_n}$ and $S_{E\_n+1}$, the scan line $G_{E\_m}$, the common line VCOM2, and the anode line $ANO\_m$ is a wiring for driving the display element 12.

In the case where a potential supplied to the signal line $S_{E\_n}$ and the signal line $S_{E\_n+1}$ is different from a potential supplied to the signal line $S_{L\_n}$ and the signal line $S_{L\_n+1}$, the signal line $S_{E\_n}$ and the signal line $S_{L\_n+1}$ are preferably positioned apart from each other as shown in FIG. 6. In other words, the signal line $S_{E\_n}$ is preferably positioned adjacent to the signal line $S_{E\_n+1}$. With this arrangement, an influence of the potential difference between the signal lines $S_{L\_n}$ and $S_{L\_n+1}$ and signal lines $S_{E\_n}$ and $S_{E\_n+1}$ can be reduced.

<1-3. Structure Example of First Display Element>

The display element 11 has a function of controlling transmission or reflection of light. In particular, the display element 11 is preferably a reflective display element which controls reflection of light. The display element 11 serving as a reflective display element can reduce power consumption of the display device because display can be performed with the use of external light. For example, the display element 11 may have a combined structure of a reflective film, a liquid crystal element, and a polarizing plate or a structure using a micro electro mechanical systems (MEMS).

<1-4. Structure Example of Second Display Element>

The display element 12 has a function of emitting light. Therefore, the display element 12 may be rephrased as a light-emitting element. For example, an electroluminescent element (also referred to as an EL element), or a light-emitting diode may be used as the display element 12.

As described above, in the display device of one embodiment of the present invention, display elements with different functions like the display elements 11 and 12 are used. In the case where a reflective liquid crystal element is used as one of the display elements and a transmissive EL element is used as the other of the display elements, a novel display device that is highly convenient or reliable can be provided. Furthermore, a display device with low power consumption and high display quality can be provided when a reflective liquid crystal element is used in an environment with bright external light and a transmissive EL element is used in an environment with weak external light.

<1-5. Driving Method for Display Element>

Next, a method for driving the display element 11 and the display element 12 is described. Note that a structure including a liquid crystal element as the display element 11 and a light-emitting element as the display element 12 is used in the description below.

[Driving Method of First Display Element]

In the pixel 10(m, n), a gate electrode of the transistor Tr1 is electrically connected to the scan line $G_{L\_m}$. One of a source electrode and a drain electrode of the transistor Tr1 is electrically connected to the signal line $S_{L\_n}$, and the other is electrically connected to one of a pair of electrodes of the display element 11. The transistor Tr1 has a function of controlling whether to write a data signal by being turned on or off.

The other of the pair of electrodes of the display element 11 is electrically connected to the common line VCOM1.

One of a pair of electrodes of the capacitor C1 is electrically connected to the common line $COM\_m$, and the other of the pair of electrodes of the capacitor C1 is electrically connected to the other of the source electrode and the drain electrode of the transistor Tr1 and the one of the pair of electrodes of the display element 11. The capacitor C1 has a function of storing data written to the pixel 10(m, n).

For example, the gate driver circuit portion 504b in FIG. 5 sequentially selects the pixels 10(m, n) row by row to turn on the transistor Tr1, and data of data signals are written. When the transistor Tr1 is turned off, the pixel 10(*m*, *n*) to which the data has been written is brought into a holding state. This operation is sequentially performed row by row; thus, an image is displayed.

[Driving Method for Second Display Element]

A gate electrode of the transistor Tr2 is electrically connected to the scan line $G_{E\_m}$ in the pixel 10(*m*, *n*). One of a source electrode and a drain electrode of the transistor Tr2 is electrically connected to the signal line $S_{E\_n}$ and the other of the source electrode and the drain electrode is electrically connected to a gate electrode of the transistor Tr3. The transistor Tr2 is configured to be turned on or off to control whether a data signal is written.

One of a pair of electrodes of the capacitor C2 is electrically connected to the anode line ANO_*m*. The other of the pair of electrodes of the capacitor C2 is electrically connected to the other of the source electrode and the drain electrode of the transistor Tr2. The capacitor C2 has a function of storing data written to the pixel 10(*m*, *n*).

The gate electrode of the transistor Tr3 is electrically connected to the other of the source electrode and the drain electrode of the transistor Tr2. One of a source electrode and a drain electrode of the transistor Tr3 is electrically connected to the anode line ANO_*m*. The other of the source electrode and the drain electrode of the transistor Tr3 is electrically connected to one of a pair of electrodes of the display element 12. The transistor Tr3 includes a backgate electrode. The backgate electrode is electrically connected to the gate electrode of the transistor Tr3.

The other of the pair of electrodes of the display element 12 is electrically connected to the common line VCOM2.

For example, the gate driver circuit portion 504*a* in FIG. 5 sequentially selects the pixels 10(*m*, *n*) row by row to turn on the transistors Tr2, and data of data signals are written. When the transistor Tr2 is turned off, the pixel 10(*m*, *n*) to which the data has been written is brought into a holding state. Furthermore, the amount of current flowing between the source electrode and the drain electrode of the transistor Tr3 is controlled in accordance with the potential of the written data signal. The display element 12 emits light with a luminance corresponding to the amount of flowing current. This operation is sequentially performed row by row; thus, an image is displayed.

In this manner, two display elements can be controlled separately with the use of different transistors in the display device of one embodiment of the present invention. Accordingly, a display device having high display quality can be provided.

Transistors used in the display device of one embodiment of the present invention (the transistors Tr1, Tr2, and Tr3) each include an oxide semiconductor film. The transistor including an oxide semiconductor film can have relatively high field-effect mobility and thus can operate at high speed. The off-state current of the transistor including an oxide semiconductor film is extremely low. Therefore, the luminance of the display device can be kept even when the refresh rate of the display device is lowered, so that power consumption can be lowered.

A progressive type display, an interlace type display, or the like can be employed as the display type of the display element 11 and the display element 12. Further, as color elements controlled in the pixel at the time of color display, three colors of R (red), G (green), and B (blue) can be given. Note that color elements are not limited to the three colors of R, G, and B. For example, one or more colors of yellow, cyan, magenta, white, and the like may be added to RGB. Further, the sizes of display regions may be different between respective dots of color elements. However, the display device of one embodiment of the present invention is not limited to a color display device and can be applied to a monochrome display device.

<1-6. Display Region of Display Element>

Here, the display regions of the display elements 11 and 12 in the pixel 10(*m*, *n*) are described with reference to FIG. 1.

FIG. 1 is a schematic view illustrating display regions of the pixel 10(*m*, *n*) and pixels 10(*m*, *n*−1) and 10(*m*, *n*+1) which are adjacent to the pixel 10(*m*, *n*) in the column direction. FIG. 1 illustrates a pixel 10(*m*+1, *n*−1), a pixel 10(*m*+1, *n*), a pixel 10(*m*+1, *n*+1), and the like positioned near the pixel 10(*m*, *n*). Note that in this specification and the like, the pixel 10(*m*, *n*) is called a first pixel and the pixel 10(*m*, *n*+1) is called a second pixel in some cases.

The pixel 10(*m*, *n*) illustrated in FIG. 1 includes a display region 11*d*(*m*, *n*) that functions as a display region of the display element 11 and a display region 12*d*(*m*, *n*) that functions as a display region of the display element 12. The pixel 10(*m*, *n*+1) illustrated in FIG. 1 includes a display region 11*d*(*m*, *n*+1) that functions as a display region of the display element 11 and a display region 12*d*(*m*, *n*+1) that functions as a display region of the display element 12.

In the following description, the display region 11*d*(*m*, *n*) and the display region 11*d*(*m*, *n*+1) are described as display regions 11*d* in some cases when they are not distinguished. Similarly, the display region 12*d*(*m*, *n*) and the display region 12*d*(*m*, *n*+1) are described as display regions 12*d* in some cases. In this specification and the like, the display region 11*d* is called a first display region and the display region 12*d* is called a second display region in some cases.

For example, the display region 11*d* has a function of reflecting incident light and the display region 12*d* has a function of emitting light. The display region 12*d* is provided inside the display region 11*d*. The display element 11 is provided to overlap with the display region 11*d* and the display element 12 is provided to overlap with the display region 12*d*.

The area of the display region 12*d* is preferably smaller than that of the display region 11*d*, in which case power consumption of the display device can be reduced. For example, in an environment with bright external light, the display element 11 reflects incident light and displays an image in the display region 11*d*, and in an environment with dark external light, the display element 12 emits light and displays an image in the display region 12*d*. With this structure, a display device with low power consumption and high display quality can be provided.

Here, the position where the display region 12*d* is provided is described below.

For example, in the case where an EL element is used as the display element 12 disposed to overlap with the display region 12*d*, as methods for forming the EL element, two methods are given: a color filter method in which the same EL element is used for pixels and emission colors of the pixels are changed with use of color films (color filters); and a separate coloring method in which EL elements for the respective pixels are separately formed to have different emission colors. In order to improve the color purity, a separate coloring method and a color filter method may be combined.

In the case of a separate coloring method, an EL element needs to be formed for each pixel, and high accuracy for forming (aligning) an opening in a desired position in a shadow mask (also referred to as a fine metal mask) is required. When a display device has high pixel density (i.e., high resolution), the alignment accuracy needs to be high, which decreases the manufacturing yield of the display device.

In the display device of one embodiment of the present invention, however, the positions of the display regions 12*d* in adjacent pixels are different as illustrated in FIG. 1. With such a structure, the manufacturing yield in the case where the display elements 12 are separately formed can be increased.

In FIG. 1, the distance between the display region 12*d*(*m*, *n*) and the display region 12*d*(*m*, *n*+1) is indicated as a distance $d_1$. The distance $d_1$ is greater than or equal to 20 μm, preferably greater than or equal to 25 μm, more preferably greater than or equal to 30 μm, in which case the manufacturing yield of the display device can be increased. Note that in the case where the distance $d_1$ is less than 20 μm, the manufacturing yield of the display device is decreased.

Figure 2:
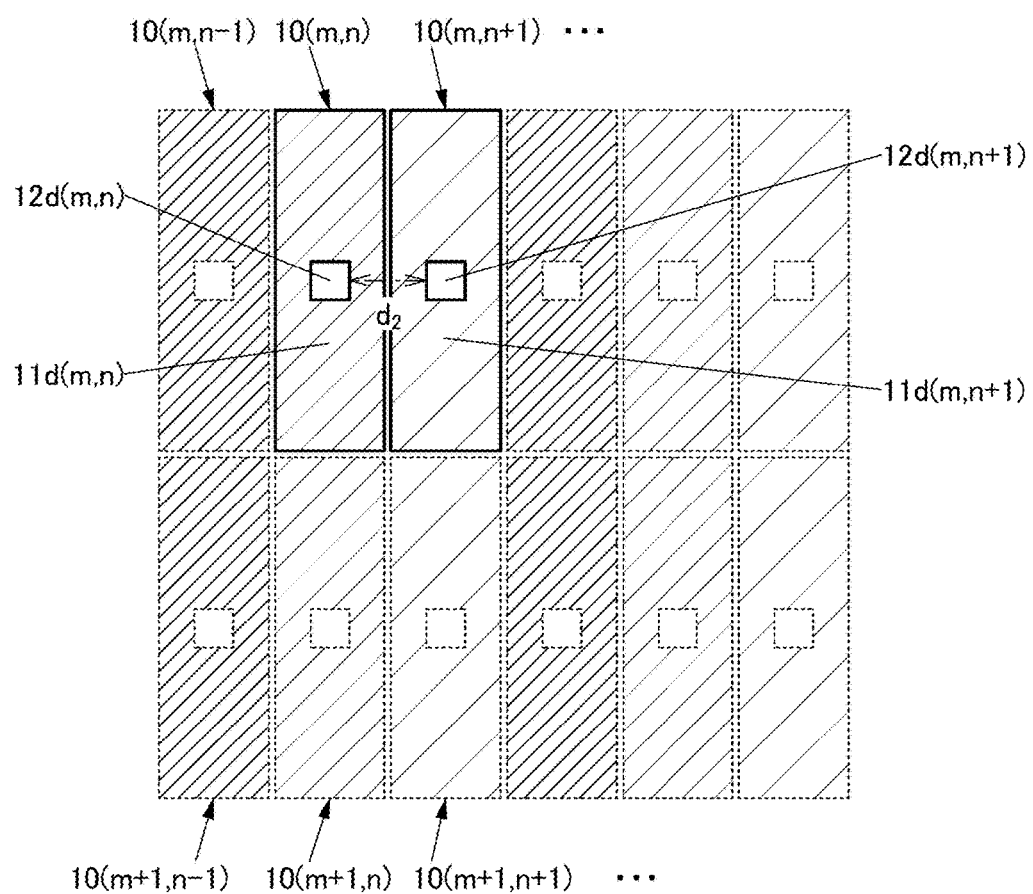
FIG. 2 is a schematic view illustrating a display region of a display element.

FIG. 2 illustrates an example in which positions of the second display regions 12*d* in adjacent pixels are the same. In FIG. 2, a distance between the display region 12*d*(*m*, *n*) and the display region 12*d*(*m*, *n*+1) is indicated as a distance dz.

When the distance $d_1$ in FIG. 1 and the distance $d_2$ in FIG. 2 are compared, a relation $d_1 > d_2$ is established. Thus, the distance in the case where the positions of the display regions 12*d* in adjacent pixels are different can be larger than that in the case where the positions of the display regions 12*d* in adjacent pixels are the same by approximately 10% or more.

In the display device of one embodiment of the present invention, the area of the display region 12*d* is smaller than that of the display region 11*d*. Accordingly, in the case where EL elements are formed by a separate coloring method, the opening in the shadow mask can be small. Thus, the mechanical strength of the shadow mask can be increased. The shadow mask with high mechanical strength is less likely to be deformed due to, for example, bending, distortion, expansion, or contraction, increasing the manufacturing yield.

With the arrangement of the display regions 12*d* in FIG. 1, an interference of light emitted from adjacent display elements 12 can be suppressed.

Figure 3:
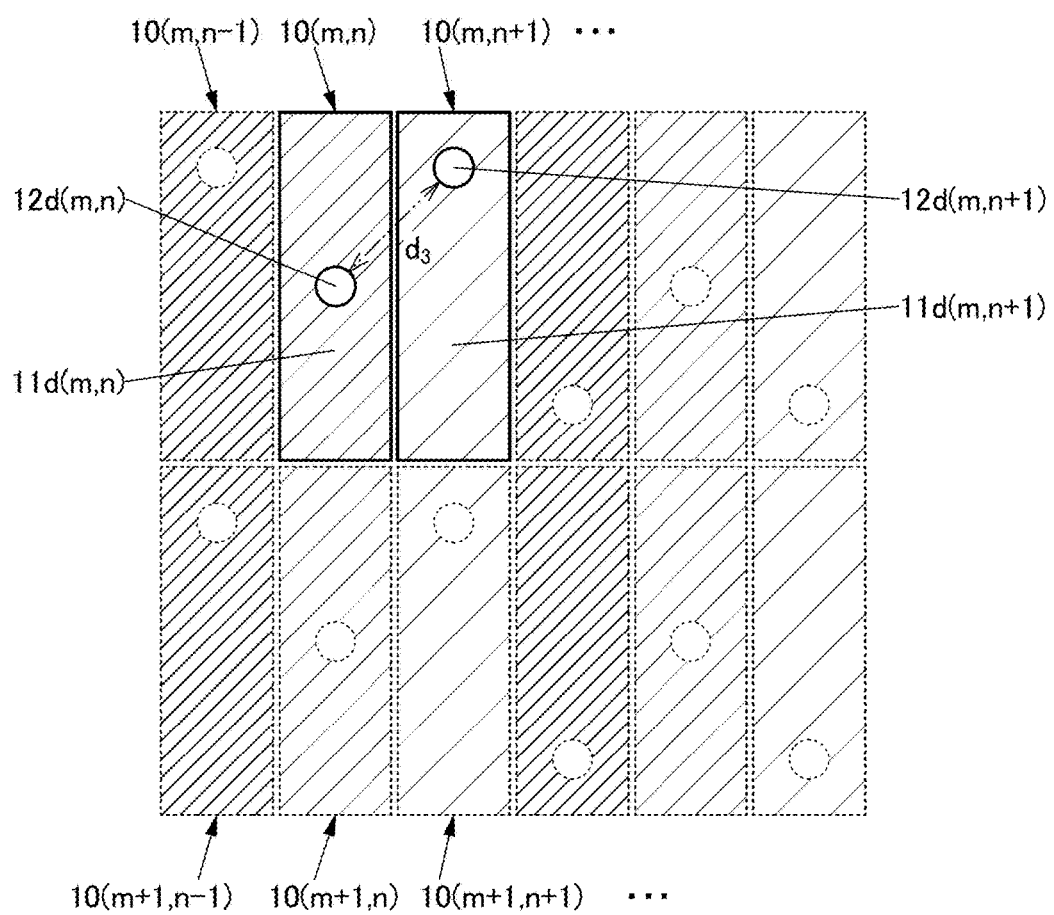
FIG. 3 is a schematic view illustrating a display region of a display element.

Note that FIG. 1 illustrates an example in which the display region 12*d* has a rectangular shape, but one embodiment of the present invention is not limited thereto. The display region 12*d* can have a non-rectangular shape. FIG. 3 illustrates an example in which the display region 12*d* has a non-rectangular shape.

FIG. 3 is a schematic view illustrating an example of pixel arrangement. The display region 12*d* in FIG. 3 has a circular shape. In FIG. 3, a distance between the display region 12*d*(*m*, *n*) and the display region 12*d*(*m*, *n*+1) is indicated as a distance d3. When the length of a side of the rectangular display region 12*d* is equal to the diameter of the circular display region 12*d*, the circular display region 12*d* is preferred because the distance d3 can be longer than the distance $d_1$ in FIG. 1.

As described above, the display region 12*d* can have various shapes (for example, polygonal shapes such as a triangle and a rectangle, circular shapes such as a circle and an ellipse, and a combination of a polygonal shape and a circular shape).

In FIG. 1, the pixel 10(*m*, *n*−1), the pixel 10(*m*, *n*), and the pixel 10(*m*, *n*+1) are arranged in stripes in the column direction, but one embodiment of the present invention is not limited thereto. For example, a structure illustrated in FIG. 4 may be employed.

Figure 4:
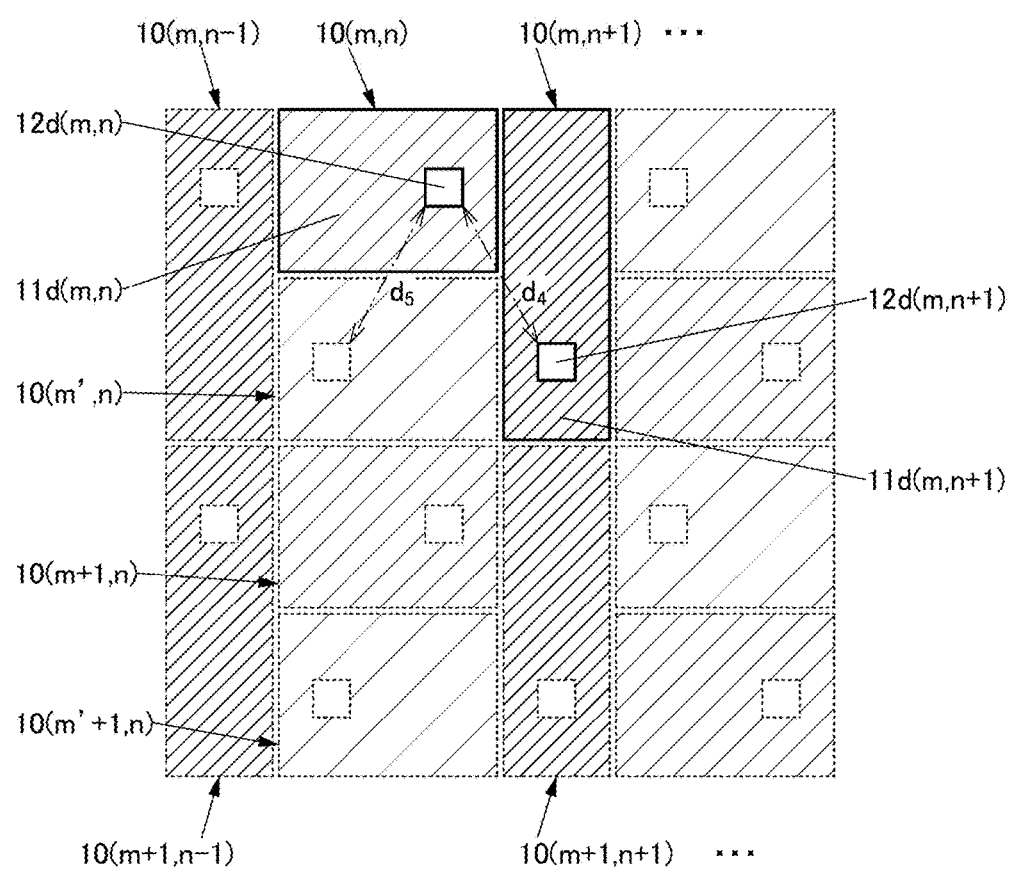
FIG. 4 is a schematic view illustrating a display region of a display element.

FIG. 4 is a schematic view of a display region including the pixel 10(*m*, *n*) and the pixel 10(*m*, *n*−1) and the pixel 10(*m*, *n*+1) which are adjacent to the pixel 10(*m*, *n*) in the column direction. In FIG. 4, pixels near the pixel 10(*m*, *n*) such as the pixel 10(*m*+1, *n*−1), a pixel 10(*m'*, *n*), the pixel 10(*m*+1, *n*), a pixel 10(*m'*+1, *n*), and the pixel 10(*m*+1, *n*+1) are illustrated.

In the structure in FIG. 4, the display region 11*d*(m, n) and the display region 11*d*(*m*, *n*+1) have different areas. In this way, the areas of the display regions 11*d* in adjacent pixels may be different. This applies to the display regions 12*d* which are not illustrated.

When the structure of FIG. 4 is employed, the pixel 10(*m*, *n*+1) in FIG. 1 is disposed in the position of the pixel 10(*m'*, *n*) in FIG. 4.

Note that in FIG. 4, a distance between the pixel 10(*m*, *n*) and the pixel 10(*m*, *n*+1) is indicated as a distance $d_4$, and a distance between the pixel 10(*m*, *n*) and the pixel 10(*m'*, *n*) is indicated as a distance $d_5$. The distance $d_4$ and the distance $d_5$ preferably have the same length, in other words, the display regions 12*d* are preferably provided at equal intervals. With such a structure, openings in the shadow mask can be equally spaced, which increases the mechanical strength of the shadow mask and thus distortion of the shadow mask at evaporation can be suppressed.

As illustrated in FIG. 4, the positions of the display regions 12*d* in the pixel 10(*m*, *n*+1) adjacent to the pixel 10(*m*, *n*) in the column direction and in the pixel 10(*m'*, *n*) are different from the position of the display region 12*d* in the pixel 10(*m*, *n*). In other words, the pixel 10(*m*, *n*) and the pixel 10(*m*, *n*+1) are provided adjacent to each other, and the display region 12*d*(*m*, *n*) included in the pixel 10(*m*, *n*) and the display region 12*d*(*m*, *n*+1) included in the pixel 10(*m*, *n*+1) are provided in different portions inside the respective display regions 11*d*.

With the arrangement of the display regions 12*d* as illustrated in FIG. 4, the manufacturing yield in the case where the display elements 12 are separately formed can be increased. In addition, with the arrangement of the display regions 12*d* as illustrated in FIG. 4, an interference of light emitted from adjacent display elements 12 can be suppressed.

Although not illustrated, one embodiment of the present invention can be applied to pixels in delta arrangement or pentile arrangement.

<1-7. Structure Example of Display Device (Top View)>

Next, a specific structure example of the display device 500 illustrated in FIG. 5 is described with reference to FIGS. 7A and 7B and FIG. 8.

Figure 7A:
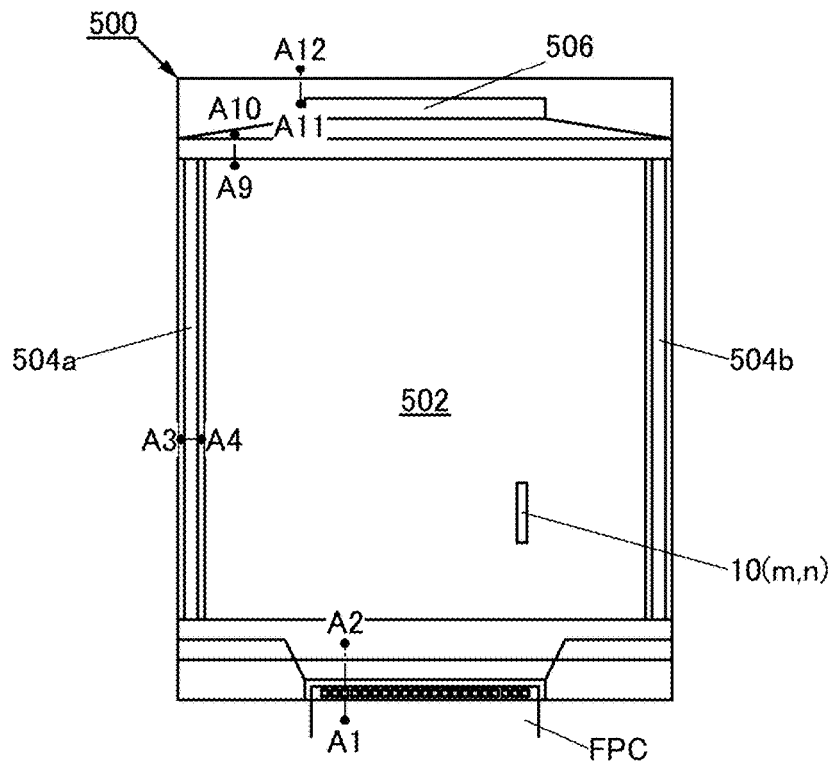
FIGS. 7A and 7B are top views illustrating a display device and pixels.

FIG. 7A is a top view of the display device 500. As described above, the display device 500 includes the pixel portion 502, the gate driver circuit portions 504*a* and 504*b* and the source driver circuit portion 506 placed outside the pixel portion 502. FIG. 7A schematically illustrates the pixel 10(*m*, *n*) included in the pixel portion 502. A flexible printed circuit (FPC) is electrically connected to the display device 500 in FIG. 7A.

Figure 7B:
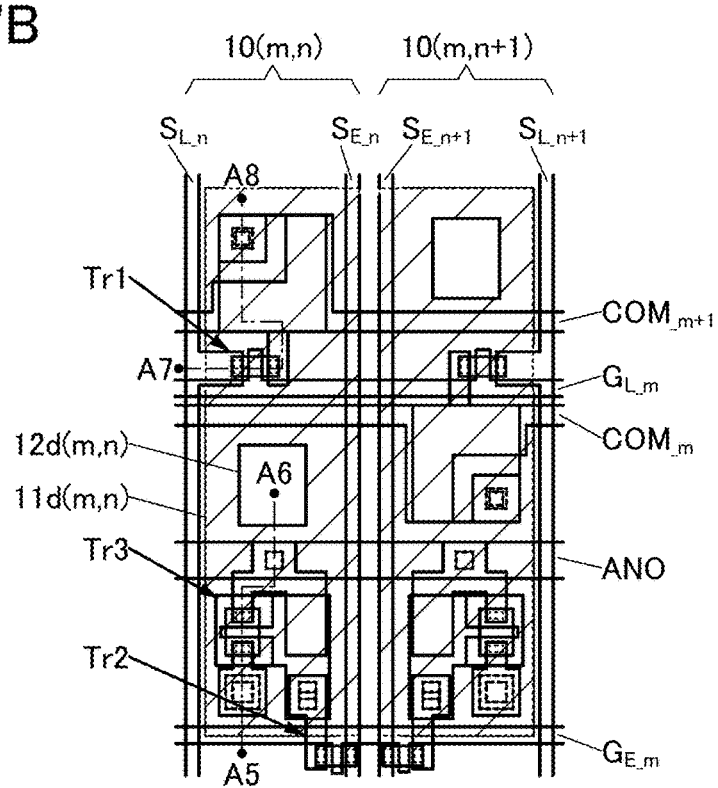

FIG. 7B is a top view schematically illustrating the pixel 10(*m*, *n*) shown in FIG. 7A and the pixel 10(*m*, *n*+1) adjacent to the pixel 10(*m*, *n*). The signal lines $S_{L\_n}$, $S_{L\_n+1}$, $S_{E\_n}$, and $S_{E\_n+1}$, the scan lines $G_{L\_m}$ and $G_{E\_n}$, the common line $COM\_m$, and the transistors Tr1, Tr2, and Tr3 in FIG. 7B respectively correspond to the reference numerals in FIG. 6. The display region 11*d* and the display region 12*d* in FIG.

7B correspond to the reference numerals in FIG. 1. A common line COM_$_{m+1}$ in FIG. 7B indicates a common line included in the pixel 10($m$+1, $n$) adjacent to the pixel 10($m$, $n$).

<1-8. Structure Example of Display Device (Cross Section)>

Next, a cross-sectional structure of the display device 500 is described with reference to FIG. 8.

Figure 8:
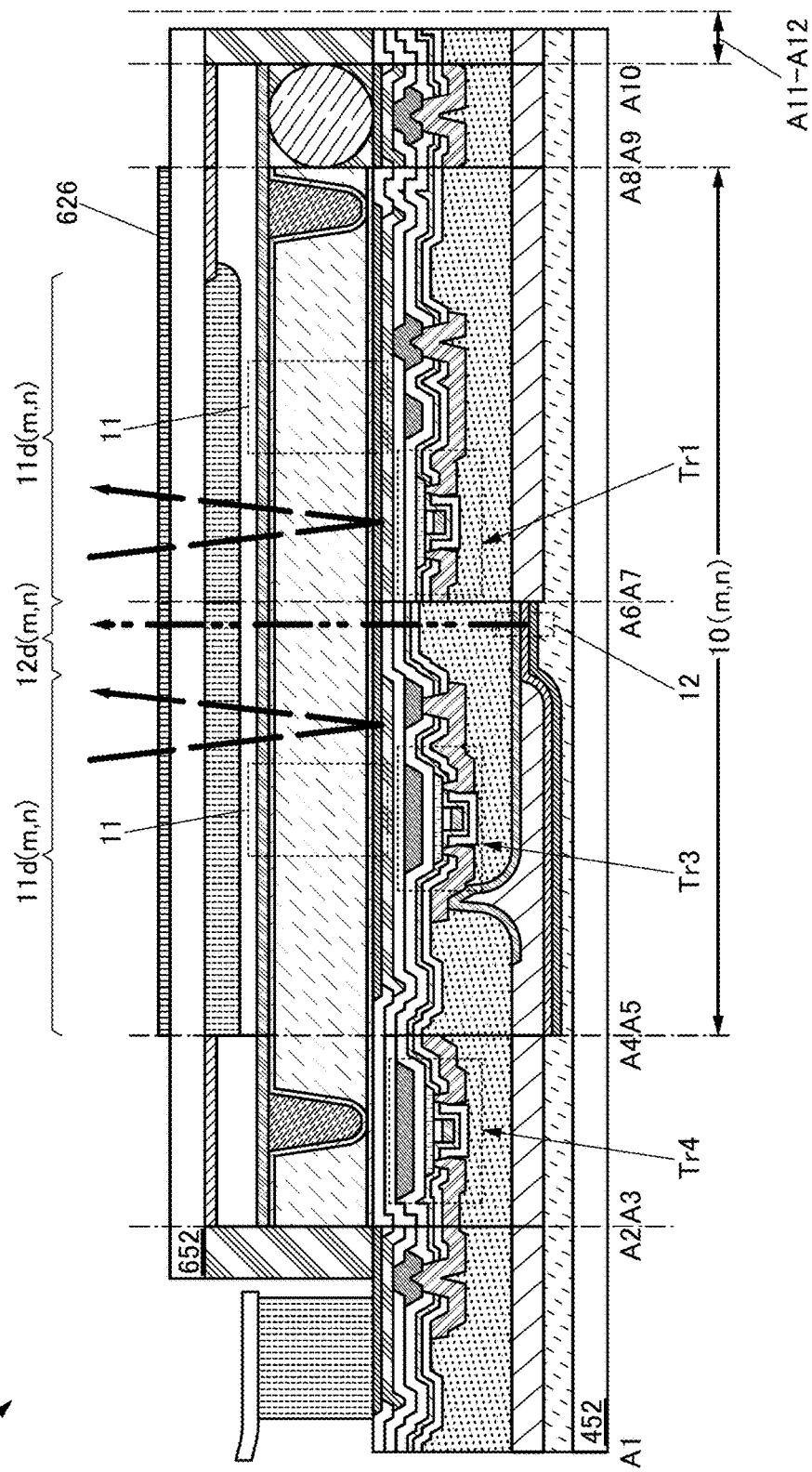
FIG. 8 is a cross-sectional view illustrating a display device.

FIG. 8 is a cross-sectional view corresponding to cross sections taken along the dashed-dotted lines A1-A2, A3-A4, A5-A6, A7-A8, A9-A10, and A11-A12 illustrated in FIGS. 7A and 7B.

A cross section taken along the dashed-dotted line A1-A2 corresponds to a region in which the FPC is attached to the display device 500. A cross section taken along the dashed-dotted line A3-A4 corresponds to a region in which the gate driver circuit portion 504$a$ is provided. A cross section taken along the dashed-dotted line A5-A6 corresponds to a region in which the display element 11 and the display element 12 are provided. A cross section taken along the dashed-dotted line A7-A8 corresponds to a region in which the display element 11 is provided. A cross section taken along the dashed-dotted line A9-A10 corresponds to a connection region of the display device 500. A cross section taken along the dashed-dotted line A11-A12 corresponds to the edge of the display device 500 and the vicinity thereof.

In FIG. 8, the display device 500 includes the display element 11, the display element 12, the transistor Tr1, the transistor Tr3, and a transistor Tr4 between a substrate 452 and a substrate 652. A functional film 626 is provided over the substrate 652.

As described above, the display element 11 has a function of reflecting incident light and the display element 12 has a function of emitting light. In FIG. 8, the light entering the display element 11 and the reflected light are schematically denoted by arrows of dashed lines. Furthermore, the light emitted from the display element 12 is schematically denoted by an arrow of a dashed double-dotted line.

[Cross Section of Pixel]

Figure 9:
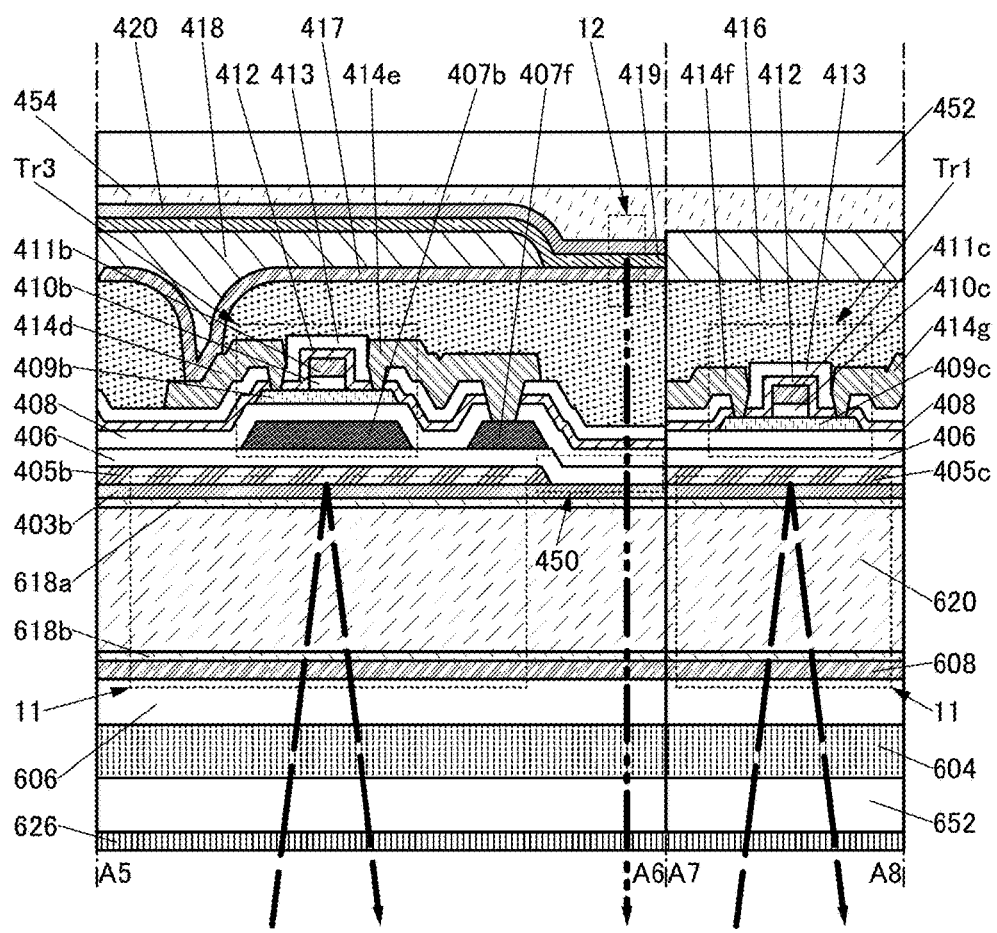
FIG. 9 is a cross-sectional view illustrating a display device.

The cross sections taken along the dashed-dotted lines A5-A6 and A7-A8 in FIG. 8 are described with reference to FIG. 9. FIG. 9 corresponds to an enlarged cross-sectional view of some components taken along the dashed-dotted lines A5-A6 and A7-A8 in FIG. 8. The enlarged cross-sectional view is reversed upside down. Note that in FIG. 9, some components are not illustrated in order to avoid complexity of the drawing.

The display element 11 includes a conductive film 403$b$, a liquid crystal layer 620, and a conductive film 608. The conductive film 403$b$ functions as a pixel electrode and the conductive film 608 functions as a counter electrode. The conductive film 403$b$ is electrically connected to the transistor Tr1.

The display element 11 includes conductive films 405$b$ and 405$c$ electrically connected to the conductive film 403$b$. The conductive films 405$b$ and 405$c$ each have a function of reflecting incident light. That is, the conductive films 405$b$ and 405$c$ function as reflective films. An opening 450 transmitting incident light is provided in the reflective films. In FIG. 9, a conductive film functioning as a reflective film is separated into island shapes by the opening 450, whereby the conductive film 405$c$ is positioned below the transistor Tr1 and the conductive film 405$b$ is positioned below the transistor Tr3. Since light of the display element 12 is emitted from the opening 450, the opening 450 corresponds to the display region 12$d$($m$, $n$) illustrated in FIG. 8.

The display element 12 has a function of emitting light toward the opening 450. In FIG. 9, the display element 12 is a bottom emission type light-emitting element.

The display element 12 includes a conductive film 417, an EL layer 419, and a conductive film 420. The conductive film 417 functions as a pixel electrode and an anode electrode. The conductive film 420 functions as a counter electrode and a cathode electrode. Although a description is made on a structure where the conductive film 417 functions as an anode electrode and the conductive film 420 functions as a cathode electrode in this embodiment, one embodiment of the present invention is not limited thereto. For example, the conductive film 417 may function as a cathode electrode and the conductive film 420 may function as an anode electrode.

The conductive film 417 is electrically connected to the transistor Tr3.

Each of the transistor Tr1 and the transistor Tr3 preferably has a staggered structure (also referred to as a top gate structure) as illustrated in FIG. 9. When the staggered structure is employed, parasitic capacitance that can be generated between a gate electrode and a source electrode and between the gate electrode and a drain electrode can be reduced. However, one embodiment of the present invention is not limited to this, and a transistor having an inverted staggered structure (also referred to as a bottom gate structure) may be used.

The transistor Tr1 is formed over an insulating film 406 and an insulating film 408 and includes an oxide semiconductor film 409$c$ over the insulating film 408, an insulating film 410$c$ over the oxide semiconductor film 409$c$, and an oxide semiconductor film 411$c$ over the insulating film 410$c$. The insulating film 410$c$ functions as a gate insulating film and the oxide semiconductor film 411$c$ functions as a gate electrode.

Insulating films 412 and 413 are provided over the oxide semiconductor films 409$c$ and 411$c$. An opening reaching the oxide semiconductor film 409$c$ is provided in the insulating films 412 and 413 and conductive films 414$f$ and 414$g$ are electrically connected to the oxide semiconductor film 409$c$ through the opening. The conductive films 414$f$ and 414$g$ function as a source electrode and a drain electrode of the transistor Tr1.

Insulating films 416 and 418 are provided over the transistor Tr1.

The transistor Tr3 is formed over the insulating film 406, and includes a conductive film 407$b$ over the insulating film 406, the insulating film 408 over the conductive film 407$b$, an oxide semiconductor film 409$b$ over the insulating film 408, an insulating film 410$b$ over the oxide semiconductor film 409$b$, and an oxide semiconductor film 411$b$ over the insulating film 410$b$. The conductive film 407$b$ functions as a first gate electrode, and the insulating film 408 functions as a first gate insulating film. The insulating film 410$b$ functions as a second gate insulating film, and the oxide semiconductor film 411$b$ functions as a second gate electrode.

Insulating films 412 and 413 are provided over the oxide semiconductor films 409$b$ and 411$b$. An opening reaching the oxide semiconductor film 409$b$ is provided in the insulating films 412 and 413 and conductive films 414$d$ and 414$e$ are electrically connected to the oxide semiconductor film 409$b$ through the opening. The conductive films 414$d$ and 414$e$ function as a source electrode and a drain electrode of the transistor Tr3.

A conductive film 414$e$ is electrically connected to a conductive film 407$f$ through an opening provided in the insulating films 406, 408, 412, and 413. The conductive film 407*f* is formed through the same process as that of the conductive film 407*b* and functions as a connection electrode.

The insulating film 416 and the conductive film 417 are provided over the transistor Tr3. An opening reaching the conductive film 414*d* is provided in the insulating film 416, and the conductive film 414*d* and the conductive film 417 are electrically connected to each other through the opening.

An insulating film 418, the EL layer 419, and the conductive film 420 are provided over the conductive film 417. An opening reaching the conductive film 417 is provided in the insulating film 418, and the conductive film 417 and the EL layer 419 are electrically connected to each other through the opening.

The conductive film 420 is adhered to the substrate 452 with a sealing material 454 placed therebetween.

A color film 604, an insulating film 606, and the conductive film 608 are provided over the substrate 652 that faces the substrate 452. A functional film 626 is provided below the substrate 652. Light reflected by the display element 11 and light emitted from the display element 12 are extracted through the color film 604, the functional film 626, and the like.

The display element 11 includes alignment films 618*a* and 618*b* in contact with the liquid crystal layer 620 as illustrated in FIG. 9. Note that a structure without the alignment films 618*a* and 618*b* may be employed.

When the transistors Tr1 and Tr3 have top-gate structures as illustrated in FIG. 9, the area of the circuit can be reduced. The transistor Tr1 is a single-gate transistor in which the oxide semiconductor film 411*c* functioning as a gate electrode is provided, whereas the transistor Tr3 is a multi-gate transistor in which the conductive film 407*b* functioning as a first gate electrode and the oxide semiconductor film 411*b* functioning as a second gate electrode are provided. Note that there is no limitation on the structure of the transistor that is used in the display device of one embodiment of the present invention. For example, both the transistors Tr1 and Tr3 may have either a single-gate structure or a multi-gate structure.

[Cross Sections of FPC Region and Gate Driver Circuit Portion]

Figure 10:
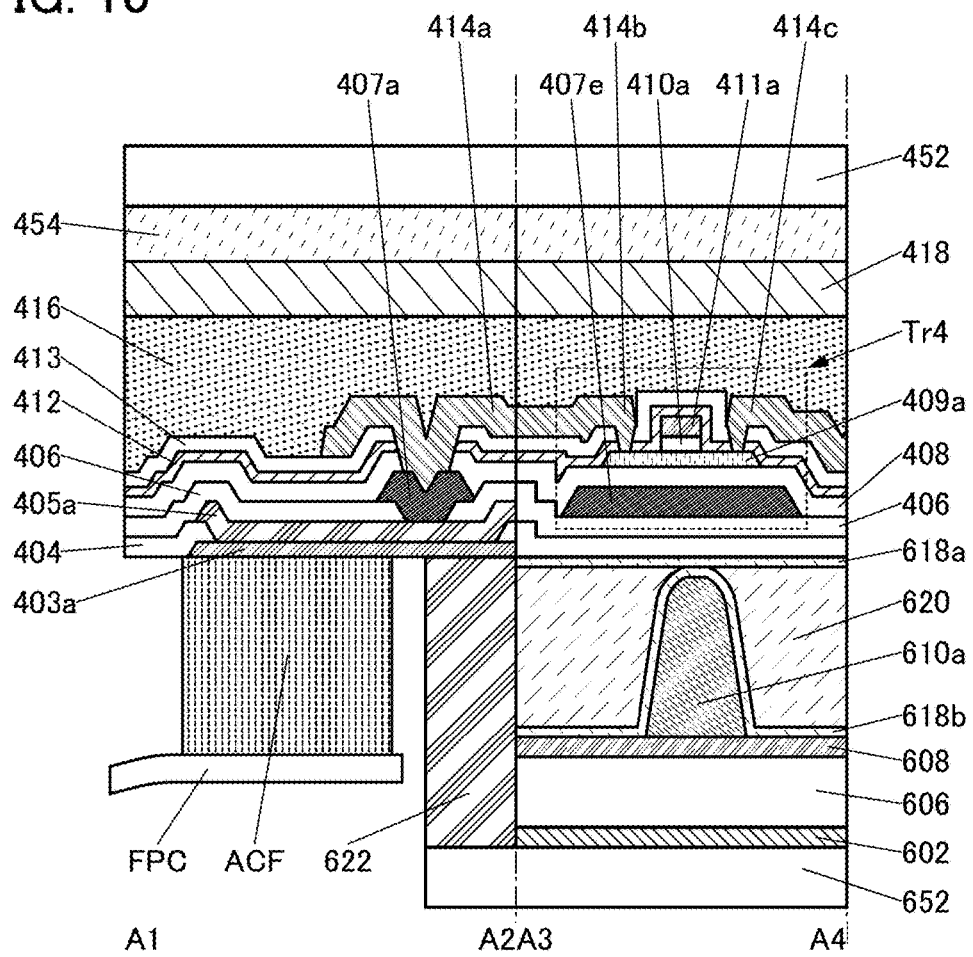
FIG. 10 is a cross-sectional view illustrating a display device.

The cross-sections taken along the dashed-dotted lines A1-A2 and A3-A4 in FIG. 8 are described with reference to FIG. 10. FIG. 10 corresponds to an enlarged cross-sectional view of components taken along the dashed-dotted lines A1-A2 and A3-A4 in FIG. 8. The enlarged cross-sectional view is reversed upside down. Note that in FIG. 10, some components are not illustrated in order to avoid complexity of the drawing.

The FPC illustrated in FIG. 10 is electrically connected to a conductive film 403*a* through an anisotropic conductive film (ACF). An insulating film 404 is provided over the conductive film 403*a*. An opening reaching the conductive film 403*a* is provided in the insulating film 404, and the conductive film 403*a* and a conductive film 405*a* are electrically connected to each other through the opening.

The insulating film 406 is provided over the conductive film 405*a*. An opening reaching the conductive film 405*a* is provided in the insulating film 406, and the conductive film 405*a* and a conductive film 407*a* are electrically connected to each other through the opening. The insulating films 408, 412, and 413 are provided over the conductive film 407*a*. An opening reaching the conductive film 407*a* is provided in the insulating films 408, 412, and 413 and the conductive film 407*a* and a conductive film 414*a* are electrically connected to each other through the opening.

The insulating films 416 and 418 are provided over the insulating film 413 and the conductive film 414*a*. The insulating film 418 is adhered to the substrate 452 with the sealing material 454 placed therebetween.

The transistor Tr4 illustrated in FIG. 10 corresponds to a transistor included in a gate driver circuit portion 504*a*.

The transistor Tr4 is formed over the insulating film 406 and includes a conductive film 407*e* over the insulating film 406, the insulating film 408 over the conductive film 407*e*, an oxide semiconductor film 409*a* over the insulating film 408, an insulating film 410*a* over the oxide semiconductor film 409*a*, and an oxide semiconductor film 411*a* over the insulating film 410*a*. The conductive film 407*e* functions as a first gate electrode. The insulating film 410*a* functions as a second gate insulating film and the oxide semiconductor film 411*a* functions as a second gate electrode.

The insulating films 412 and 413 are provided over the oxide semiconductor films 409*a* and 411*a*. An opening reaching the oxide semiconductor film 409*a* is provided in the insulating films 412 and 413 and conductive films 414*b* and 414*c* are electrically connected to the oxide semiconductor film 409*a* through the opening. The conductive films 414*b* and 414*c* function as a source electrode and a drain electrode of the transistor Tr4.

The transistor Tr4 is a multi-gate transistor like the transistor Tr3 described above. A multi-gate transistor is preferably used in the gate driver circuit portion 504*a* because the current drive capability can be improved. Since the use of a multi-gate transistor can improve the current drive capability, the width of the driver circuit can be reduced.

The insulating films 416 and 418 are provided over the transistor Tr4. The insulating film 418 is adhered to the substrate 452 with the sealing material 454 placed therebetween.

A light-blocking film 602, the insulating film 606, and the conductive film 608 are provided over the substrate 652 that faces the substrate 452.

A structure body 610*a* is formed in a position overlapping with the transistor Tr4 over the conductive film 608. The structure body 610*a* has a function of controlling the thickness of the liquid crystal layer 620. The alignment films 618*a* and 618*b* are formed between the structure body 610*a* and the insulating film 404 in FIG. 10. Note that the alignment films 618*a* and 618*b* are not necessarily formed between the structure body 610*a* and the insulating film 404.

A sealant 622 is provided at an end portion of the substrate 652. Note that the sealant 622 is provided between the substrate 652 and the conductive film 403*a*.

[Cross Sections of Connection Region and Region in the Vicinity of End Portion]

Figure 11:
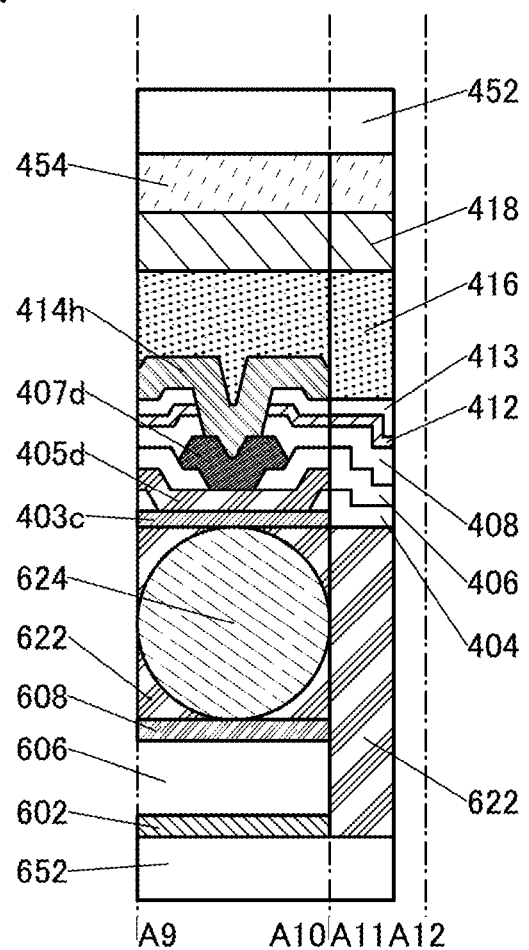
FIG. 11 is a cross-sectional view illustrating a display device.
Figure 12A:
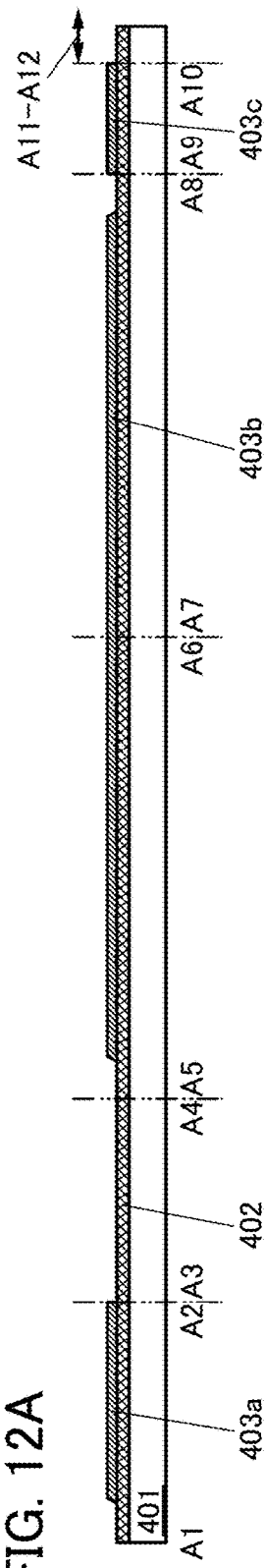
FIGS. 12A to 12C are cross-sectional views illustrating a manufacturing process of a display device.
Figure 12B:
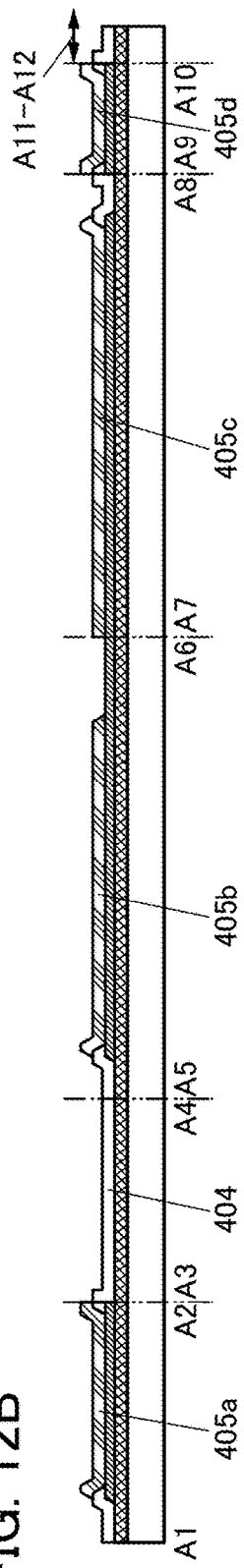
Figure 12C:
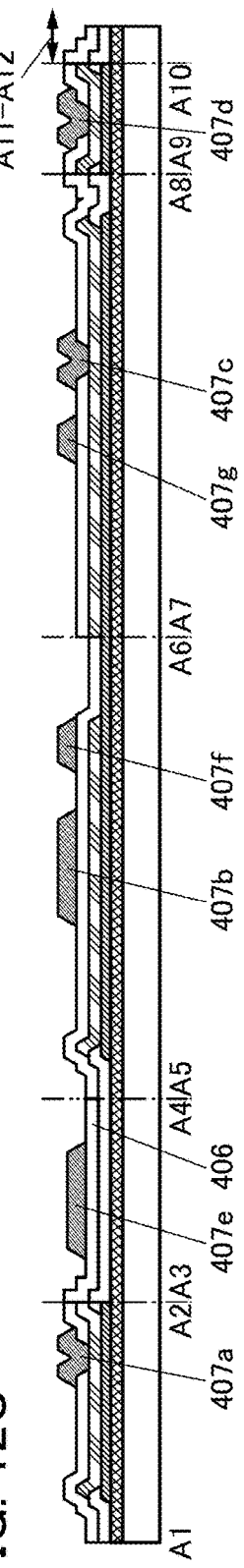

The cross sections taken along the dashed-dotted lines A9-A10 and A11-A12 in FIG. 8 are described with reference to FIG. 11. FIG. 11 corresponds to an enlarged cross-sectional view of components taken along the dashed-dotted lines A9-A10 and A11-A12 in FIG. 8. The enlarged cross-sectional view is reversed upside down. Note that in FIG. 11, some components are not illustrated in order to avoid complexity of the drawing.

In FIG. 11, the conductive film 608 is electrically connected to a conductive film 403*c* through a conductor 624. The conductor 624 is included in the sealant 622. The conductive film 608 is provided over the substrate 652, the light-blocking film 602, and the insulating film 606.

The insulating film 404 is provided over the conductive film 403c. An opening reaching the conductive film 403c is provided in the insulating film 404, and the conductive film 403c and a conductive film 405d are electrically connected to each other through the opening. The insulating film 406 is provided over the conductive film 405d. An opening reaching the conductive film 405d is provided in the insulating film 406, and the conductive film 405d and a conductive film 407d are electrically connected to each other through the opening.

The insulating films 408, 412, and 413 are provided over the conductive film 407d. An opening reaching the conductive film 407d is provided in the insulating films 408, 412, and 413 and the conductive film 407d and a conductive film 414h are electrically connected to each other through the opening. The insulating films 416 and 418 are provided over the conductive film 414h. The insulating film 418 is adhered to the substrate 452 with the sealing material 454 placed therebetween.

The sealant 622 is provided at end portions of the substrate 452 and 652. Note that the sealant 622 is provided between the substrate 652 and the insulating film 404.

<1-9. Manufacturing Method of Display Device>

Next, a method for manufacturing the display device 500 illustrated in FIG. 8 is described with reference to FIGS. 12A to 12C, FIGS. 13A to 13C, FIGS. 14A to 14C, FIGS. 15A to 15C, FIGS. 16A and 16B, and FIG. 17. FIGS. 12A to 12C to FIG. 17 are cross-sectional views illustrating a method for manufacturing the display device 500.

First, a conductive film 402 is formed over a substrate 401. Then, a conductive film is formed over the conductive film 402 and processed into island shapes, whereby the conductive films 403a, 403b, and 403c are formed (see FIG. 12A).

The conductive film 402 has a function of a separation layer, the conductive films 403a and 403c each have a function of a connection electrode, and the conductive film 403b has a function of a pixel electrode.

An insulating film is formed over the conductive films 402, 403a, 403b, and 403c and openings are formed in desired regions of the insulating film, whereby the insulating film 404 is formed. Then, a conductive film is formed over the conductive films 403a, 403b, and 403c and the insulating film 404 and processed into island shapes, whereby the conductive films 405a, 405b, 405c, and 405d are formed (see FIG. 12B).

The insulating film 404 has openings in regions overlapping with the conductive films 403a, 403b, and 403c. The conductive film 403a is electrically connected to the conductive film 405a through the opening, the conductive film 403b is electrically connected to the conductive films 405b and 405c through the openings, and the conductive film 403c is electrically connected to the conductive film 405d through the opening.

An insulating film is formed over the insulating film 404 and the conductive films 405a, 405b, 405c, and 405d and openings are formed in desired regions of the insulating film, whereby the insulating film 406 is formed. A conductive film is formed over the conductive films 405a, 405b, 405c, and 405d and the insulating film 406 and processed into island shapes, whereby the conductive films 407a, 407b, 407c, 407d, 407e, 407f, and 407g are formed (see FIG. 12C).

The insulating film 406 has openings in regions overlapping with the conductive films 405a, 405c, and 405d. The conductive film 405a, the conductive film 405c, and the conductive film 405d are electrically connected to the conductive film 407a, the conductive film 407c, and the conductive film 407d, respectively, through the openings.

Next, the insulating film 408 is formed over the insulating film 406 and the conductive films 407a, 407b, 407c, 407d, 407e, 407f, and 407g. Then, an oxide semiconductor film is formed over the insulating film 408 and processed into island shapes, whereby the oxide semiconductor films 409a, 409b, and 409c are formed (see FIG. 13A).

Next, an insulating film and an oxide semiconductor film are formed over the insulating film 408 and the oxide semiconductor films 409a, 409b, and 409c and processed into desired shapes, whereby the island-shaped insulating films 410a, 410b, and 410c and the island-shaped oxide semiconductor films 411a, 411b, and 411c are formed (see FIG. 13B).

Next, insulating films are formed over the insulating film 408 and the oxide semiconductor films 409a, 409b, and 409c and openings are formed in desired regions of the insulating films, whereby the insulating films 412 and 413 are formed (see FIG. 13C).

Although a two-layer structure of the insulating films 412 and 413 is illustrated in FIG. 13C, the present invention is not limited thereto. For example, a single-layer structure of the insulating film 412, a single-layer structure of the insulating film 413, or a stacked-layer structure of three or more layers in which the insulating films 412 and 413 and another insulating film are stacked may be used. When openings are formed in the insulating films 412 and 413, openings are also formed in part of the insulating film 408. Openings formed in the insulating films 408, 412, and 413 reach the conductive films 407a, 407c, 407d, and 407f.

Next, a conductive film is formed over the insulating film 413 and processed into desired shapes, whereby the conductive films 414a, 414b, 414c, 414d, 414e, 414f, 414g, and 414h are formed (see FIG. 14A).

The conductive films 414b and 414c function as a source electrode and a drain electrode of the transistor Tr4. The conductive films 414d and 414e function as a source electrode and a drain electrode of the transistor Tr3. The conductive films 414f and 414g function as a source electrode and a drain electrode of the transistor Tr1.

In the transistor Tr1, the conductive film 414g is electrically connected to the conductive film 403b with the conductive films 407c and 405c placed therebetween. The transistor Tr1 can control the potential of the conductive film 403b.

Next, the insulating film 416 is formed to cover the transistors Tr1, Tr3, and Tr4. The insulating film 416 has an opening in a region overlapping with the conductive film 414d. Next, a conductive film is formed over the insulating film 416 and the conductive film 414d and processed into a desired shape, whereby the conductive film 417 is formed. Then, the insulating film 418 is formed in a desired region over the insulating film 416 and the conductive film 417. The insulating film 418 has an opening in a region overlapping with the conductive film 417 (see FIG. 14B).

Next, the EL layer 419 is formed over the conductive film 417 and the insulating film 418, and the conductive film 420 is formed over the EL layer 419 (see FIG. 14C).

The conductive film 417, the EL layer 419, and the conductive film 420 forms the display element 12. Note that the conductive film 417 functions as one of a pair of electrodes of the display element 12, and the conductive film 420 functions as the other thereof. Although not illustrated, the EL layers 419 are separately formed for color elements (RGB). Note that details of the manufacturing method of the display element 12 are described in Embodiment 2.

Through the above steps, an element formed over the substrate 401 can be fabricated.

Figure 15A:
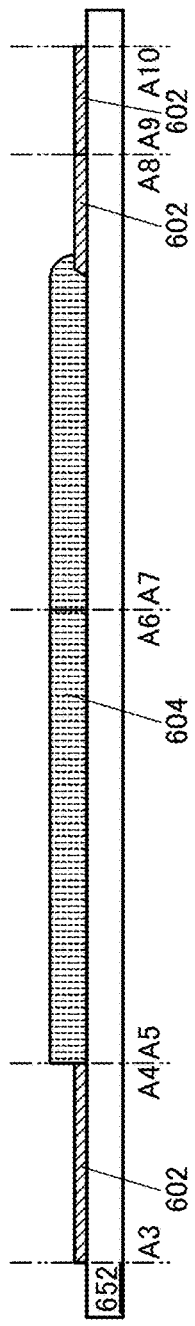
FIGS. 15A to 15C are cross-sectional views illustrating a manufacturing process of a display device.
Figure 15B:
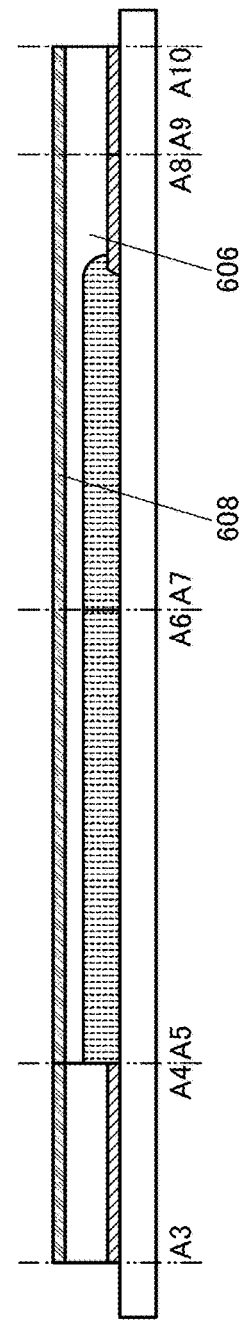
Figure 15C:
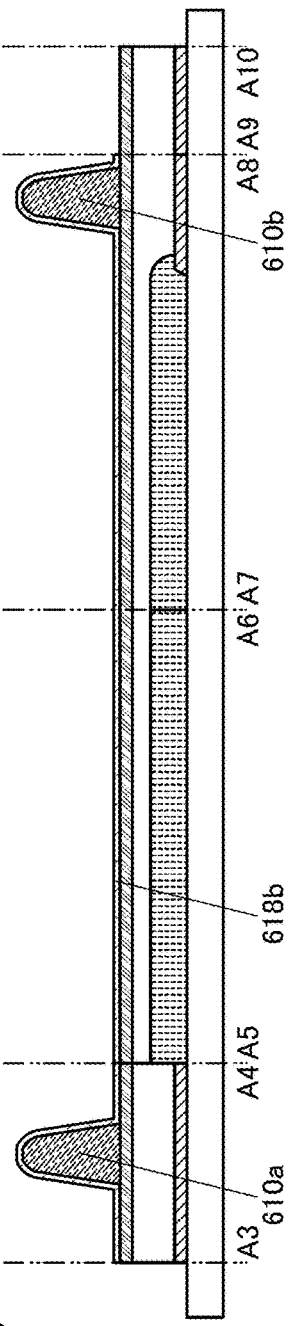

A method for manufacturing the substrate 652 disposed to face the substrate 452 is described with reference to FIGS. 15A to 15C.

First, the light-blocking film 602 is formed over the substrate 652. After that, the color film 604 is formed over the substrate 652 and the light-blocking film 602 (see FIG. 15A).

Next, the insulating film 606 is formed over the light-blocking film 602 and the color film 604. Then, the conductive film 608 is formed over the insulating film 606 (see FIG. 15B).

Next, the structure bodies 610a and 610b are formed in desired regions over the conductive film 608. Then, the alignment film 618b is formed over the conductive film 608 and the structure bodies 610a and 610b (see FIG. 15C).

Note that a structure without the alignment film 618b may be employed. Although the structure bodies 610a and 610b are formed over the substrate 652 in this embodiment, the present invention is not limited thereto. For example, the structure bodies 610a and 610b may be formed over the above-described element formed over the substrate 401.

Through the above steps, an element formed over the substrate 652 can be fabricated.

Next, the element formed over the substrate 401 is separated from the substrate 401. Specifically, separation is conducted at an interface between the conductive film 402 formed over the substrate 401 and the conductive films 403a, 403b, and 403c and the insulating film 404 which are formed over the conductive film 402. For the separation, the sealing material 454 is formed over the element formed over the substrate 401. Then, the substrate 452 is attached to the sealing material 454 and the element is separated at the interface between the element and the conductive film 402 (see FIG. 16A).

When the element is separated at the interface between the element and the conductive film 402, surfaces of the conductive films 403a, 403b, and 403c (bottom surfaces of the conductive films 403a, 403b, and 403c in FIG. 16A) are exposed. In the case where an insulating film, a foreign substance, or the like is attached to the surfaces of the conductive films 403a, 403b, and 403c, the insulating film, the foreign substance, or the like is preferably removed by cleaning treatment, ashing treatment, etching treatment, or the like.

When the element is separated at the interface between the element and the conductive film 402, a polar solvent (typically water), a nonpolar solvent, or the like is preferably added to the interface between the conductive film 402 and the conductive films 403a, 403b, and 403c and the insulating film 404 which are formed over the conductive film 402. For example, it is preferable to use water in separating the element at the interface between the element and the conductive film 402 because damage caused by electrification in separation can be reduced.

As the conductive film 402, any of the following materials can be used. The conductive film 402 can have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. In the case of a layer containing silicon, the layer containing silicon may have an amorphous, microcrystalline, polycrystalline, or single-crystal structure.

When the conductive film 402 is formed as a stacked layer structure including a layer containing tungsten and a layer containing an oxide of tungsten, the layer containing tungsten may be formed and an insulating layer containing an oxide may be formed thereover so that the layer containing an oxide of tungsten is formed at the interface between the tungsten layer and the insulating layer. Alternatively, the layer containing an oxide of tungsten may be formed by performing thermal oxidation treatment, oxygen plasma treatment, dinitrogen monoxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or dinitrogen monoxide alone, or a mixed gas of any of these gasses and another gas. The surface condition of the conductive film 402 is changed by the plasma treatment or the heat treatment, whereby adhesion between the conductive film 402 and the conductive films 403a, 403b, and 403c and the insulating film 404 which are formed later can be controlled.

Although the structure where the conductive film 402 is provided is described in this embodiment, the present invention is not limited thereto. For example, a structure where the conductive film 402 is not provided may be employed. In that case, an organic resin film may be formed in a region where the conductive film 402 is formed. As the organic resin film, for example, a polyimide resin film, a polyamide resin film, an acrylic resin film, an epoxy resin film, or a phenol resin film can be used.

In the case where the organic resin film is used instead of the conductive film 402, as a method for separating the element formed over the substrate 401, a laser light is irradiated from the lower side of the substrate 401 to weaken the organic resin film, whereby separation is conducted at an interface between the substrate 401 and the organic resin film or at an interface between the organic resin film and the conductive films 403a, 403b, and 403c and the insulating film 404.

In the case where a laser light is irradiated, a region having strong adhesion and a region having weak adhesion are formed between the substrate 401 and the conductive films 403a, 403b, and 403c and the insulating film 404 by adjustment of the irradiation energy density of the laser light, and then, the element may be separated from the substrate 401.

Next, the element is reversed so that the substrate 452 is placed at the bottom, and the alignment film 618a is formed over the insulating film 404 and the conductive film 403b (see FIG. 16B).

Next, an element over the substrate 452 and an element over the substrate 652 are attached to each other and sealed with the sealant 622. After that, the liquid crystal layer 620 is formed between the substrates 452 and 652, whereby the display element 11 is formed (see FIG. 17).

Note that the conductor 624 is provided in the sealant 622 over the conductive film 403c. As the conductor 624, conductive particles may be dispersed into a desired region in the sealant 622 by a dispenser method or the like. The conductive film 403c and the conductive film 608 are electrically connected to each other through the conductor 624.

Figure 17:
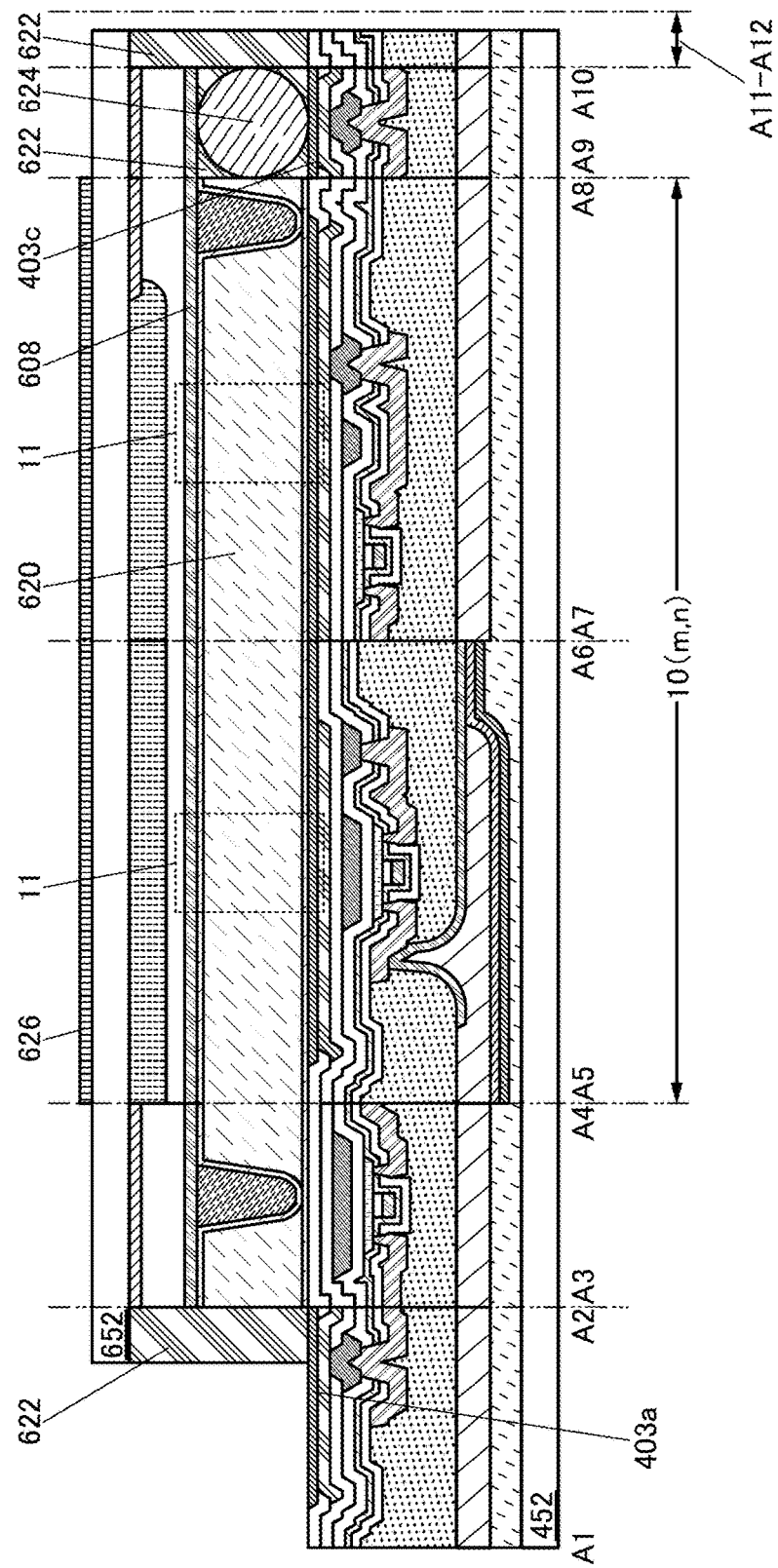
FIG. 17 is a cross-sectional view illustrating a manufacturing process of a display device.

Next, the functional film 626 is formed over the substrate 652 (see FIG. 17). Note that the functional film 626 is not necessarily formed.

After that, the FPC is bonded to the conductive film 403a with the ACF placed therebetween. Note that an anisotropic conductive paste (ACP) may be used instead of the ACF.

Through the above steps, the display device 500 illustrated in FIG. 8 can be fabricated.

<1-10. Modification Example 1 of Display Device>

A touch panel may be provided in the display device 500 illustrated in FIG. 8. As the touch panel, a capacitive touch panel (a surface capacitive touch panel or a projected capacitive touch panel) can be preferably used.

A structure in which a touch panel is provided in the display device 500 is described with reference to FIG. 18 to FIG. 20.

Figure 18:
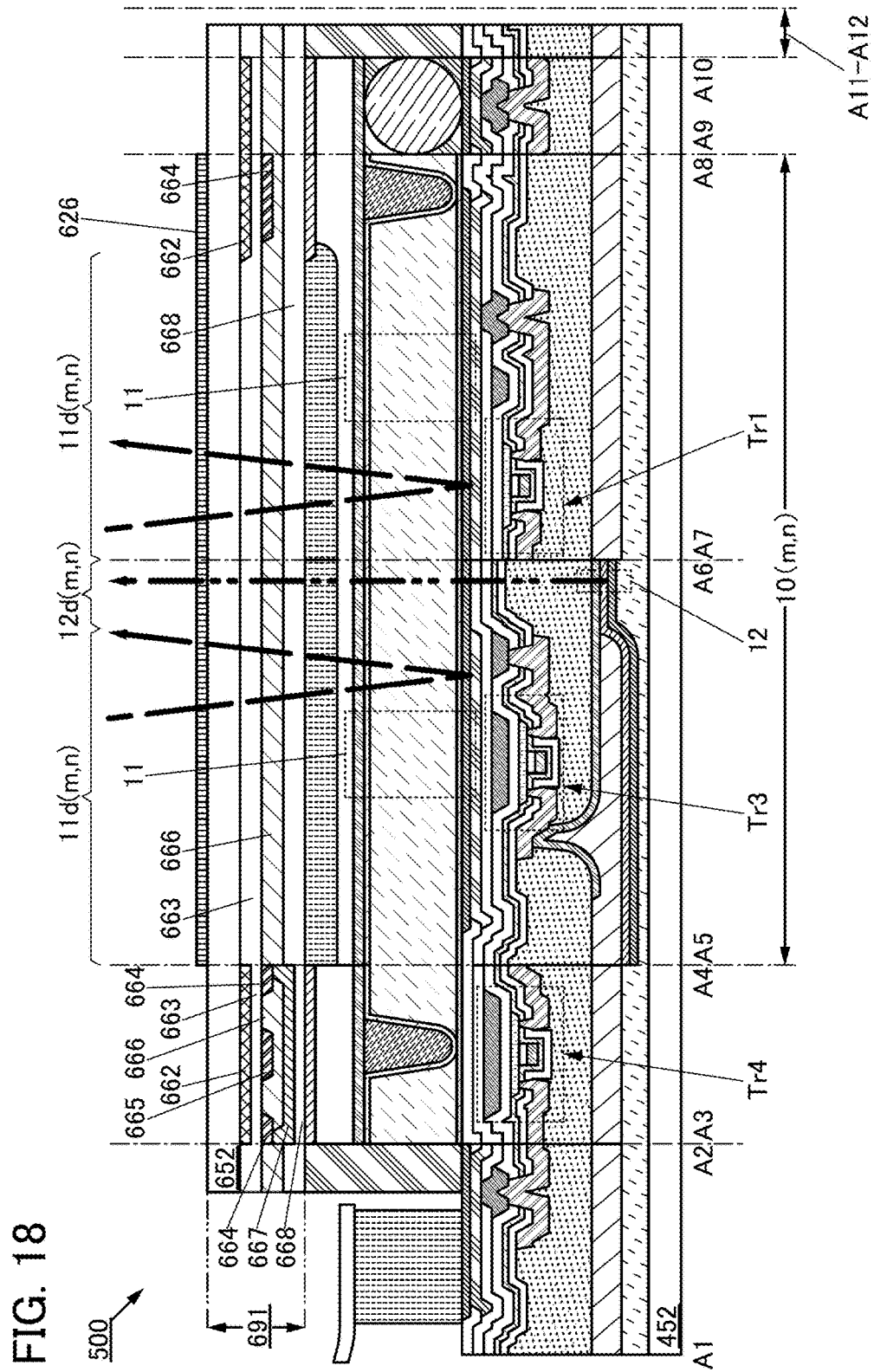
FIG. 18 is a cross-sectional view illustrating a display device.

FIG. 18 is a cross-sectional view of a structure in which a touch panel 691 is provided in the display device 500. FIG. 19 is a cross-sectional view of a structure in which a touch panel 692 is provided in the display device 500. FIG. 20 is a cross-sectional view of a structure in which a touch panel 693 is provided in the display device 500.

First, the touch panel 691 illustrated in FIG. 18 is described below.

The touch panel 691 illustrated in FIG. 18 is an in-cell touch panel that is provided between the substrate 652 and the color film 604. The touch panel 691 is formed over the substrate 652 before the light-blocking film 602 and the color film 604 are formed.

The touch panel 691 includes a light-blocking film 662, an insulating film 663, an electrode 664, an electrode 665, an insulating film 666, an electrode 667, and an insulating film 668. Changes in the mutual capacitance in the electrodes 664 and 665 can be detected when an object such as a finger or a stylus approaches, for example.

An intersection portion of the electrode 664 and the electrode 665 is shown above the transistor Tr4 illustrated in FIG. 18. The electrode 667 is electrically connected to the two electrodes 664 between which the electrode 665 is sandwiched through openings provided in the insulating film 666. Although a region in which the electrode 667 is provided is located in a region corresponding to the gate driver circuit portion 504a in FIG. 18, it is not limited thereto, and the region in which the electrode 667 is provided may be located in a region where the pixel 10(m, n) is provided, for example.

The electrodes 664 and 665 are provided in a region overlapping with the light-blocking film 662. As illustrated in FIG. 18, it is preferable that the electrode 664 do not overlap with the display element 12. In other words, the electrode 664 has openings in regions overlapping with the display element 12. That is, the electrode 664 has a mesh shape. With this structure, the electrode 664 does not block light emitted from the display element 12. Therefore, since luminance is hardly reduced even when the touch panel 691 is provided, a display device with high visibility and low power consumption can be obtained. Note that the electrode 665 can have a structure similar to that of the electrode 664.

Since the electrodes 664 and 665 do not overlap with the display element 12, a metal material whose transmittance of visible light is low can be used for the electrodes 664 and 665. Therefore, as compared with the case of using an oxide material whose transmittance of visible light is high, resistance of the electrodes 664 and 665 can be reduced, whereby sensitivity of the sensor of the touch panel can be increased.

Figure 19:
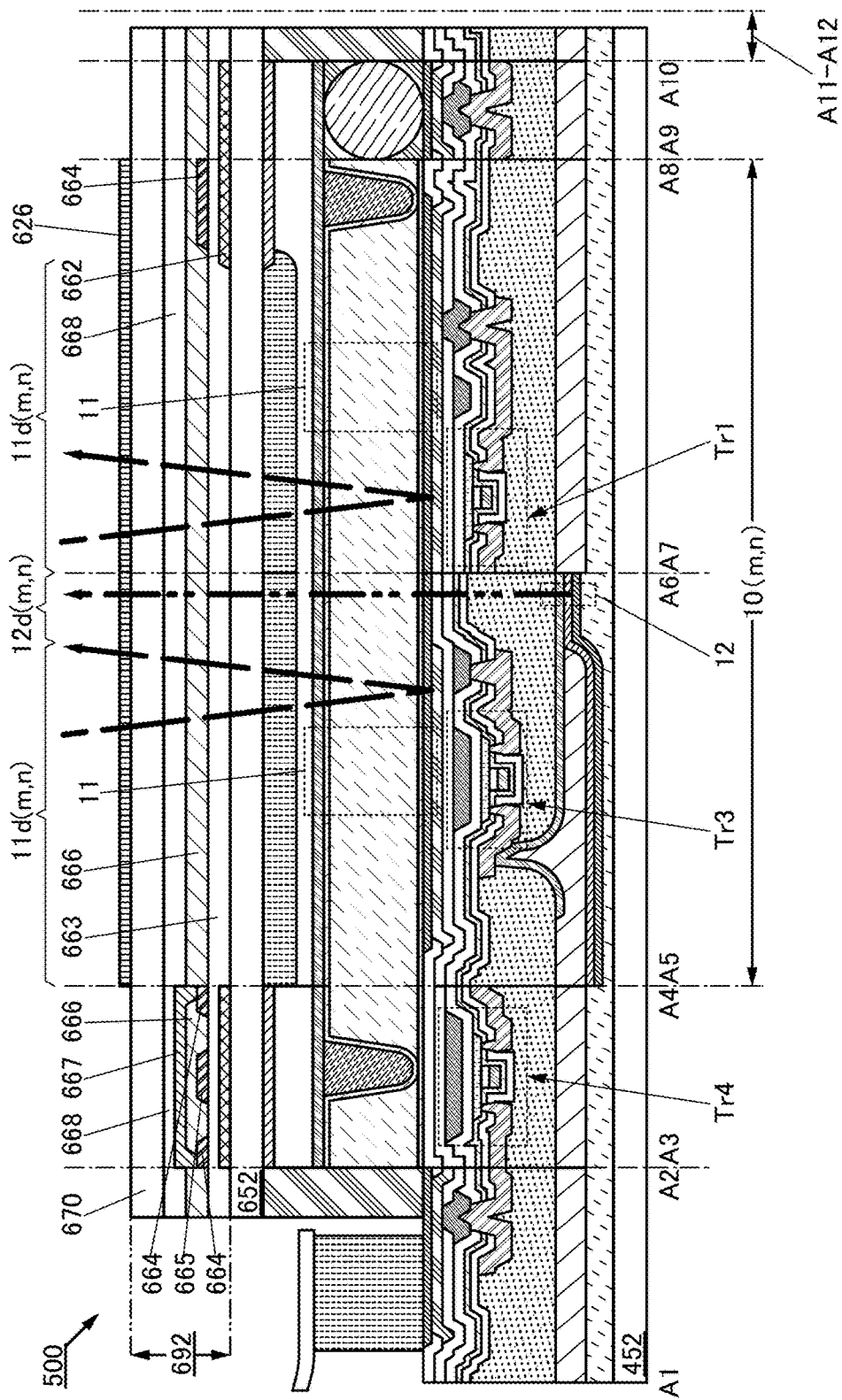
FIG. 19 is a cross-sectional view illustrating a display device.
Figure 20:
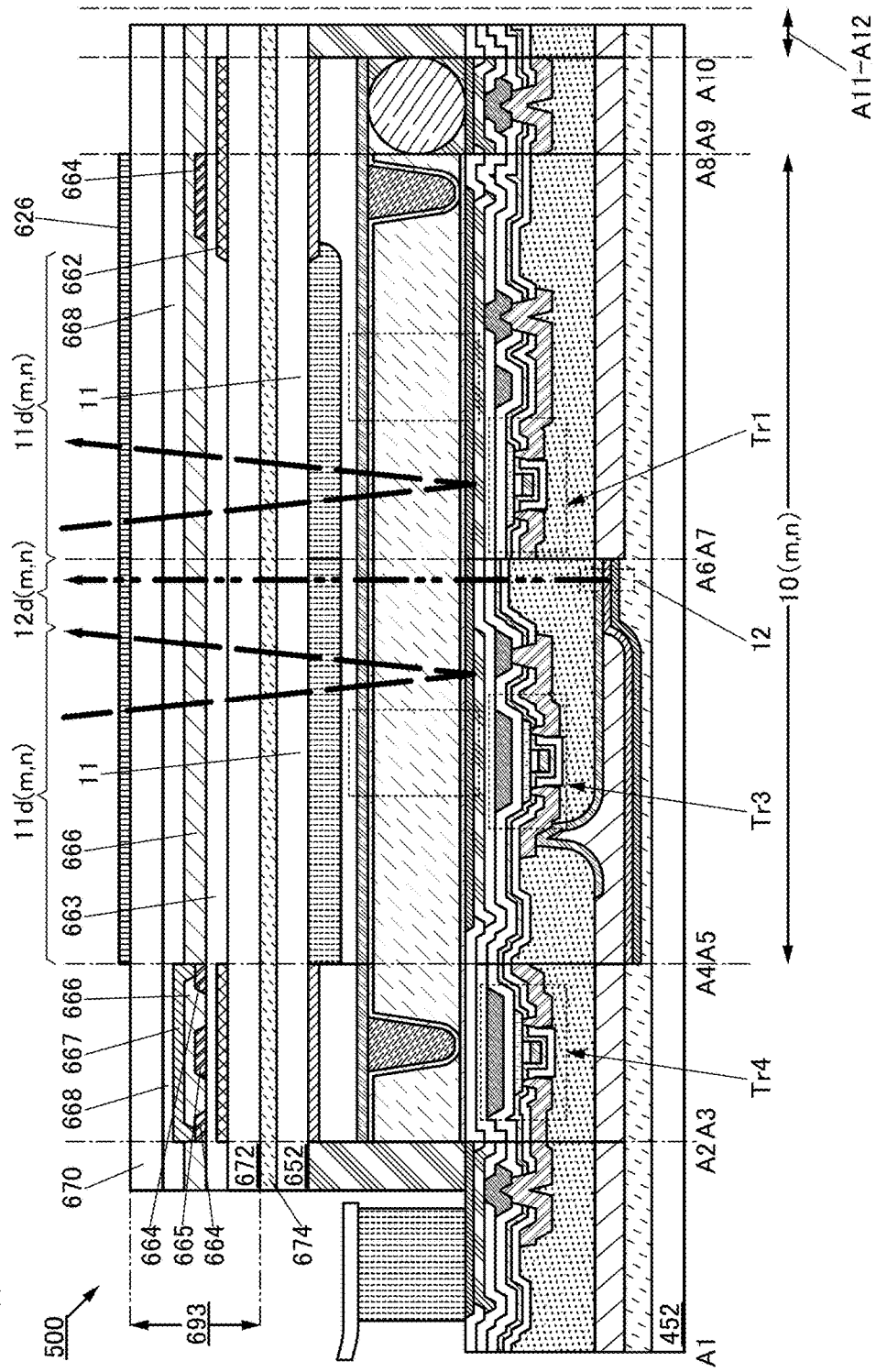
FIG. 20 is a cross-sectional view illustrating a display device.

Next, the touch panel 692 illustrated in FIG. 19 and the touch panel 693 illustrated in FIG. 20 are described below.

The touch panel 692 illustrated in FIG. 19 is an on-cell touch panel that is provided above the substrate 652. The touch panel 692 has a structure similar to that of the touch panel 691.

The touch panel 693 illustrated in FIG. 20 is provided over a substrate 672 and is bonded to the substrate 652 with a bonding material 674. The touch panel 693 is an out-cell touch panel (also referred to as an externally attached touch panel). The touch panel 693 has a structure similar to that of the touch panel 691. The touch panel 693 further includes a substrate 670, in addition to the components included in the touch panel 691. The substrate 670 has a function of protecting the touch panel 693. Note that the substrate 670 is not necessarily provided.

In this manner, the display device of one embodiment of the present invention can be combined with various types of touch panels.

<1-11. Modification Example 2 of Display Device>

FIG. 8 and FIG. 18 to FIG. 20 illustrate examples in which the functional film 626 is positioned outside the substrate 652, but one embodiment of the present invention is not limited to these structures. For example, a structure in which the substrate 652 is not provided may be employed, and examples of the structure without the substrate 652 are illustrated in FIG. 21 to FIG. 24.

Figure 21:
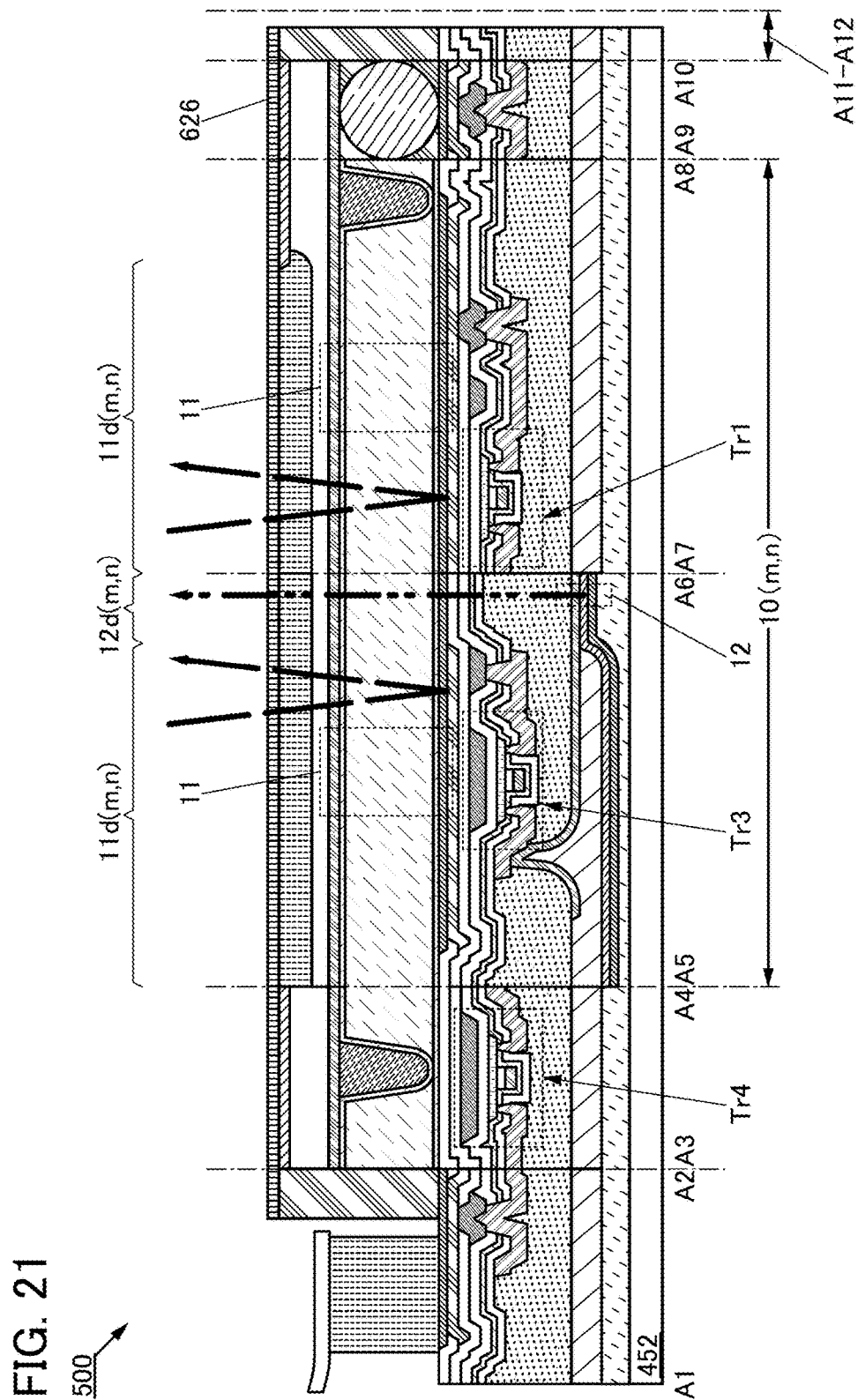
FIG. 21 is a cross-sectional view illustrating a display device.

FIG. 21 illustrates a modification example of the display device 500 illustrated in FIG. 8. In FIG. 21, the substrate 652 is not provided and sealing is performed by the functional film 626. In this case, a material used for a circularly polarizing plate can be suitably used for the functional film 626.

Figure 22:
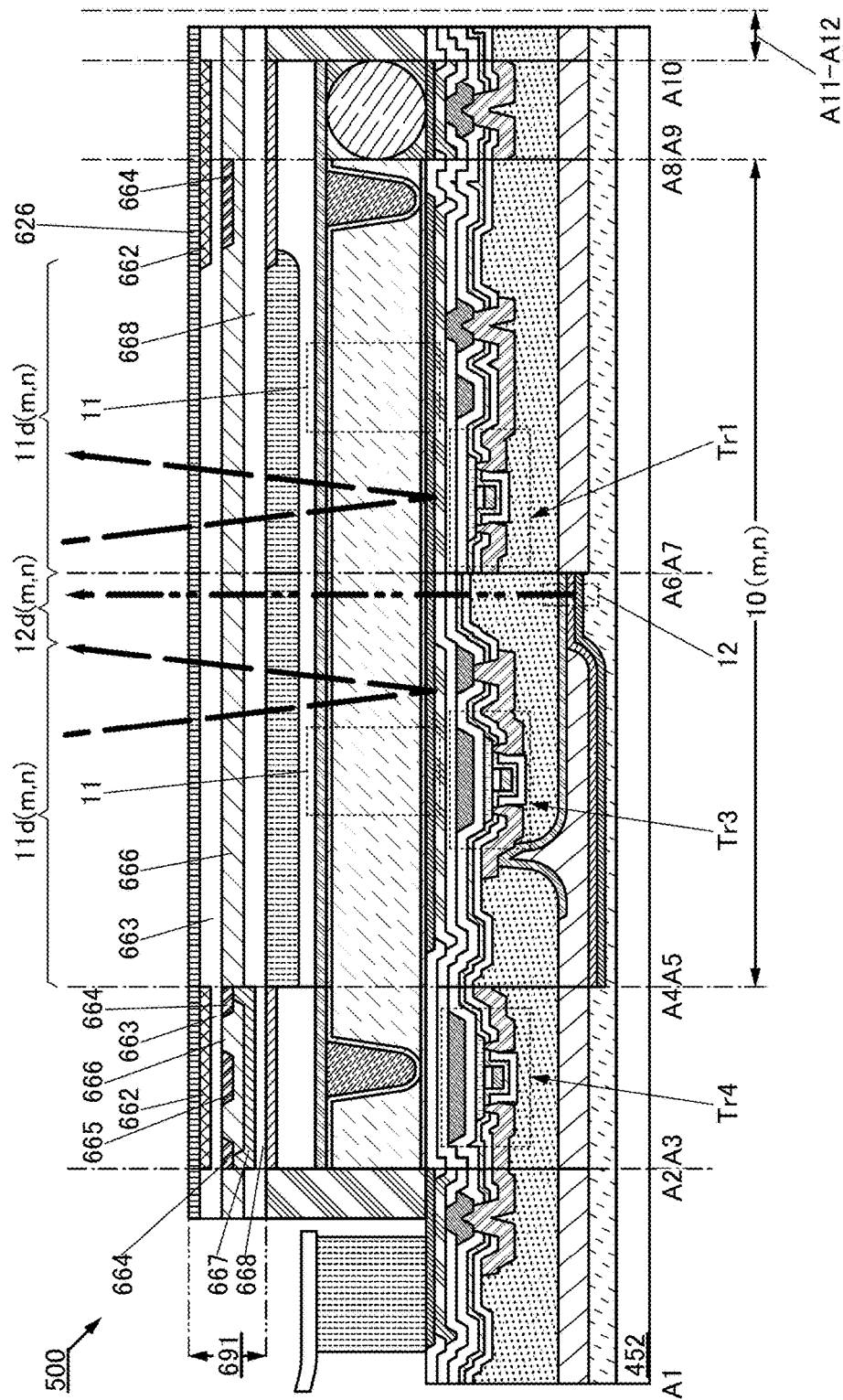
FIG. 22 is a cross-sectional view illustrating a display device.

FIG. 22 illustrates a modification example of the display device 500 illustrated in FIG. 18. In FIG. 22, the substrate 652 is not provided and the functional film 626 functions as part of the touch panel 691.

Figure 23:
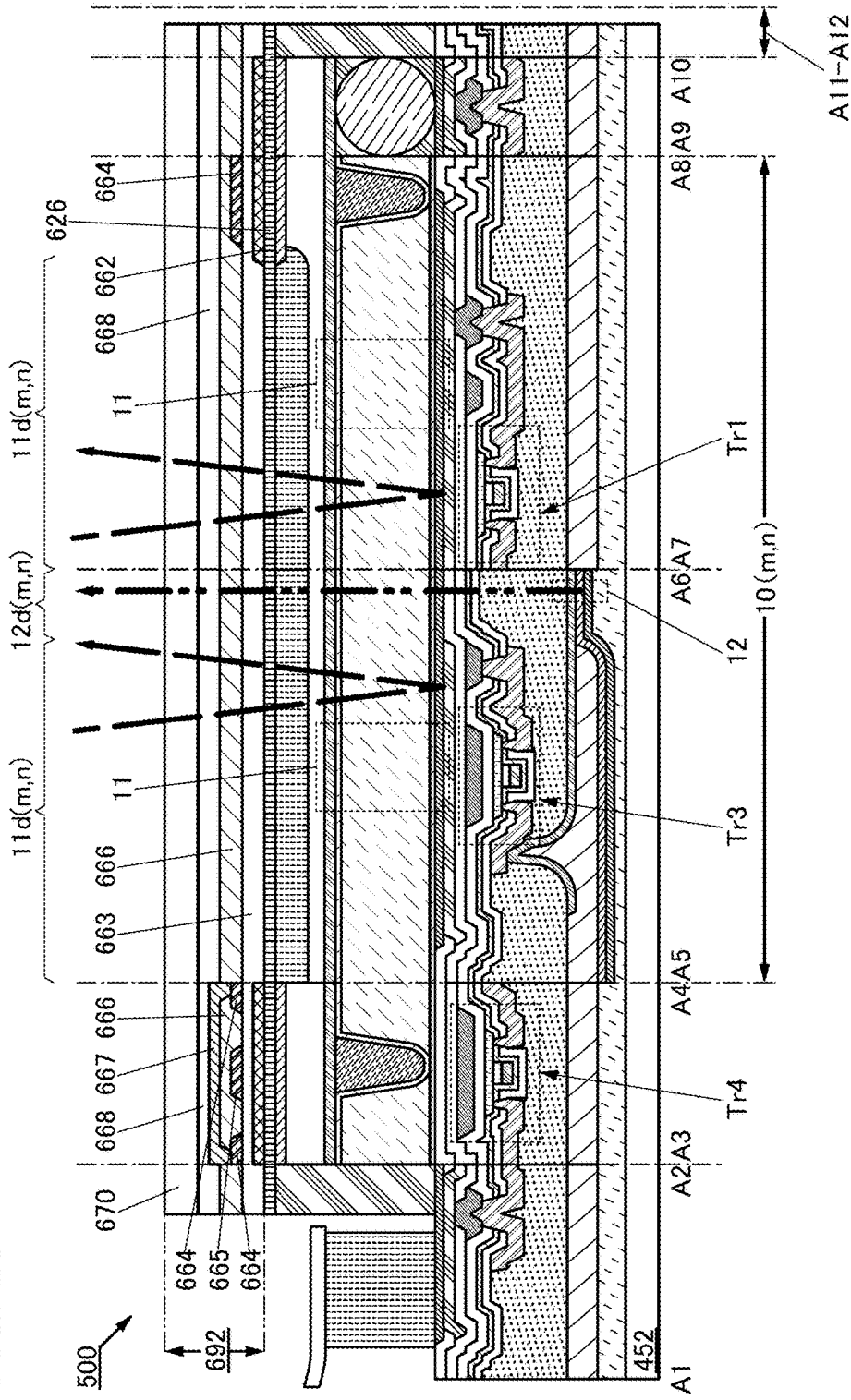
FIG. 23 is a cross-sectional view illustrating a display device.

FIG. 23 illustrates a modification example of the display device 500 illustrated in FIG. 19. In FIG. 23, the functional film 626 is provided inside the touch panel 692.

Figure 24:
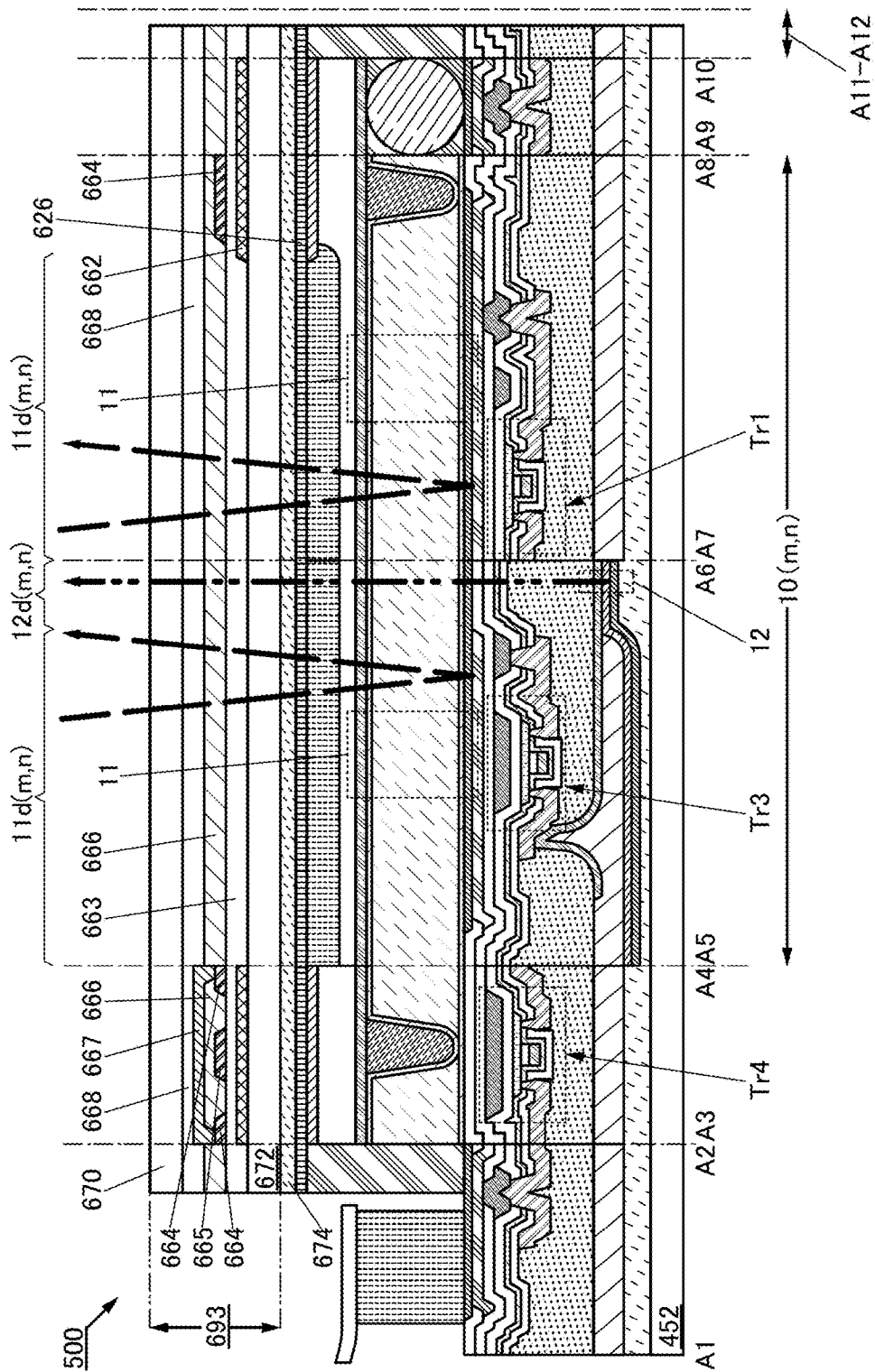
FIG. 24 is a cross-sectional view illustrating a display device.

FIG. 24 illustrates a modification example of the display device 500 illustrated in FIG. 20. In FIG. 24, the substrate 652 is not provided, and the functional film 626 is bonded to the touch panel 693 with the bonding material 674 interposed therebetween.

The structures as illustrated in FIG. 21 to FIG. 24 in which the substrate 652 is not provided are preferred because the thickness of the display device 500 can be small.

<1-12. Modification Example 3 of Display Device>

Figure 25:
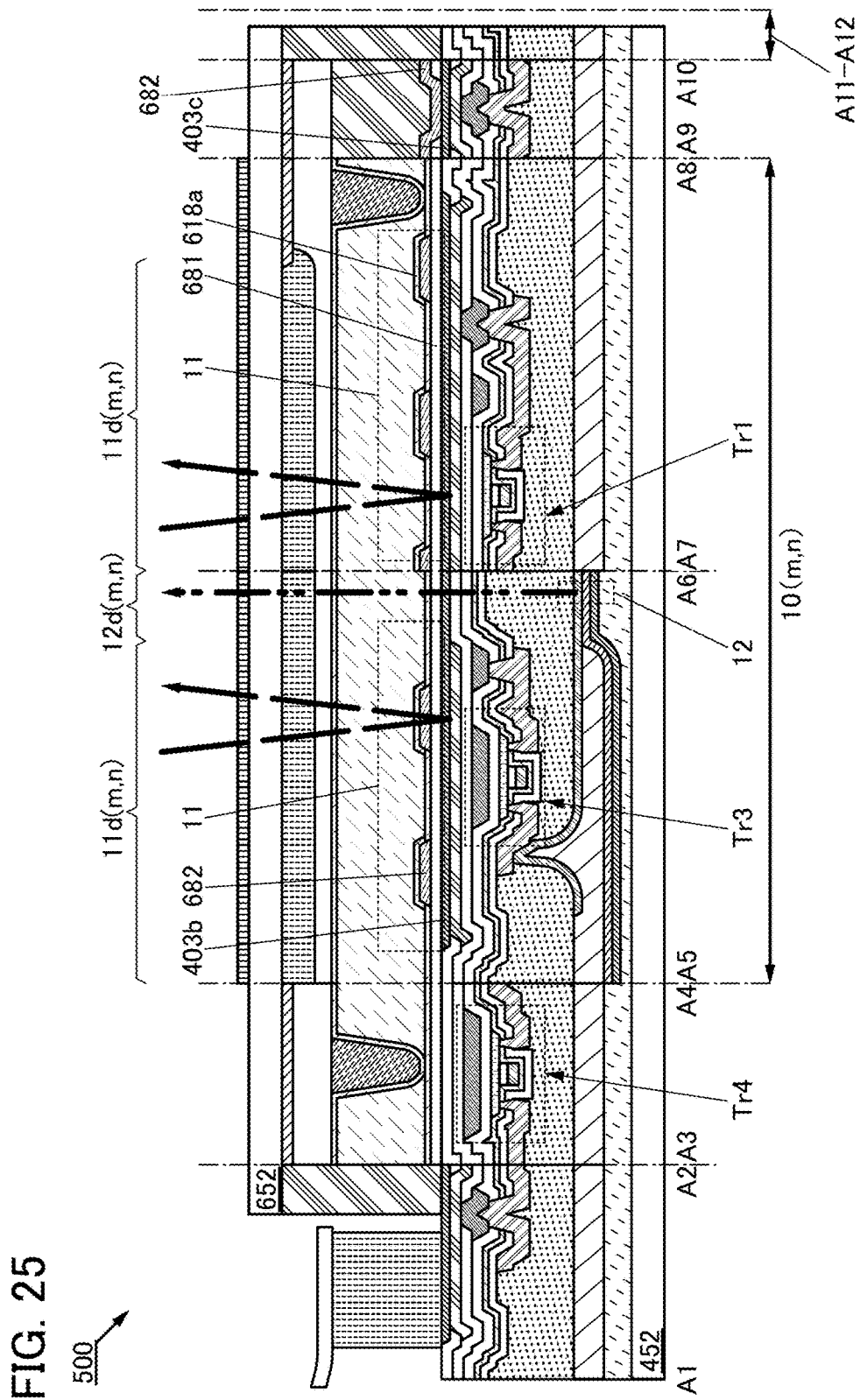
FIG. 25 is a cross-sectional view illustrating a display device.

An example of a structure where the liquid crystal element of the display device 500 illustrated in FIG. 8 is a horizontal electric field mode liquid crystal element, (here, a fringe field switching (FFS) mode liquid crystal element) is shown in FIG. 25.

The display device 500 illustrated in FIG. 25 includes an insulating film 681 over the conductive films 403b and 403c and a conductive film 682 over the insulating film 681 in addition to the above-mentioned components.

The insulating film 681 has an opening in a connection region taken along the dashed-dotted line A9-A10, and the conductive film 682 is electrically connected to the conductive film 403c through the opening. In FIG. 25, the conductor 624 included in the sealant 622 in FIG. 8 is not provided.

The conductive film 682 functions as a common electrode. The conductive film 682 may have a comb-like shape or a shape having a slit when seen from the above. Since the conductive film 682 is provided in the display device 500 illustrated in FIG. 25, the conductive film 608 provided on the substrate 652 side in FIG. 8 is not provided. Note that the conductive film 682 may be provided and the conductive film 608 may be further provided on the substrate 652 side.

When the conductive film 682 is formed using a light-transmitting material, a light-transmitting capacitor can be formed. The light-transmitting capacitor includes the conductive film 682, the insulating film 681 overlapping with the conductive film 682, and the conductive film 403c. This structure is preferable because the amount of charge accumulated in the capacitor can be increased.

<1-13. Components of Display Device>

Next, the components of the display device 500 and the manufacturing method thereof illustrated in FIG. 8 to FIG. 25 are described below.

[Substrate]

The substrates 401, 452, 652 and 670 can be formed using a material having heat resistance high enough to withstand heat treatment in the manufacturing process.

Specifically, non-alkali glass, soda-lime glass, potash glass, crystal glass, quartz, sapphire, or the like can be used. Alternatively, an inorganic insulating film may be used. Examples of the inorganic insulating film include a silicon oxide film, a silicon nitride film, a silicon oxynitride film, and an alumina film.

The non-alkali glass preferably has a thickness of greater than or equal to 0.2 nm and less than or equal to 0.7 mm, for example. The non-alkali glass may be polished to obtain the above thickness.

For example, a large-sized glass substrate having any of the following sizes can be used as each of the substrates 401, 452, 652, and 670: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, as the substrates 401, 452, 652, and 670, a single-crystal semiconductor substrate or a polycrystalline semiconductor substrate made of silicon or silicon carbide, a compound semiconductor substrate made of silicon germanium or the like, an SOI substrate, or the like may be used.

Alternatively, for the substrates 401, 452, 652, and 670, an inorganic material such as a metal may be used. Examples of the inorganic material such as a metal include stainless steel and aluminum.

Alternatively, for the substrates 401, 452, 652, and 670, an organic material such as a resin, a resin film, or plastic may be used. Examples of the resin film include polyester, polyolefin, polyamide (e.g., nylon or aramid), polyimide, polycarbonate, polyurethane, an acrylic resin, an epoxy resin, polyethylene terephthalate (PET), polyethylene naphthalate (PEN), polyether sulfone (PES), and a resin having a siloxane bond.

Alternatively, for the substrates 401, 452, 652, and 670, a composite material of a combination of an inorganic material and an organic material may be used. Examples of the composite material include a resin film to which a metal plate or a thin glass plate is bonded, a resin film into which a fibrous or particulate metal or a fibrous or particulate glass is dispersed, and an inorganic material into which a fibrous or particulate resin is dispersed.

[Conductive Film]

A metal film having conductivity, a conductive film having a function of reflecting visible light, or a conductive film having a function of transmitting visible light may be used as the conductive films 402, 403a, 403b, 403c, 405a, 405b, 405c, 405d, 407a, 407b, 407c, 407d, 407e, 411a, 411b, 411c, 414a, 414b, 414c, 414d, 414e, 414f, 414g, 414h, 417, 420, 608, and 682.

A material containing a metal element selected from aluminum, gold, platinum, silver, copper, chromium, tantalum, titanium, molybdenum, tungsten, nickel, iron, cobalt, palladium, and manganese can be used for the metal film having conductivity. Alternatively, an alloy containing any of the above metal elements may be used.

For the metal film having conductivity, specifically a two-layer structure in which a copper film is stacked over a titanium film, a two-layer structure in which a copper film is stacked over a titanium nitride film, a two-layer structure in which a copper film is stacked over a tantalum nitride film, or a three-layer structure in which a titanium film, a copper film, and a titanium film are stacked in this order may be used. In particular, a conductive film containing a copper element is preferably used because the resistance can be reduced. As an example of the conductive film containing a copper element, an alloy film containing copper and manganese is given. The alloy film is preferable because it can be processed by a wet etching method.

As the metal film having conductivity, a conductive macromolecule or a conductive polymer may be used.

For the conductive film having a function of reflecting visible light, a material containing a metal element selected from gold, silver, copper, and palladium can be used. In particular, a conductive film containing a silver element is preferably used because reflectance of visible light can be improved.

For the conductive film having a function of transmitting visible light, a material containing an element selected from indium, tin, zinc, gallium, and silicon can be used. Specifically, an In oxide, a Zn oxide, an In—Sn oxide (also referred to as ITO), an In—Sn—Si oxide (also referred to as ITSO), an In—Zn oxide, an In—Ga—Zn oxide, or the like can be used.

As the conductive film having a function of transmitting visible light, a film containing graphene or graphite may be used. The film containing graphene can be formed in the following manner: a film containing graphene oxide is formed and is reduced. As a reducing method, a method with application of heat, a method using a reducing agent, or the like can be employed.

Note that the conductive films 403c and 417 each having a function of a pixel electrode contain at least one metal element contained in the oxide semiconductor films 409a, 409b, and 409c. For example, in the case where the oxide semiconductor films 409a, 409b, and 409c include a metal oxide such as an In-M-Zn oxide (M is Al, Ga, Y, or Sn), the conductive film 403c and the conductive film 417 each contain any one of In, M (M is Al, Ga, Y, or Sn), and Zn.

[Insulating Film]

For the insulating films 404, 406, 408, 410a, 410b, 410c, 412, 413, 416, 418, 606, 663, 666, 668, and 681, an inorganic insulating material, an organic insulating material, or an insulating composite material including an insulating inorganic material and an insulating organic material can be used.

Examples of the insulating inorganic material include a silicon oxide film, a silicon nitride film, a silicon oxynitride film, a silicon nitride oxide film, and an aluminum oxide film. Alternatively, a plurality of the above inorganic materials may be stacked.

As the above insulating organic material, for example, materials that include polyester, polyolefin, polyamide (e.g., nylon or aramid), polyimide, polycarbonate, polyurethane, an acrylic resin, an epoxy resin, or a resin having a siloxane bond can be used. As the insulating organic material, a photosensitive material may be used.

[Oxide Semiconductor Film]

The oxide semiconductor films 409a, 409b, and 409c are formed using a metal oxide such as an In-M-Zn oxide (M is Al, Ga, Y, or Sn). Alternatively, an In—Ga oxide or an In—Zn oxide may be used for the oxide semiconductor films 409a, 409b, and 409c.

In the case where the oxide semiconductor films 409a, 409b, and 409c include an In-M-Zn oxide, the proportions of In and M, the summation of which is assumed to be 100 atomic %, are as follows: the proportion of In is higher than 25 atomic % and the proportion of M is lower than 75 atomic %, or the proportion of In is higher than 34 atomic % and the proportion of M is lower than 66 atomic %.

The energy gap of the oxide semiconductor films 409a, 409b, and 409c is preferably 2 eV or more, 2.5 eV or more, or 3 eV or more.

The thickness of each of the oxide semiconductor films 409a, 409b, and 409c is greater than or equal to 3 nm and less than or equal to 200 nm, preferably greater than or equal to 3 nm and less than or equal to 100 nm, further preferably greater than or equal to 3 nm and less than or equal to 60 nm.

In the case where the oxide semiconductor films 409a, 409b, and 409c include an In-M-Zn oxide, the atomic ratio of metal elements in a sputtering target used for depositing the In-M-Zn oxide preferably satisfies In≥M and Zn≥M. As the atomic ratio of metal elements in such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=5:1:7, or the like is preferable. Note that the atomic ratio of metal elements in the deposited oxide semiconductor films 409a, 409b, and 409c may vary from the above atomic ratio of metal elements in the sputtering target within a range of approximately ±40%. For example, when a sputtering target whose atomic ratio of In to Ga and Zn is 4:2:4.1 is used, the atomic ratio of In to Ga and Zn in the deposited oxide semiconductor film may be approximately 4:2:3. In the case where a sputtering target whose atomic ratio of In to Ga and Zn is 5:1:7 is used, the atomic ratio of In to Ga and Zn in the deposited oxide semiconductor film may be approximately 5:1:6.

When silicon or carbon, which are elements belonging to Group 14, is contained in the oxide semiconductor films 409a, 409b, and 409c, oxygen vacancies are increased and the oxide semiconductor films 409a, 409b, and 409c have n-type conductivity in some cases. Thus, the concentration of silicon or carbon in the oxide semiconductor films 409a, 409b, and 409c, particularly in the channel region, is set to be lower than or equal to $2\times10^{18}$ atoms/cm$^3$, or lower than or equal to $2\times10^{17}$ atoms/cm$^3$. As a result, the transistor has a positive threshold voltage (normally-off characteristics). Note that the concentration of silicon or carbon can be measured by secondary ion mass spectrometry (SIMS), for example.

Furthermore, the concentration of alkali metal or alkaline earth metal in the oxide semiconductor films 409a, 409b, and 409c, which is measured by SIMS, can be lower than or equal to $1\times10^{18}$ atoms/cm$^3$ or lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor films 409a, 409b, and 409c. As a result, the transistor has a positive threshold voltage (normally-off characteristics).

Furthermore, when nitrogen is contained in the oxide semiconductor films 409a, 409b, and 409c, electrons serving as carriers are generated and carrier density is increased and the oxide semiconductor films 409a, 409b, and 409c have n-type conductivity in some cases. Thus, a transistor including an oxide semiconductor film which contains nitrogen is likely to have normally-on characteristics. For this reason, nitrogen in the oxide semiconductor films 409a, 409b, and 409c is preferably reduced as much as possible. For example, the nitrogen concentration measured by SIMS may be $5\times10^{18}$ atoms/cm$^3$ or lower.

When impurity elements in the oxide semiconductor films 409a, 409b, and 409c are reduced, the carrier density of the oxide semiconductor films can be lowered. Therefore, the oxide semiconductor films 409a, 409b, and 409c can have a carrier density less than or equal to $1\times10^{17}$ cm$^{-3}$, less than or equal to $1\times10^{15}$ cm$^{-3}$, less than or equal to $1\times10^{13}$ cm$^3$, or less than or equal to $1\times10^{11}$ cm$^{-3}$.

When an oxide semiconductor film with a low impurity concentration and a low density of defect states is used as the oxide semiconductor films 409a, 409b, and 409c, the transistor can have more excellent electrical characteristics. Here, the state in which the impurity concentration is low and the density of defect states is low (the number of oxygen vacancies is small) is referred to as "highly purified intrinsic", "substantially highly purified intrinsic", "intrinsic", or "substantially intrinsic". A highly purified intrinsic or substantially highly purified intrinsic oxide semiconductor has few carrier generation sources and thus can have a low carrier density in some cases. Thus, a transistor whose channel region is formed in the oxide semiconductor film is likely to have a positive threshold voltage (normally-off characteristics). The highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film enables extremely low off-state current. Thus, the transistor whose channel region is formed in the oxide semiconductor film has little variation in electrical characteristics and high reliability in some cases.

Each of the oxide semiconductor films 409a, 409b, and 409c may have a non-single-crystal structure. The non-single-crystal structure includes a c-axis aligned crystalline oxide semiconductor (CAAC-OS) described later, a polycrystalline structure, a microcrystalline structure described later, or an amorphous structure, for example. Among the non-single-crystal structures, the amorphous structure has the highest density of defect states, whereas the CAAC-OS has the lowest density of defect states.

Note that each of the oxide semiconductor films 409a, 409b, and 409c may be a single film or stacked films including two or more of the following regions: a region having an amorphous structure, a region having a microcrystalline structure, a region having a polycrystalline structure, a CAAC-OS region, and a region having a single-crystal structure.

[Liquid Crystal Layer]

As examples of the liquid crystal layer 620, thermotropic liquid crystal, low-molecular liquid crystal, high-molecular liquid crystal, polymer dispersed liquid crystal, ferroelectric liquid crystal, and anti-ferroelectric liquid crystal are given. Alternatively, a liquid crystal material which exhibits a cholesteric phase, a smectic phase, a cubic phase, a chiral nematic phase, an isotropic phase, or the like may be used. Furthermore, a liquid crystal material exhibiting a blue phase may be used.

For a driving method of the liquid crystal layer 620, an in-plane switching (IPS) mode, a twisted nematic (TN) mode, an FFS mode, an axially symmetric aligned microcell (ASM) mode, an optically compensated birefringence (OCB) mode, a ferroelectric liquid crystal (FLC) mode, an antiferroelectric liquid crystal (AFLC) mode, or the like can be used. In addition, the liquid crystal layer 620 can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

[EL Layer]

The EL layer 419 includes at least a light-emitting material. Examples of the light-emitting material include an organic compound and an inorganic compound such as a quantum dot.

The organic compound and the inorganic compound can be formed by an evaporation method (including a vacuum evaporation method), an ink-jet method, a coating method, or gravure printing, for example.

Examples of materials that can be used for the organic compound include a fluorescent material and a phosphorescent material. A fluorescent material is preferably used in terms of the lifetime, while a phosphorescent material is preferably used in terms of the efficiency. Furthermore, both of a fluorescent material and a phosphorescent material may be used.

A quantum dot is a semiconductor nanocrystal with a size of several nanometers and contains approximately $1 \times 10^3$ to $1 \times 10^6$ atoms. Since energy shift of quantum dots depend on their size, quantum dots made of the same substance emit light with different wavelengths depending on their size; thus, emission wavelengths can be easily adjusted by changing the size of quantum dots.

Since a quantum dot has an emission spectrum with a narrow peak, emission with high color purity can be obtained. In addition, a quantum dot is said to have a theoretical internal quantum efficiency of approximately 100%, which far exceeds that of a fluorescent organic compound, i.e., 25%, and is comparable to that of a phosphorescent organic compound. Therefore, a quantum dot can be used as a light-emitting material to obtain a light-emitting element having high light-emitting efficiency. Furthermore, since a quantum dot which is an inorganic compound has high inherent stability, a light-emitting element which is favorable also in terms of lifetime can be obtained.

Examples of a material of a quantum dot include a Group 14 element in the periodic table, a Group 15 element in the periodic table, a Group 16 element in the periodic table, a compound of a plurality of Group 14 elements in the period table, a compound of an element belonging to any of Groups 4 to 14 in the periodic table and a Group 16 element in the period table, a compound of a Group 2 element in the periodic table and a Group 16 element in the period table, a compound of a Group 13 element in the period table and a Group 15 element in the period table, a compound of a Group 13 element in the period table and a Group 17 element in the period table, a compound of a Group 14 element in the period table and a Group 15 element in the period table, a compound of a Group 11 element in the period table and a Group 17 element in the period table, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; triiron tetraoxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used. For example, an alloyed quantum dot of cadmium, selenium, and sulfur is a means effective in obtaining blue light because the emission wavelength can be changed by changing the content ratio of elements.

As the quantum dot, any of a core-type quantum dot, a core-shell quantum dot, a core-multishell quantum dot, and the like can be used. Note that when a core is covered with a shell formed of another inorganic material having a wider band gap, the influence of defects and dangling bonds existing at the surface of a nanocrystal can be reduced. Since such a structure can significantly improve the quantum efficiency of light emission, it is preferable to use a core-shell or core-multishell quantum dot. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxylethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolones; animoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, emission wavelengths of the quantum dots can be adjusted over a wavelength region of a spectrum of an ultraviolet region, a visible light region, and an infrared region by changing the size of quantum dots. The range of size (diameter) of quantum dots which is usually used is 0.5 nm to 20 nm, preferably 1 nm to 10 nm. The emission spectra are narrowed as the size distribution of the quantum dots gets smaller, and thus light can be obtained with high color purity. The shape of the quantum dots is not particularly limited and may be spherical shape, a rod shape, a circular shape, or the like. Quantum rods which are rod-like shape quantum dots emit directional light polarized in the c-axis direction; thus, quantum rods can be used as a light-emitting material to obtain a light-emitting element with higher external quantum efficiency.

In most EL elements, to improve luminous efficiency, light-emitting materials are dispersed in host materials and the host materials need to be substances each having a singlet excitation energy or a triplet excitation energy higher than or equal to that of the light-emitting material. In the case of using a blue phosphorescent material, it is particularly difficult to develop a host material which has a triplet excitation energy higher than or equal to that of the blue phosphorescent material and which is excellent in terms of a lifetime. On the other hand, even when a light-emitting layer is composed of quantum dots and made without a host material, the quantum dots enable luminous efficiency to be ensured; thus, a light-emitting element which is favorable in terms of a lifetime can be obtained. In the case where the light-emitting layer is composed of quantum dots, the quantum dots preferably have core-shell structures (including core-multishell structures).

[Alignment Film]

For the alignment films 618a and 618b, a material containing polyimide or the like can be used. For example, a material containing polyimide or the like may be subjected to a rubbing process or an optical alignment process to have alignment in a predetermined direction.

[Light-Blocking Film]

The light-blocking films 602 and 662 function as a black matrix. For the light-blocking films 602 and 662, a material that prevents light transmission is used. Examples of the material that prevents light transmission include a metal material and an organic resin material containing a black pigment.

[Color Film]

The color film 604 functions as a color filter. For the color film 604, a material transmitting light of a predetermined color (e.g., a material transmitting light of blue, green, red, yellow, or white) is used.

[Structure Body]

The structure bodies 610a and 610b have a function of providing a certain space between components between which the structure bodies 610a and 610b are interposed. For each of the structure bodies 610a and 610b, an organic material, an inorganic material, or a composite material of an organic material and an inorganic material can be used. For the inorganic material and the organic material, the materials for the insulating films 404, 406, 408, 410a, 410b, 410c, 412, 413, 416, 418, and 606 can be used.

[Functional Film]

As the functional film 626, a polarizing plate, a retardation plate, a diffusing film, an anti-reflective film, a condensing film, or the like can be used. As the functional film 626, an antistatic film preventing the attachment of a foreign substance, a water repellent film suppressing the attachment of stain, a hard coat film suppressing generation of a scratch in use, or the like can be used.

[Sealing Material]

For the sealing material 454, an inorganic material, an organic material, a composite material of an inorganic material and an organic material, or the like can be used. Examples of the organic material include a thermally fusible resin and a curable resin. As the sealing material 454, an adhesive including a resin material (e.g., a reactive curable adhesive, a photocurable adhesive, a thermosetting adhesive, or an anaerobic adhesive) may be used. Examples of such resin materials include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin.

[Sealant]

For the sealant 622, the materials for the sealing material 454 can be used. For the sealant 622, a material such as glass frit may be used in addition to the above materials. As a material used for the sealant 622, a material which is impermeable to moisture or oxygen is preferably used.

[Electrode]

For the electrode 664, 665, and 667, the materials for the conductive film 402, 403a, 403b, 403c, 405a, 405b, 405c, 405d, 407a, 407b, 407c, 407d, 407e, 411a, 411b, 411c, 414a, 414b, 414c, 414d, 414e, 414f, 414g, 414h, 417, 420, 608 described above can be used. Conductive nanowires may be used for the electrode 664, 665, and 667. The average diameter of the nanowire is greater than or equal to 1 nm and less than or equal to 100 nm, preferably greater than or equal to 5 nm and less than or equal to 50 nm, more preferably greater than or equal to 5 nm and less than or equal to 25 nm. As the nanowire, a carbon nanotube or a metal nanowire such as an Ag nanowire, a Cu nanowire, and an Al nanowire can be used. For example, in the case where a Ag nanowire is used for any one of or all of the electrodes 664, 665, and 667, the transmittance of visible light can be greater than or equal to 89% and the sheet resistance can be greater than or equal to 40 Ω/square and less than or equal to 100 Ω/square.

As described above, the display device of one embodiment of the present invention includes two display elements. Furthermore, the display device includes two transistors for driving the two display elements. One display element functions as a reflective liquid crystal element and the other display element functions as a transmissive EL element; thus, a novel display device that is highly convenient or reliable can be provided. With the transmissive EL elements in adjacent pixels arranged in different positions, the manufacturing yield in the case where the EL elements are separately formed can be increased and a display device with high productivity can be provided.

The structure described in this embodiment can be used in appropriate combination with any of the structures described in the other embodiments.

Embodiment 2

In this embodiment, a display element having a function of emitting light is described in detail.

<2-1. Structure Example 1 of Display Element>

Figure 26:
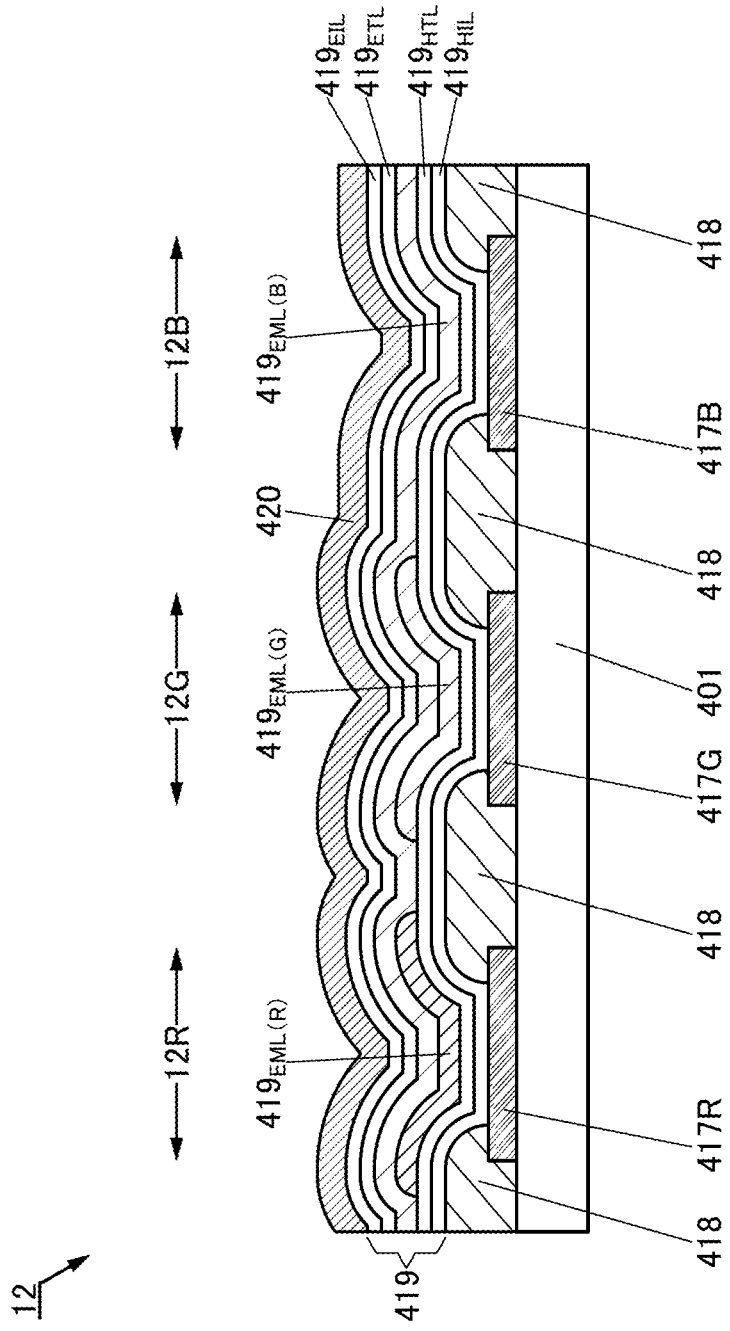
FIG. 26 is a cross-sectional view illustrating a display element.

FIG. 26 is a cross-sectional view illustrating details of the display element 12 described in Embodiment 1.

The display element 12 illustrated in FIG. 26 includes a light-emitting element 12R, a light-emitting element 12G, and a light-emitting element 12B.

The light-emitting element 12R includes a conductive film 417R, the EL layer 419 over the conductive film 417R, and the conductive film 420 over the EL layer 419. The light-emitting element 12G includes a conductive film 417G, the EL layer 419 over the conductive film 417G, and the conductive film 420 over the EL layer 419. The light-emitting element 12B includes a conductive film 417B, the EL layer 419 over the conductive film 417B, and the conductive film 420 over the EL layer 419. The conductive films for the light-emitting elements (the conductive films 417R, 417G, and 417B) are separated by the insulating films 418.

The light-emitting element 12R includes the conductive film 417R over the substrate 401, a hole-injection layer $419_{HIL}$ over the conductive film 417R, the hole-transport layer $419_{HTL}$ over the hole-injection layer $419_{HIL}$, a light-emitting layer $419_{EML(R)}$ over the hole-transport layer $419_{HTL}$, a light-emitting layer $419_{EML(B)}$ over the light-emitting layer $419_{EML(R)}$, an electron-transport layer $419_{ETL}$ over the light-emitting layer $419_{EML(B)}$, and an electron-injection layer $419_{EIL}$ over the electron-transport layer $419_{ETL}$.

The light-emitting element 12G includes the conductive film 417G over the substrate 401, the hole-injection layer $419_{HIL}$ over the conductive film 417G, the hole-transport layer $419_{HTL}$ over the hole-injection layer $419_{HIL}$, a light-emitting layer $419_{EML(G)}$ over the hole-transport layer $419_{HTL}$, the light-emitting layer $419_{EML(B)}$ over the light-emitting layer $419_{EML(G)}$, the electron-transport layer $419_{ETL}$ over the light-emitting layer $419_{EML(B)}$, and the electron-injection layer $419_{EIL}$ over the electron-transport layer $419_{ETL}$.

The light-emitting element 12B includes the conductive film 417B over the substrate 401, the hole-injection layer $419_{HIL}$ over the conductive film 417B, the hole-transport layer $419_{HTL}$ over the hole-injection layer $419_{HIL}$, the light-emitting layer $419_{EML(B)}$ over the hole-transport layer $419_{HTL}$, the electron-transport layer $419_{ETL}$ over the light-emitting layer $419_{EML(B)}$, and the electron-injection layer $419_{EIL}$ over the electron-transport layer $419_{ETL}$.

In the display element 12 illustrated in FIG. 26, the hole-injection layer $419_{HIL}$, the hole-transport layer $419_{HTL}$, the light-emitting layer $419_{EML(B)}$, the electron-transport layer $419_{ETL}$, and the electron-injection layer $419_{EIL}$ are used in common by the light-emitting element 12R, the light-emitting element 12G, and the light-emitting element 12B.

With such a structure, the manufacturing yield of the display element 12 can be increased. Specifically, a separate formation process (i.e., a separate coloring process) of the light-emitting elements in the display element 12 can be two steps, coloring for the light-emitting layer $419_{EML(R)}$ and coloring for the light-emitting layer $419_{EML(G)}$.

Note that the light-emitting layer $419_{EML(B)}$ does not contribute to light emission in the light-emitting element 12R and the light-emitting element 12G. For example, for the light-emitting layer $419_{EML(B)}$, a material with a high electron-transport property and a low hole-transport property or a material whose highest occupied molecular orbital (HOMO) level is lower than the HOMO level of materials used for the light-emitting layer $419_{EML(R)}$ and the light-emitting layer $419_{EML(G)}$ is used. That is, in the light-emitting element 12R and the light-emitting element 12G, the light-emitting layer $419_{EML(B)}$ functions as an electron-transport layer.

For example, in the case where the light-emitting layer $419_{EML(B)}$ includes a host material and a guest material (a light-emitting material), it is preferable that the host material have an electron-transport property and that the guest material have a hole-trap property. With such a structure, carriers can be efficiently recombined in the light-emitting layer $419_{EML(R)}$ and the light-emitting layer $419_{EML(G)}$.

In the case where each of the light-emitting layer $419_{EML(R)}$ and the light-emitting layer $419_{EML(G)}$ includes a host material and a guest material (a light-emitting material), it is preferable that the host material have a hole-transport property and an electron-transport property. With such a structure, each of the light-emitting layer $419_{EML(R)}$ and the light-emitting layer $419_{EML(G)}$ has a bipolar property.

Each of the light-emitting layer $419_{EML(R)}$ and the light-emitting layer $419_{EML(G)}$ includes a phosphorescent material as a guest material. The light-emitting layer $419_{EML(B)}$ includes a fluorescent material as a guest material. With such a structure, a display element with high emission efficiency and high reliability can be provided. For example, a phosphorescent material emitting light in a red wavelength range can be used in the light-emitting layer $419_{EML(R)}$, a phosphorescent material emitting light in a green wavelength range can be used in the light-emitting layer $419_{EML(G)}$, and a fluorescent material emitting light in a blue wavelength range can be used in the light-emitting layer $419_{EML(B)}$. Note that materials that can be used in the light-emitting layer $419_{EML(R)}$, the light-emitting layer $419_{EML(G)}$, and the light-emitting layer $419_{EML(B)}$ are not limited to the above. For example, a phosphorescent material may be used in the light-emitting layer $419_{EML(B)}$.

With the above-described structure, the number of steps of the separate coloring process in manufacturing the light-emitting elements is small; thus, a display element with high productivity can be provided. The light-emitting elements of the display element have low power consumption because of their high emission efficiency. Moreover, the light-emitting elements have high reliability. Therefore, a novel display element with high productivity and low power consumption can be provided.

Next, components in the display element 12 illustrated in FIG. 26 are described below.

[Conductive Film]

For the conductive films 417R, 417G, 417B, and 420, the materials for the conductive films 402, 403a, 403b, 403c, 405a, 405b, 405c, 405d, 407a, 407b, 407c, 407d, 407e, 411a, 411b, 411c, 414a, 414b, 414c, 414d, 414e, 414f, 414g, 414h, 417, 420, 608, and 682 described in Embodiment 1 can be used. In particular, ITO or ITSO is preferably used for the conductive film 417R, the conductive film 417G, and the conductive film 417B. A metal film with high reflectance containing Al or Ag is preferably used for the conductive film 420.

[Insulating Film]

For the insulating film 418, the materials for the insulating films 404, 406, 408, 410a, 410b, 410c, 412, 413, 416, 418, 606, 663, 666, 668, and 681 described in Embodiment 1 can be used.

[Light-Emitting Layer]

Light emitted from the light-emitting layer $419_{EML(R)}$ has a peak in a red wavelength range. Light emitted from the light-emitting layer $419_{EML(G)}$ has a peak in a green wavelength range. Light emitted from the light-emitting layer $419_{EML(B)}$ has a peak in a blue wavelength range. For example, it is preferable that phosphorescent materials be used for the light-emitting layer $419_{EML(R)}$ and the light-emitting layer $419_{EML(G)}$, and a fluorescent material be used for the light-emitting layer $419_{EML(B)}$. Each of the light-emitting layer $419_{EML(R)}$ and the light-emitting layer $419_{EML(G)}$ includes either an electron-transport material or a hole-transport material or both, in addition to the phosphorescent material. The light-emitting layer $419_{EML(B)}$ includes either an electron-transport material or a hole-transport material or both, in addition to the fluorescent material.

[Phosphorescent Material]

As the phosphorescent material, an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be used. As the metal complex, a platinum complex having a porphyrin ligand or the like can be used.

Examples of the substance that has an emission peak in the blue or green wavelength range include organometallic iridium complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)₃), tris(5-methyl-3,4-diphenyl-4H-1,2,4-triazolato)iridium(III) (abbreviation: Ir(Mptz)₃), tris[4-(3-biphenyl)-5-isopropyl-3-phenyl-4H-1,2,4-triazolato]iridium(III) (abbreviation: Ir(iPrptz-3b)₃), and tris[3-(5-biphenyl)-5-isopropyl-4-phenyl-4H-1,2,4-triazolato]iridium(III) (abbreviation: Ir(iPr5btz)₃); organometallic iridium complexes having a 1H-triazole skeleton, such as tris[3-methyl-1-(2-methylphenyl)-5-phenyl-1H-1,2,4-triazolato]iridium(III) (abbreviation: Ir(Mptz1-mp)₃) and tris(1-methyl-5-phenyl-3-propyl-1H-1,2,4-triazolato)iridium(III) (abbreviation: Ir(Prptz1-Me)₃); organometallic iridium complexes having an imidazole skeleton, such as fac-tris[1-(2,6-diisopropylphenyl)-2-phenyl-1H-imidazole]iridium(III) (abbreviation: Ir(iPrpmi)₃) and tris[3-(2,6-dimethylphenyl)-7-methylimidazo[1,2-f]phenanthridinato]iridium(III) (abbreviation: Ir(dmpimpt-Me)₃); and organometallic iridium complexes in which a phenylpyridine derivative having an electron-withdrawing group is a ligand, such as bis[2-(4',6'-difluorophenyl)pyridinato-N,C²']iridium(III) tetrakis(1-pyrazolyl)borate (abbreviation: FIr6), bis[2-(4',6'-difluorophenyl)pyridinato-N,C²']iridium(III) picolinate (abbreviation: FIrpic), bis{2-[3',5'-bis(trifluoromethyl)phenyl]pyridinato-N,C²'}iridium(III)picolinate (abbreviation: Ir(CF₃ppy)₂(pic)), and bis[2-(4',6'-difluorophenyl)pyridinato-N,C²']iridium(III) acetylacetonate (abbreviation: FIr(acac)).

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)₃), tris(4-t-butyl-6-phenylpyrimidinato)iridium(III) (abbreviation: Ir(tBuppm)₃), (acetylacetonato)bis(6-methyl-4-phenylpyrimidinato)iridium(III) (abbreviation: Ir(mppm)₂(acac)), (acetylacetonato)bis(6-tert-butyl-4-phenylpyrimidinato)iridium(III) (abbreviation: Ir(tBuppm)₂(acac)), (acetylacetonato)bis[4-(2-norbornyl)-6-phenylpyrimidinato]iridium(III) (abbreviation: Ir(nbppm)₂(acac)), (acetylacetonato)bis[5-methyl-6-(2-methylphenyl)-4-phenylpyrimidinato]iridium(III) (abbreviation: Ir(mpmppm)₂(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)₂(acac)), (acetylacetonato)bis(4,6-diphenylpyrimidinato)iridium(III) (abbreviation: Ir(dppm)₂(acac)); organometallic iridium complexes having a pyrazine skeleton, such as (acetylacetonato)bis(3,5-dimethyl-2-phenylpyrazinato)iridium(III) (abbreviation: Ir(mppr-Me)₂(acac)) and (acetylacetonato)bis(5-isopropyl-3-methyl-2-phenylpyrazinato)iridium(III) (abbreviation: Ir(mppr-iPr)₂(acac)); organometallic iridium complexes having a pyridine skeleton, such as tris(2-phenylpyridinato-N,C²')iridium(III) (abbreviation: Ir(ppy)₃), bis(2-phenylpyridinato-N,C²')iridium(III) acetylacetonate (abbreviation: Ir(ppy)₂(acac)), bis(benzo[h]quinolinato)iridium(III) acetylacetonate (abbreviation: Ir(bzq)₂(acac)), tris(benzo[h]quinolinato)iridium(III) (abbreviation: Ir(bzq)₃), tris(2-phenylquinolinato-N,C²')iridium(III) (abbreviation: Ir(pq)₃), and bis(2-phenylquinolinato-N,C²')iridium(III) acetylacetonate (abbreviation: Ir(pq)₂(acac)); organometallic iridium complexes such as bis(2,4-diphenyl-1,3-oxazolato-N,C²')iridium(III)acetylacetonate (abbreviation: Ir(dpo)₂(acac)), bis{2-[4'-(perfluorophenyl)phenyl]pyridinato-N,C²'}iridium(III)acetylacetonate (abbreviation: Ir(p-PF-ph)₂(acac)), and bis(2-phenylbenzothiazolato-N,C²')iridium(III)acetylacetonate (abbreviation: Ir(bt)₂(acac)); and a rare earth metal complex such as tris(acetylacetonato)(monophenanthroline)terbium(III) (abbreviation: Tb(acac)₃(Phen)). Among the materials given above, the organometallic iridium complexes having a pyrimidine skeleton have distinctively high reliability and emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)₂(dibm)), bis[4,6-bis(3-methylphenyl)pyrimidinato](dipivaloylmethanato)iridium(III) (abbreviation: Ir(5mdppm)₂(dpm)), and bis[4,6-di(naphthalen-1-yl)pyrimidinato](dipivaloylmethanato)iridium(III) (abbreviation: Ir(dlnpm)₂(dpm)); organometallic iridium complexes having a pyrazine skeleton, such as (acetylacetonato)bis(2,3,5-triphenylpyrazinato)iridium(III) (abbreviation: Ir(tppr)₂(acac)), bis(2,3,5-triphenylpyrazinato)(dipivaloylmethanato)iridium(III) (abbreviation: Ir(tppr)₂(dpm)), and (acetylacetonato)bis[2,3-bis(4-fluorophenyl)quinoxalinato]iridium(III) (abbreviation: Ir(Fdpq)₂(acac)); organometallic iridium complexes having a pyridine skeleton, such as tris(1-phenylisoquinolinato-N,C²')iridium(III) (abbreviation: Ir(piq)₃) and bis(1-phenylisoquinolinato-N,C²')iridium(III)acetylacetonate (abbreviation: Ir(piq)₂(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)₃(Phen)) and tris[1-(2-thenoyl)-3,3,3-trifluoroacetonato](monophenanthroline)europium(III) (abbreviation: Eu(TTA)₃(Phen)). Among the materials given above, the organometallic iridium complexes having a pyrimidine skeleton have distinctively high reliability and emission efficiency and are thus particularly preferable. Further, the organometallic iridium complexes having a pyrazine skeleton can provide red light emission with favorable chromaticity.

As the material included in the light-emitting layer, any material can be used as long as the material can convert the triplet excitation energy into light emission. As an example of the material that can convert triplet excitation energy into light emission, a thermally activated delayed fluorescence material is given in addition to the phosphorescent material. Therefore, the term "phosphorescent material" in the description can be replaced with the term "thermally activated delayed fluorescence material". The thermally activated delayed fluorescence material is a material having a small energy difference between the singlet excitation energy level and the triplet excitation energy level and has a function of converting the triplet excitation energy into the singlet excitation energy by reverse intersystem crossing. Thus, the thermally activated delayed fluorescence material can up-convert a triplet excited state into a singlet excited state (i.e., reverse intersystem crossing is possible) using a little thermal energy and efficiently exhibit light emission (fluorescence) from the singlet excited state. Conditions for efficiently obtaining thermally activated delayed fluorescence are as follows: the energy difference between the singlet excitation energy level and the triplet excitation energy level is preferably greater than 0 eV and less than or equal to 0.2 eV, more preferably greater than 0 eV and less than or equal to 0.1 eV.

As examples of the thermally activated delayed fluorescence material, a fullerene, a derivative thereof, an acridine derivative such as proflavine, and eosin are given. Furthermore, a metal-containing porphyrin, such as a porphyrin containing magnesium (Mg), zinc (Zn), cadmium (Cd), tin (Sn), platinum (Pt), indium (In), or palladium (Pd), is given.

As the thermally activated delayed fluorescence material composed of one kind of material, a heterocyclic compound including a π-electron rich heteroaromatic ring and a π-electron deficient heteroaromatic ring can also be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. The heterocyclic compound is preferably used because of having the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the difference between the level of the singlet excited state and the level of the triplet excited state becomes small.

[Fluorescent Material]

The fluorescent material is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like, and for example, any of the following materials can be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-bis(4-tert-butylphenyl)pyrene-1,6-diamine (abbreviation: 1,6tBu-FLPAPrn), N,N'-diphenyl-N,N'-bis[4-(9-phenyl-9H-fluoren-9-yl)phenyl]-3,8-dicyclohexylpyrene-1,6-diamine (abbreviation: ch-1,6FLPAPrn), N,N'-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis [N,N',N'-triphenyl-1,4-phen ylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl] ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl) tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij] quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis {2-[4-(dimethylamino)phenyl] ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene.

[Host Material]

In the light-emitting layer, the light-emitting material is preferably dispersed in the host material. In this case, the weight ratio of the host material to the light-emitting material is larger. A variety of materials can be used as the host material. For example, a material having a function of transporting a hole (a hole-transport material) and a material having a function of transporting an electron (an electron-transport material) can be used. Furthermore, a bipolar material having a hole-transport property and an electron-transport property can be used.

As the host material, a material having a property of transporting more electrons than holes can be used, and a material having an electron mobility of $1 \times 10^{-6}$ cm$^2$/Vs or higher is preferable. A compound including a π-electron deficient heteroaromatic ring skeleton such as a nitrogen-containing heteroaromatic compound, or a zinc- or aluminum-based metal complex can be used, for example, as the material which easily accepts electrons (the material having an electron-transport property). Specific examples include a metal complex having a quinoline ligand, a benzoquinoline ligand, an oxazole ligand, and a thiazole ligand. In addition, a compound such as an oxadiazole derivative, a triazole derivative, a benzimidazole derivative, a quinoxaline derivative, a dibenzoquinoxaline derivative, a phenanthroline derivative, a pyridine derivative, a bipyridine derivative, a pyrimidine derivative, and a triazine derivative can be given.

Specific examples include metal complexes having a quinoline or benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h] quinolinato)beryllium(II) (abbreviation: BeBq$_2$), bis(2-methyl-8-quinolinolato)(4-phenylphenolato) aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolate]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 2,2',2"-(1,3,5-benzenetriyl) tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), and bathocuproine (abbreviation: BCP); heterocyclic compounds having a diazine skeleton such as 2-[3-(dibenzothiophen-4-yl)phenyl]dibenzo[f,h]quinoxaline (abbreviation: 2mDBTPDB q-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl) biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 2-[3-(3,9'-bi-9H-carbazol-9-yl)phenyl]dibenzo[f,h]quinoxaline (abbreviation: 2mCzPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton such as 3,5-bis[3-(9H-carbazol-9-yl)phenyl] pyridine (abbreviation: 35DCzPPy); and heteroaromatic compounds such as 4,4'-bis(5-methylbenzoxazol-2-yl)stilbene (abbreviation: BzOs). Among the heterocyclic compounds, the heterocyclic compounds having a triazine skeleton, a diazine (pyrimidine, pyrazine, pyridazine) skeleton, or a pyridine skeleton are highly reliable and stable and are thus preferably used. In addition, the heterocyclic compounds having the skeletons have a high electron-transport property to contribute to a reduction in driving voltage. Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1 \times 10^{-6}$ cm$^2$/Vs or higher. Note that other substances may also be used as long as their electron-transport properties are higher than their hole-transport properties.

As the host material, hole-transport materials given below can be used.

A material having a property of transporting more holes than electrons can be used as the hole-transport material, and a material having a hole mobility of $1 \times 10^{-6}$ cm$^2$Ns or higher is preferable. Specifically, an aromatic amine, a carbazole derivative, an aromatic hydrocarbon, a stilbene derivative, or the like can be used. Furthermore, the hole-transport material may be a high molecular compound.

Specific examples of the material having a high hole-transport property include N,N'-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl) amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenyl amino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation:

t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples are pentacene and coronene. The aromatic hydrocarbon having a hole mobility of $1 \times 10^{-6}$ cm$^2$/Vs or higher and having 14 to 42 carbon atoms is particularly preferable.

The aromatic hydrocarbon may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are high molecular compounds such as poly(N-vinylcarbazole) (abbreviation: PVK), poly(-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: poly-TPD).

Examples of the material having a high hole-transport property are aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: 1'-TNATA), 4,4',4''-tris(N,N-diphenylamino) triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino] spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4''-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N, N-diphenylbenzene-1,3-diamine (abbreviation: PCA2B), N,N',N''-triphenyl-N,N',N→-tris(9-phenylcarbazol-3-yl) benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl] fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl) phenyl]-N,N-diphenyl-9,9-dimethylfluorene-2,7-diamine (abbreviation: YGA2F). Other examples are amine compounds, carbazole compounds, thiophene compounds, furan compounds, fluorene compounds; triphenylene compounds; phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), 2,8-di (9H-carbazol-9-yl)-dibenzothiophene (abbreviation: Cz2DBT), 4-{3-[3-(9-phenyl-9H-fluoren-9-yl)phenyl] phenyl}dibenzofuran (abbreviation: mmDBFFLBi-II), 4,4', 4''-(benzene-1,3,5-triyl)tri(dibenzofuran) (abbreviation: DBF3P-II), 1,3,5-tri(dibenzothiophen-4-yl)-benzene (abbreviated as DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylene-2-yl)phenyl]dibenzothiophene (abbreviation: mDBTPTp-II). Among the above compounds, compounds including a pyrrole skeleton, a furan skeleton, a thiophene skeleton, or an aromatic amine skeleton are preferred because of their high stability and reliability. In addition, the compounds having such skeletons have a high hole-transport property to contribute to a reduction in driving voltage.

It is preferable that the host material and the phosphorescent material be selected such that the emission peak of the host material overlaps with an absorption band, specifically an absorption band on the longest wavelength side, of a triplet metal to ligand charge transfer (MLCT) transition of the phosphorescent material. This makes it possible to provide a light-emitting element with drastically improved emission efficiency. Note that in the case where a thermally activated delayed fluorescent material is used instead of the phosphorescent material, it is preferable that the absorption band on the longest wavelength side be a singlet absorption band.

Note that the host material may be a mixture of a plurality of kinds of substances, and in the case of using a mixed host material, it is preferable to mix a material having an electron-transport property with a material having a hole-transport property. By mixing the material having an electron-transport property with the material having a hole-transport property, the carrier transport property of the light-emitting layer can be easily adjusted and a recombination region can be easily controlled. The content ratio (weight ratio) of the material having an electron-transport property to the material having a hole-transport property is preferably 1:9 to 9:1.

An exciplex may be formed by these mixed materials. It is preferable that the combination of the materials be selected so as to form an exciplex that exhibits light emission whose wavelength overlaps with a wavelength of a lowest-energy-side absorption band of the light-emitting material, in which case excitation energy is transferred smoothly from the exciplex to the light-emitting material, light emission can be obtained efficiently from the light-emitting material, and the driving voltage can be reduced.

In the light-emitting layer, a material other than the host material and the light-emitting material may be contained. Besides the above-mentioned materials, an inorganic compound or a high molecular compound (e.g., an oligomer, a dendrimer, and a polymer) may be used.

In the case of using quantum dots as the light-emitting material in the light-emitting layer, the thickness of the light-emitting layer is set to 3 nm to 100 nm, preferably 10 nm to 100 nm, and the light-emitting layer is made to contain 1 volume % to 100 volume % of the quantum dots. Note that it is preferable that the light-emitting layer be composed of the quantum dots. To form a light-emitting layer in which the quantum dots are dispersed as light-emitting materials in host materials, the quantum dots may be dispersed in the host materials, or the host materials and the quantum dots may be dissolved or dispersed in an appropriate liquid medium, and then a wet process (e.g., a spin coating method, a casting method, a die coating method, blade coating method, a roll coating method, an ink-jet method, a printing method, a spray coating method, a curtain coating method, or a Langmuir-Blodgett method) may be employed. For a light-emitting layer containing a phosphorescent substance, a vacuum evaporation method, as well as the wet process, can be suitably employed.

An example of the liquid medium used for the wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

[Hole-Injection Layer and Hole-Transport Layer]

The hole-injection layer $419_{HIL}$ injects holes to the light-emitting layer $419_{EML(R)}$, the light-emitting layer $419_{EML(G)}$, and the light-emitting layer $419_{EML(B)}$ through the hole-transport layer $419_{HTL}$ having a high hole-transport property, and contains a hole-transport material and an acceptor substance. When a hole-transport material and an acceptor substance are contained, electrons are extracted from the hole-transport material by the acceptor substance to generate holes, and the holes are injected into the light-emitting layer $419_{EML(R)}$, the light-emitting layer $419_{EML(G)}$, and the light-emitting layer $419_{EML(B)}$ through the hole-transport layer $419_{HTL}$. Note that the hole-transport layer $419_{HTL}$ is formed with a hole-transport material.

As the hole-transport materials used for the hole-injection layer $419_{HIL}$ and the hole-transport layer $419_{HTL}$, the above-described hole-transport materials that can be used for the light-emitting layer $419_{EML(R)}$, the light-emitting layer $419_{EML(G)}$, and the light-emitting layer $419_{EML(B)}$ can be used.

Examples of the acceptor substance that is used for the hole-injection layer $419_{HIL}$ include oxides of metals belonging to Groups 4 to 8 of the periodic table. Specifically, molybdenum oxide is particularly preferable.

The hole-injection layers $419_{HIL}$ in the light-emitting elements may be formed with different materials and may have different thicknesses depending on circumstances. The hole-transport layers $419_{HTL}$ in the light-emitting elements may be formed with different materials and may have different thicknesses depending on circumstances.

[Electron-Transport Layer]

For the electron-transport layer $419_{ETL}$, the above-described electron-transport materials for the light-emitting layer $419_{EML(R)}$, the light-emitting layer $419_{EML(G)}$, and the light-emitting layer $419_{EML(B)}$ can be used.

[Electron-Injection Layer]

The electron-injection layer $419_{EIL}$ is a layer containing a substance with a high electron-injection property. For the electron-injection layer $419_{EIL}$, an alkali metal, an alkaline earth metal, or a compound thereof, such as lithium fluoride (LiF), cesium fluoride (CsF), calcium fluoride ($CaF_2$), or lithium oxide ($LiO_x$), can be used. Alternatively, a rare earth metal compound such as erbium fluoride ($ErF_3$) can be used. Electride may also be used for the electron-injection layer $419_{EIL}$. Examples of the electride include a substance in which electrons are added at high concentration to calcium oxide-aluminum oxide.

Alternatively, the electron-injection layer $419_{EIL}$ may be formed using a composite material in which an organic compound and an electron donor (donor) are mixed. The composite material is superior in an electron-injection property and an electron-transport property, since electrons are generated in the organic compound by the electron donor. The organic compound here is preferably a material excellent in transporting the generated electrons; specifically, for example, the substances for forming the electron-transport layer $419_{ETL}$ (e.g., a metal complex or a heteroaromatic compound) can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. Furthermore, an alkali metal oxide or an alkaline earth metal oxide is preferable, and for example, lithium oxide, calcium oxide, barium oxide, and the like can be given. Alternatively, Lewis base such as magnesium oxide can also be used. An organic compound such as tetrathiafulvalene (abbreviation: TTF) can also be used.

The electron-injection layers $419_{EIL}$ in the light-emitting elements may be formed with different materials and may have different thicknesses depending on circumstances. The electron-transport layers $419_{ETL}$ in the light-emitting elements may be formed with different materials and may have different thicknesses depending on circumstances.

<2-2. Method for Manufacturing Display Element>

Next, a method for manufacturing the display element 12 of one embodiment of the present invention is described below with reference to FIGS. 27A to 27C and FIGS. 28A and 28B.

FIGS. 27A to 27C and FIGS. 28A and 28B are cross-sectional views illustrating the method for manufacturing the display element 12 of one embodiment of the present invention. The method for manufacturing the display element 12 described below includes first to fifth steps.

[First Step]

Figure 27A:
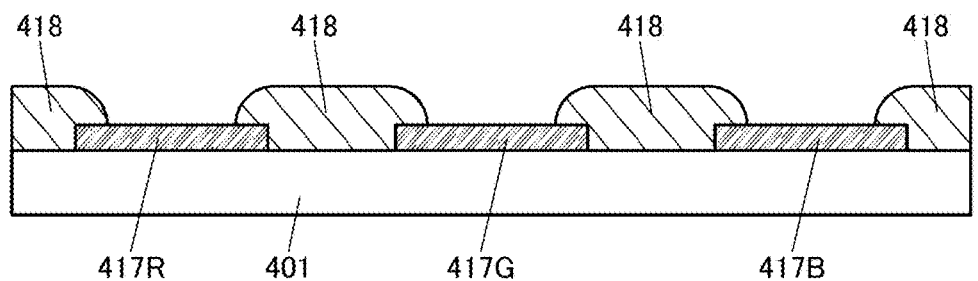
FIGS. 27A to 27C are cross-sectional views illustrating a manufacturing method of a display element.

In a first step, the conductive films (the conductive film 417R, the conductive film 417G, and the conductive film 417B) which function as lower electrodes of the light-emitting elements and the insulating films 418 that cover end portions of the conductive films of the light-emitting elements are formed (see FIG. 27A).

In the first step, there is no possibility of damaging a light-emitting layer containing an organic compound, and thus a variety of micromachining technologies can be employed. In this embodiment, a light-transmitting conductive film is formed over the substrate 401 by a sputtering method, the conductive film is patterned, and then the conductive film is processed into island shapes, whereby the conductive film 417R, the conductive film 417G, and the conductive film 417B are formed.

Next, the insulating films 418 are formed to cover the end portions of the conductive film 417R, the conductive film 417G, and the conductive film 417B. Note that the insulating films 418 have openings that overlap with the conductive films (the conductive film 417R, the conductive film 417G, and the conductive film 417B). The conductive films exposed in the openings function as the lower electrodes of the light-emitting elements.

In this embodiment, in the first step, ITO is used for the conductive films 417R, 417G, and 417B, and an acrylic resin is used for the insulating film 418.

Note that transistors or the like may be formed over the substrate 401 before the first step. The transistors may be electrically connected to the conductive films (the conductive film 417R, the conductive film 417G, and the conductive film 417B).

[Second Step]

Figure 27B:
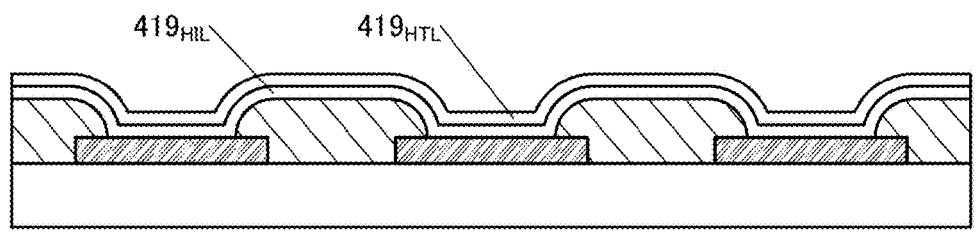

In the second step, the hole-injection layer $419_{HIL}$ and the hole-transport layer $419_{HTL}$ are formed over the conductive films (the conductive film 417R, the conductive film 417G, and the conductive film 417B) and the insulating films 418 (see FIG. 27B).

In the second step, the hole-injection layer $419_{HIL}$ and the hole-transport layer $419_{HTL}$ are formed by evaporation of an organic compound. Note that the hole-injection layer $419_{HIL}$ and the hole-transport layer $419_{HTL}$ can be used in common by the light-emitting elements, leading to a reduced manufacturing cost and improved productivity.

[Third Step]

Figure 27C:
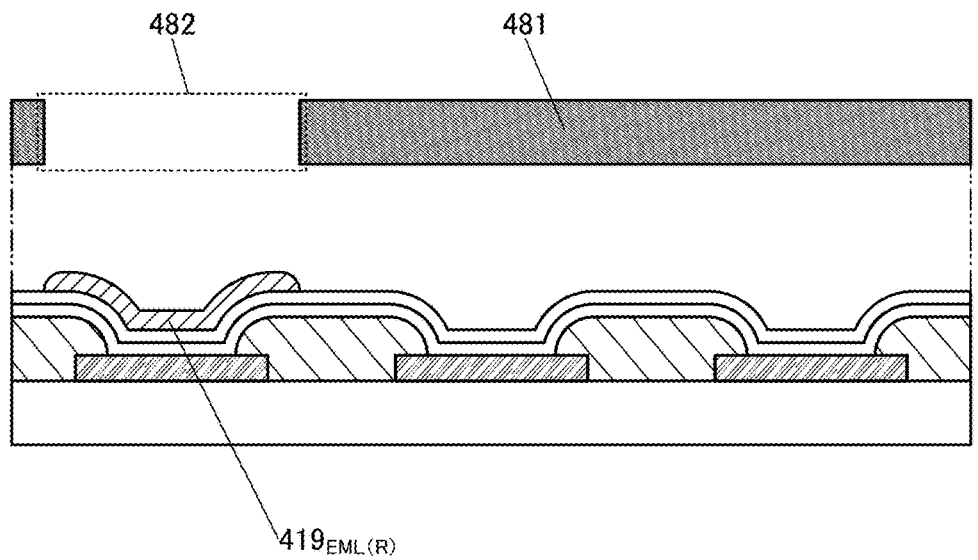

In the third step, the light-emitting layer $419_{EML(R)}$ is formed using a shadow mask 481 (see FIG. 27C).

Note that the shadow mask 481 is a shielding plate provided with an opening 482 and formed of foil of a metal or the like with a thickness greater than or equal to several tens of micrometers or a plate of a metal or the like with a thickness greater than or equal to several hundreds of micrometers.

In the third step, the substrate 401 is introduced into an evaporation apparatus, and the shadow mask 481 is provided on the evaporation source (not illustrated) side. Next, alignment for providing the opening 482 of the shadow mask 481 in a desired position is performed. Here, the opening 482 is disposed to overlap with the conductive film 417R, and an organic compound is deposited above the shadow mask 481, whereby the light-emitting layer $419_{EML(R)}$ is formed.

[Fourth Step]

Figure 28A:
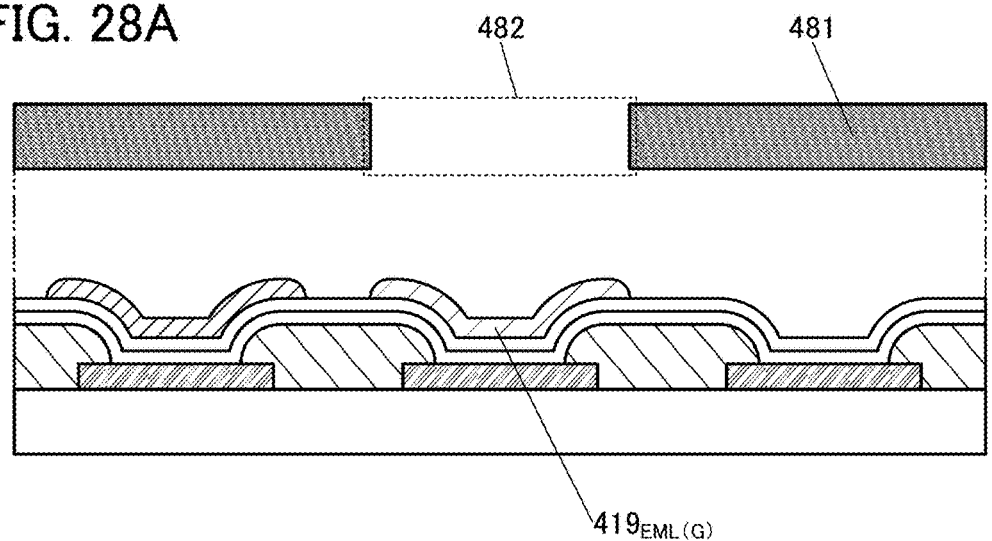
FIGS. 28A and 28B are cross-sectional views illustrating a manufacturing method of a display element.

In the fourth step, the light-emitting layer $419_{EML(G)}$ is formed over the hole-transport layer $419_{HTL}$ (see FIG. 28A).

In the fourth step, the substrate 401 is introduced into an evaporation apparatus, and the shadow mask 481 is provided on the evaporation source (not illustrated) side. Next, alignment for providing the opening 482 of the shadow mask 481 in a desired position is performed. Here, the opening 482 is disposed to overlap with the conductive film 417G, and an organic compound is deposited above the shadow mask 481, whereby the light-emitting layer $419_{EML(G)}$ is formed.

In one embodiment of the present invention, as described in Embodiment 1, a space between adjacent pixels is wide, and thus the margin for separate coloring is wide. Therefore, a display element with a high manufacturing yield can be provided.

[Fifth Step]

Figure 28B:
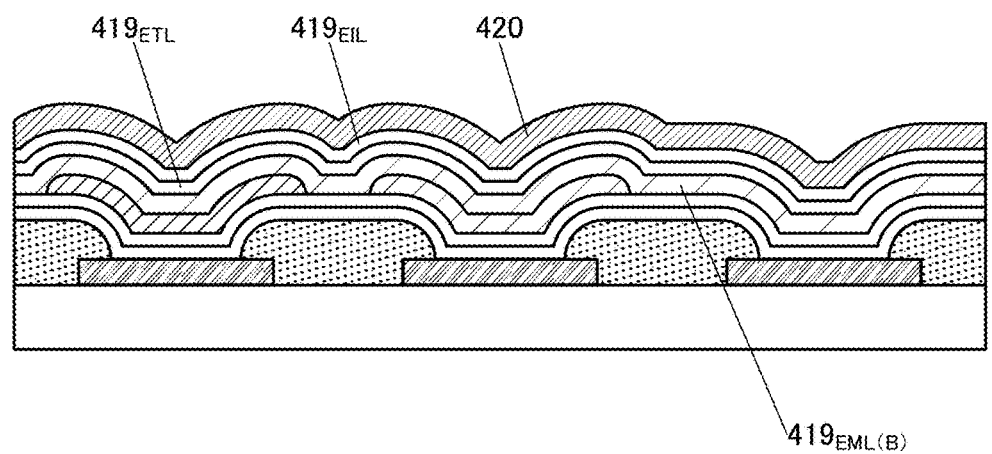

In the fifth step, the light-emitting layer $419_{EML(B)}$, the electron-transport layer $419_{ETL}$, the electron-injection layer $419_{EIL}$, and the conductive film 420 are formed over the hole-transport layer $419_{HTL}$, the light-emitting layer $419_{EML(R)}$, and the light-emitting layer $419_{EML(G)}$ (see FIG. 28B).

Note that the light-emitting layer $419_{EML(B)}$, the electron-transport layer $419_{ETL}$, the electron-injection layer $419_{EIL}$, and the conductive film 420 can be used in common by the light-emitting elements, leading to a reduced manufacturing cost and improved productivity.

Through the above steps, the display element 12 illustrated in FIG. 26 can be manufactured. Note that in this embodiment, a separate coloring process of the light-emitting elements can be two steps, coloring for the light-emitting layer $419_{EML(R)}$ and coloring for the light-emitting layer $419_{EML(G)}$. As a result, a method for manufacturing a display element with high productivity can be provided. Consequently, a method for manufacturing a novel display element in which a decrease in aperture ratio accompanied by fabrication of a high-definition element is suppressed can be provided. Alternatively, a novel display element that can be produced easily can be provided.

This embodiment can be combined as appropriate with any of the other embodiments.

Embodiment 3

In this embodiment, a transistor that can be used for the display device of one embodiment of the present invention is described in detail.

In this embodiment, a transistor with a staggered (top-gate) structure is described with reference to FIGS. 29A to 29C, FIGS. 30A to 30C, FIGS. 31A and 31B, FIGS. 32A and 32B, FIGS. 33A and 33B, FIGS. 34A and 34B, FIGS. 35A and 35B, and FIGS. 36A to 36C.

<3-1. Structure Example 1 of Transistor>

Figure 29A:
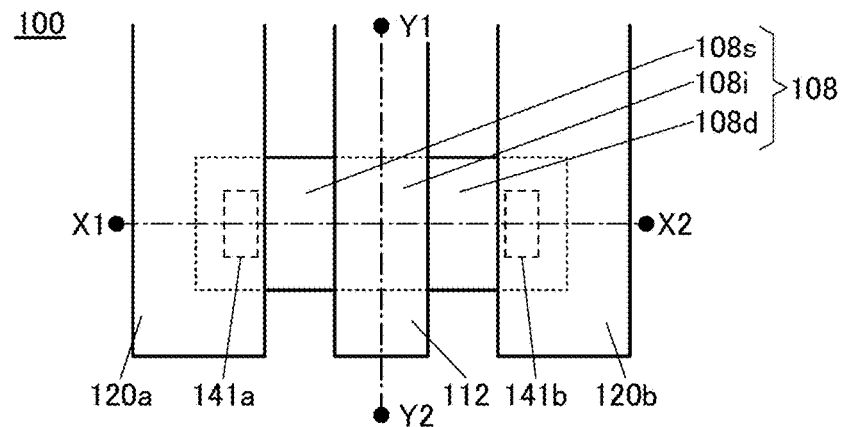
FIGS. 29A to 29C are a top view and cross-sectional views illustrating a semiconductor device.
Figure 29B:
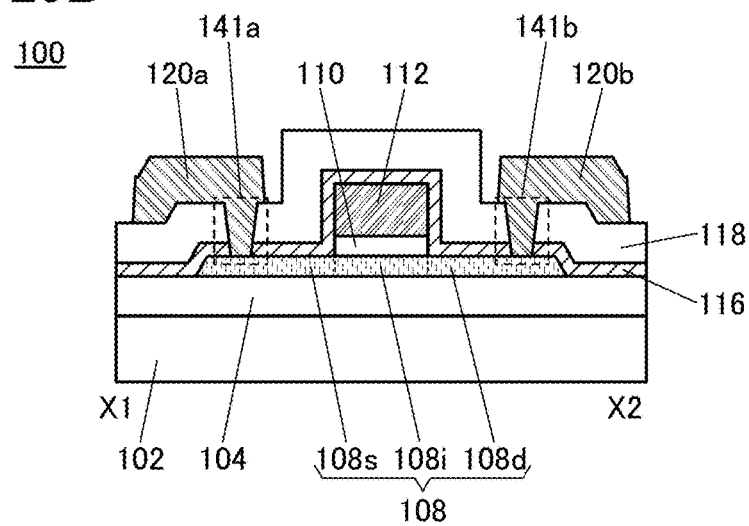
Figure 29C:
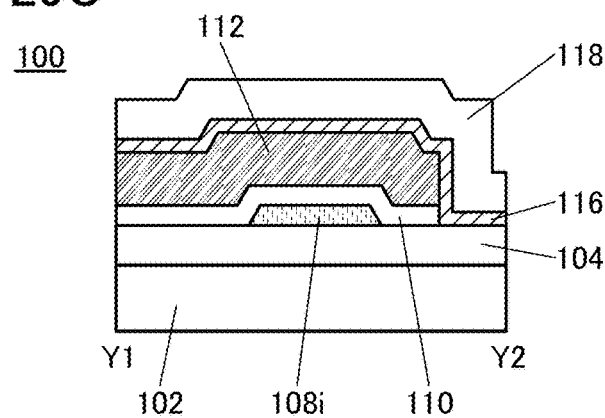

FIG. 29A is a top view of a transistor 100. FIG. 29B is a cross-sectional view taken along a dashed-dotted line X1-X2 in FIG. 29A. FIG. 29C is a cross-sectional view taken along a dashed-dotted line Y1-Y2 in FIG. 29A. For clarity, FIG. 29A does not illustrate some components such as an insulating film 110. As in FIG. 29A, some components are not illustrated in some cases in top views of transistors described below. Furthermore, the direction of the dashed-dotted line X1-X2 may be referred to as a channel length (L) direction, and the direction of the dashed-dotted line Y1-Y2 may be referred to as a channel width (W) direction.

The transistor 100 illustrated in FIGS. 29A to 29C includes an insulating film 104 over a substrate 102; an oxide semiconductor film 108 over the insulating film 104; the insulating film 110 over the oxide semiconductor film 108; a conductive film 112 over the insulating film 110; and an insulating film 116 over the insulating film 104, the oxide semiconductor film 108, and the conductive film 112. Note that the oxide semiconductor film 108 includes a channel region 108$i$ overlapping with the conductive film 112, a source region 108$s$ in contact with the insulating film 116, and a drain region 108$d$ in contact with the insulating film 116.

Furthermore, the insulating film 116 contains nitrogen or hydrogen. The insulating film 116 is in contact with the source region 108$s$ and the drain region 108$d$, so that nitrogen or hydrogen that is contained in the insulating film 116 is added to the source region 108$s$ and the drain region 108$d$. The source region 108$s$ and the drain region 108$d$ each have a high carrier density when nitrogen or hydrogen is added thereto.

The transistor 100 may further include an insulating film 118 over the insulating film 116, a conductive film 120$a$ electrically connected to the source region 108s through an opening 141a provided in the insulating films 116 and 118, and a conductive film 120b electrically connected to the drain region 108d through an opening 141b provided in the insulating films 116 and 118.

In this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. The conductive film 112 functions as a gate electrode, the conductive film 120a functions as a source electrode, and the conductive film 120b functions as a drain electrode.

The insulating film 110 functions as a gate insulating film. The insulating film 110 includes an excess oxygen region. Since the insulating film 110 includes the excess oxygen region, excess oxygen can be supplied to the channel region 108i included in the oxide semiconductor film 108. As a result, oxygen vacancies that might be formed in the channel region 108i can be filled with excess oxygen, which can provide a highly reliable semiconductor device.

To supply excess oxygen to the oxide semiconductor film 108, excess oxygen may be supplied to the insulating film 104 that is formed under the oxide semiconductor film 108. However, in that case, excess oxygen contained in the insulating film 104 might also be supplied to the source region 108s and the drain region 108d included in the oxide semiconductor film 108. When excess oxygen is supplied to the source region 108s and the drain region 108d, the resistance of the source region 108s and the drain region 108d might be increased.

In contrast, in the structure in which the insulating film 110 formed over the oxide semiconductor film 108 contains excess oxygen, excess oxygen can be selectively supplied only to the channel region 108i. Alternatively, the carrier density of the source and drain regions 108s and 108d can be selectively increased after excess oxygen is supplied to the channel region 108i and the source and drain regions 108s and 108d, in which case an increase in the resistance of the source and drain regions 108s and 108d can be prevented.

Furthermore, each of the source region 108s and the drain region 108d included in the oxide semiconductor film 108 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas element are helium, neon, argon, krypton, and xenon. The element that forms an oxygen vacancy is diffused from the insulating film 116 to the source region 108s and the drain region 108d in the case where the insulating film 116 contains one or more such elements. In addition or alternatively, the element that forms an oxygen vacancy is added to the source region 108s and the drain region 108d by impurity addition treatment.

An impurity element added to the oxide semiconductor film cuts a bond between a metal element and oxygen in the oxide semiconductor film, so that an oxygen vacancy is formed. Alternatively, when an impurity element is added to the oxide semiconductor film, oxygen bonded to a metal element in the oxide semiconductor film is bonded to the impurity element and detached from the metal element, so that an oxygen vacancy is formed. As a result, the oxide semiconductor film has a higher carrier density, and thus, the conductivity thereof becomes higher.

Next, details of the components of the semiconductor device in FIGS. 29A to 29C are described.

[Substrate]

As the substrate 102, any of a variety of substrates can be used without particular limitation. The substrate 102 can be formed using a material similar to that of the substrates 401, 452, 652, and 670 described in Embodiment 1.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure of an oxide insulating film and/or a nitride insulating film. To improve the properties of the interface with the oxide semiconductor film 108, at least a region of the insulating film 104 which is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the channel region 108i of the oxide semiconductor film 108 can be reduced.

For example, the insulating film 104 can be formed to have a single-layer structure or stacked-layer structure of silicon oxide, silicon oxynitride, silicon nitride oxide, silicon nitride, aluminum oxide, hafnium oxide, gallium oxide, a Ga—Zn oxide, or the like. In this embodiment, the insulating film 104 has a stacked-layer structure of a silicon nitride film and a silicon oxynitride film. With the insulating film 104 having such a stack-layer structure including a silicon nitride film as a lower layer and a silicon oxynitride film as an upper layer, oxygen can be efficiently introduced into the oxide semiconductor film 108.

[Oxide Semiconductor Film]

The oxide semiconductor film 108 can be formed using a material similar to that of the oxide semiconductor films 409a, 409b, and 409c described in Embodiment 1.

[Second Insulating Film]

The insulating film 110 functions as a gate insulating film of the transistor 100. In addition, the insulating film 110 has a function of supplying oxygen to the oxide semiconductor film 108, particularly to the channel region 108i. The insulating film 110 can be formed to have a single-layer structure or a stacked-layer structure of an oxide insulating film or a nitride insulating film, for example. To improve the interface properties with the oxide semiconductor film 108, a region which is in the insulating film 110 and in contact with the oxide semiconductor film 108 is preferably formed using at least an oxide insulating film. For example, silicon oxide, silicon oxynitride, silicon nitride oxide, or silicon nitride may be used for the insulating film 110.

The thickness of the insulating film 110 can be greater than or equal to 5 nm and less than or equal to 400 nm, greater than or equal to 5 nm and less than or equal to 300 nm, or greater than or equal to 10 nm and less than or equal to 250 nm.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3 \times 10^{17}$ spins/cm$^3$ and preferably lower than or equal to $5 \times 10^{16}$ spins/cm$^3$ may be used.

In addition to the above-described signal, a signal due to nitrogen dioxide (NO$_2$) might be observed in the insulating film 110. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating film whose spin density of a signal due to nitrogen dioxide (NO$_2$) is higher than or equal to $1 \times 10^{17}$ spins/cm$^3$ and lower than $1 \times 10^{18}$ spins/cm$^3$ as the insulating film 110, for example.

Note that a nitrogen oxide (NO$_x$) such as a nitrogen dioxide (NO$_2$) forms a level in the insulating film 110. The level is positioned in the energy gap of the oxide semiconductor film 108. Thus, when nitrogen oxide (NO$_x$) is diffused to the interface between the insulating film 110 and the oxide semiconductor film 108, an electron might be trapped by the level on the insulating film 110 side. As a result, the trapped electron remains in the vicinity of the interface between the insulating film 110 and the oxide semiconductor film 108, leading to a positive shift of the threshold voltage of the transistor. Accordingly, the use of a film with a low nitrogen oxide content as the insulating film 110 can reduce a shift of the threshold voltage of the transistor.

As an insulating film that releases a small amount of nitrogen oxide (NO$_x$), for example, a silicon oxynitride film can be used. The silicon oxynitride film releases more ammonia than nitrogen oxide (NO$_x$) in thermal desorption spectroscopy (TDS); the typical released amount of ammonia is greater than or equal to $1 \times 10^{18}$ molecules/cm$^3$ and less than or equal to $5 \times 10^{19}$ molecules/cm$^3$. Note that the released amount of ammonia is the total amount of ammonia released by heat treatment in a range of 50° C. to 650° C. or 50° C. to 550° C. in TDS.

Since nitrogen oxide (NO$_x$) reacts with ammonia and oxygen in heat treatment, the use of an insulating film that releases a large amount of ammonia reduces nitrogen oxide (NO$_x$).

Note that in the case where the insulating film 110 is analyzed by SIMS, nitrogen concentration in the film is preferably lower than or equal to $6 \times 10^{20}$ atoms/cm$^3$.

The insulating film 110 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), or hafnium oxide. The use of such a high-k material enables a reduction in gate leakage current of a transistor.

[Third Insulating Film]

The insulating film 116 contains nitrogen or hydrogen. The insulating film 116 may contain fluorine. As the insulating film 116, for example, a nitride insulating film can be used. The nitride insulating film can be formed using silicon nitride, silicon nitride oxide, silicon oxynitride, silicon nitride fluoride, silicon fluoronitride, or the like. The hydrogen concentration in the insulating film 116 is preferably higher than or equal to $1 \times 10^{22}$ atoms/cm$^3$. Furthermore, the insulating film 116 is in contact with the source region 108s and the drain region 108d of the oxide semiconductor film 108. Thus, the concentration of an impurity (nitrogen or hydrogen) in the source region 108s and the drain region 108d in contact with the insulating film 116 is increased, leading to an increase in the carrier density of the source region 108s and the drain region 108d.

[Fourth Insulating Film]

As the insulating film 118, an oxide insulating film can be used. Alternatively, a stack including an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga—Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

[Conductive Film]

The conductive films 112, 120a, and 120b can be formed by a sputtering method, a vacuum evaporation method, a pulsed laser deposition (PLD) method, a thermal CVD method, or the like. The conductive films 112, 120a, and 120b can be formed using materials similar to those of the conductive films 402, 403a, 403b, 403c, 405a, 405b, 405c, 405d, 407a, 407b, 407c, 407d, 407e, 411a, 411b, 411c, 414a, 414b, 414c, 414d, 414e 414f, 414g, 414h, 417, 420, and 608 which are described in Embodiment 1.

The conductive films 112, 120a, and 120b can also be formed using a light-transmitting conductive material such as ITO, indium oxide containing tungsten oxide, indium zinc oxide containing tungsten oxide, indium oxide containing titanium oxide, indium tin oxide containing titanium oxide, indium zinc oxide, or ITSO. It is also possible to have a layered structure formed using the above light-transmitting conductive material and the above metal element.

Note that an oxide semiconductor typified by an In—Ga—Zn oxide may be used for the conductive film 112. The oxide semiconductor can have a high carrier density when nitrogen or hydrogen is supplied from the insulating film 116. In other words, the oxide semiconductor functions as an oxide conductor (OC). Accordingly, the oxide semiconductor can be used for a gate electrode.

The conductive film 112 can have, for example, a single-layer structure of an oxide conductor (OC), a single-layer structure of a metal film, or a stacked-layer structure of an oxide conductor (OC) and a metal film.

Note that it is suitable that the conductive film 112 has a single-layer structure of a light-shielding metal film or a stacked-layer structure of an oxide conductor (OC) and a light-shielding metal film because the channel region 108i formed under the conductive film 112 can be shielded from light. In the case where the conductive film 112 has a stacked-layer structure of an oxide semiconductor or an oxide conductor (OC) and a light-shielding metal film, formation of a metal film (e.g., a titanium film or a tungsten film) over the oxide semiconductor or the oxide conductor (OC) produces any of the following effects: the resistance of the oxide semiconductor or the oxide conductor (OC) is reduced by the diffusion of the constituent element of the metal film to the oxide semiconductor or oxide conductor (OC) side, the resistance is reduced by damage (e.g., sputtering damage) during the deposition of the metal film, and the resistance is reduced when oxygen vacancies are formed by the diffusion of oxygen in the oxide semiconductor or the oxide conductor (OC) to the metal film.

The thickness of the conductive films 112, 120a, and 120b can be greater than or equal to 30 nm and less than or equal to 500 nm, or greater than or equal to 100 nm and less than or equal to 400 nm.

<3-2. Structure Example 2 of Semiconductor Device>

Next, a structure of a transistor different from that in FIGS. 29A to 29C is described with reference to FIGS. 30A to 30C.

Figure 30A:
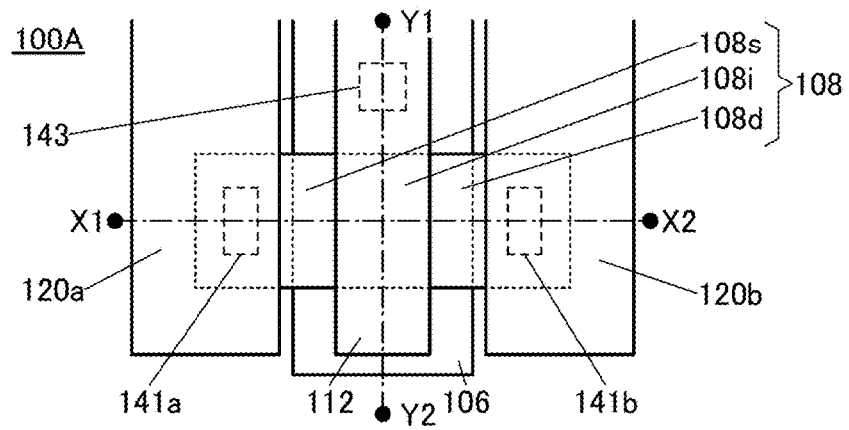
FIGS. 30A to 30C are a top view and cross-sectional views illustrating a semiconductor device.

FIG. 30A is a top view of a transistor 100A. FIG. 30B is a cross-sectional view taken along the dashed-dotted line X1-X2 in FIG. 30A. FIG. 30C is a cross-sectional view taken along the dashed-dotted line Y1-Y2 in FIG. 30A.

Figure 30B:
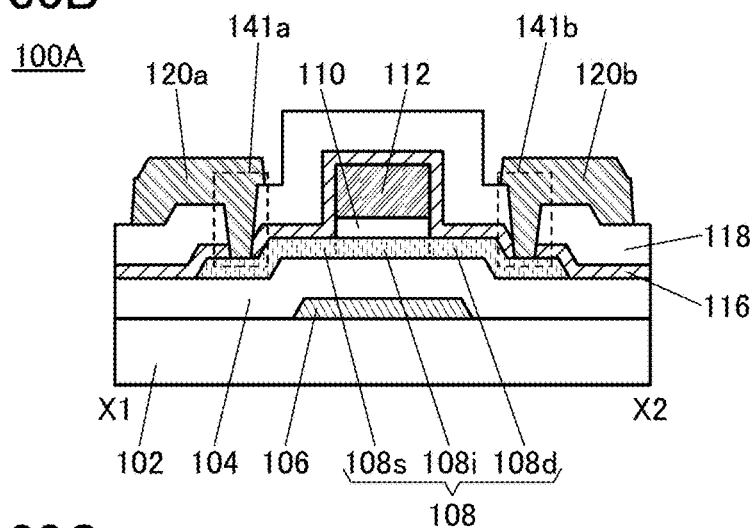
Figure 30C:
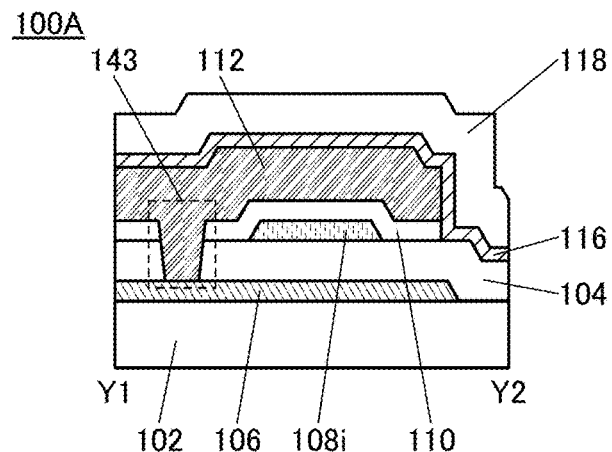

The transistor 100A illustrated in FIGS. 30A to 30C includes a conductive film 106 over the substrate 102; the insulating film 104 over the conductive film 106; the oxide semiconductor film 108 over the insulating film 104; the insulating film 110 over the oxide semiconductor film 108; the conductive film 112 over the insulating film 110; and the insulating film 116 over the insulating film 104, the oxide semiconductor film 108, and the conductive film 112. Note that the oxide semiconductor film 108 includes the channel region 108i overlapping with the conductive film 112, the source region 108s in contact with the insulating film 116, and the drain region 108d in contact with the insulating film 116.

The transistor 100A includes the conductive film 106 and an opening 143 in addition to the components of the transistor 100 described above.

Note that the opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-shielding film without providing the opening 143. When the conductive film 106 is formed using a light-shielding material, for example, light irradiating the channel region 108i from the bottom can be reduced.

In the case of the structure of the transistor 100A, the conductive film 106 functions as a first gate electrode (also referred to as a bottom-gate electrode), the conductive film 112 functions as a second gate electrode (also referred to as a top-gate electrode), the insulating film 104 functions as a first gate insulating film, and the insulating film 110 functions as a second gate insulating film.

The conductive film 106 can be formed using a material similar to the above-described materials of the conductive films 112, 120a, and 120b. It is particularly suitable to use a material containing copper for the conductive film 106 because the resistance can be reduced. It is suitable that, for example, each of the conductive films 106, 120a, and 120b has a stacked-layer structure in which a copper film is over a titanium nitride film, a tantalum nitride film, or a tungsten film. In that case, when the transistor 100A is used as a pixel transistor and/or a driving transistor of a display device, parasitic capacitance generated between the conductive films 106 and 120a and between the conductive films 106 and 120b can be reduced. Thus, the conductive films 106, 120a, and 120b can be used not only as the first gate electrode, the source electrode, and the drain electrode of the transistor 100A, but also as power source supply wirings, signal supply wirings, connection wirings, or the like of the display device.

In this manner, unlike the transistor 100 described above, the transistor 100A in FIGS. 30A to 30C has a structure in which a conductive film functioning as a gate electrode is provided over and under the oxide semiconductor film 108. As in the transistor 100A, a semiconductor device of one embodiment of the present invention may have a plurality of gate electrodes.

As illustrated in FIG. 30C, the oxide semiconductor film 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is larger than the length of the oxide semiconductor film 108 in the channel width direction. In the channel width direction, the whole oxide semiconductor film 108 is covered with the conductive film 112 with the insulating film 110 placed therebetween. Since the conductive film 112 is connected to the conductive film 106 through the opening 143 provided in the insulating films 104 and 110, a side surface of the oxide semiconductor film 108 in the channel width direction faces the conductive film 112 with the insulating film 110 placed therebetween.

In other words, in the channel width direction of the transistor 100A, the conductive films 106 and 112 are connected to each other through the opening 143 provided in the insulating films 104 and 110, and the conductive films 106 and 112 surround the oxide semiconductor film 108 with the insulating films 104 and 110 placed therebetween.

Such a structure enables the oxide semiconductor film 108 included in the transistor 100A to be electrically surrounded by electric fields of the conductive film 106 functioning as a first gate electrode and the conductive film 112 functioning as a second gate electrode. A device structure of a transistor, like that of the transistor 100A, in which electric fields of a first gate electrode and a second gate electrode electrically surround an oxide semiconductor film in which a channel region is formed can be referred to as a surrounded channel (S-channel) structure.

Since the transistor 100A has the S-channel structure, an electric field for inducing a channel can be effectively applied to the oxide semiconductor film 108 by the conductive film 106 or the conductive film 112; thus, the current drive capability of the transistor 100A can be improved and high on-state current characteristics can be obtained. As a result of the high on-state current, it is possible to reduce the size of the transistor 100A. Furthermore, since the transistor 100A has a structure in which the oxide semiconductor film 108 is surrounded by the conductive film 106 and the conductive film 112, the mechanical strength of the transistor 100A can be increased.

When seen in the channel width direction of the transistor 100A, an opening different from the opening 143 may be formed on the side of the oxide semiconductor film 108 on which the opening 143 is not formed.

When a transistor has a pair of gate electrodes between which a semiconductor film is positioned as in the transistor 100A, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential V1 and a potential V2 (V1>V2). For example, the potential V1 can be a high power supply potential, and the potential V2 can be a low power supply potential. The signal A may be an analog signal.

The fixed potential $V_b$ is, for example, a potential for controlling a threshold voltage $V_{thA}$ of the transistor. The fixed potential $V_b$ may be the potential V1 or the potential V2. In that case, a potential generator circuit for generating the fixed potential $V_b$ is not necessary, which is preferable. The fixed potential $V_b$ may be different from the potential V1 or the potential V2. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor can be reduced in some cases. The fixed potential $V_b$ may be, for example, lower than the low power supply potential. Meanwhile, a high fixed potential $V_b$ can lower the threshold voltage $V_{thA}$ in some cases. As a result, the drain current flowing when the gate-source voltage $V_{gs}$ is a high power supply potential and the operating speed of the circuit including the transistor can be increased in some cases. The fixed potential $V_b$ may be, for example, higher than the low power supply potential.

The signal B is, for example, a signal for controlling the on/off state. The signal B may be a digital signal with two kinds of potentials, a potential V3 and a potential V4 (V3>V4). For example, the potential V3 can be a high power supply potential, and the potential V4 can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential V1 and the potential V2 of the signal A may be different from the potential V3 and the potential V4 of the signal B. For example, if a gate insulating film for the gate to which the signal B is input is thicker than a gate insulating film for the gate to which the signal A is input, the potential amplitude of the signal B (V3–V4) may be larger than the potential amplitude of the signal A (V1–V2). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential V1 and the signal B has the potential V3, or the transistor is turned off only when the signal A has the potential V2 and the signal B has the potential V4. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit.

In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

Except for the above-mentioned points, the transistor 100A has a structure and an effect similar to those of the transistor 100 described above.

<3-3. Structure Example 3 of Transistor>

Next, structures of a transistor different from that in FIGS. 30A to 30C are described with reference to FIGS. 31A and 31B, FIGS. 32A and 32B, FIGS. 33A and 33B, FIGS. 34A and 34B, FIGS. 35A and 35B, and FIGS. 36A to 36C.

Figure 31A:
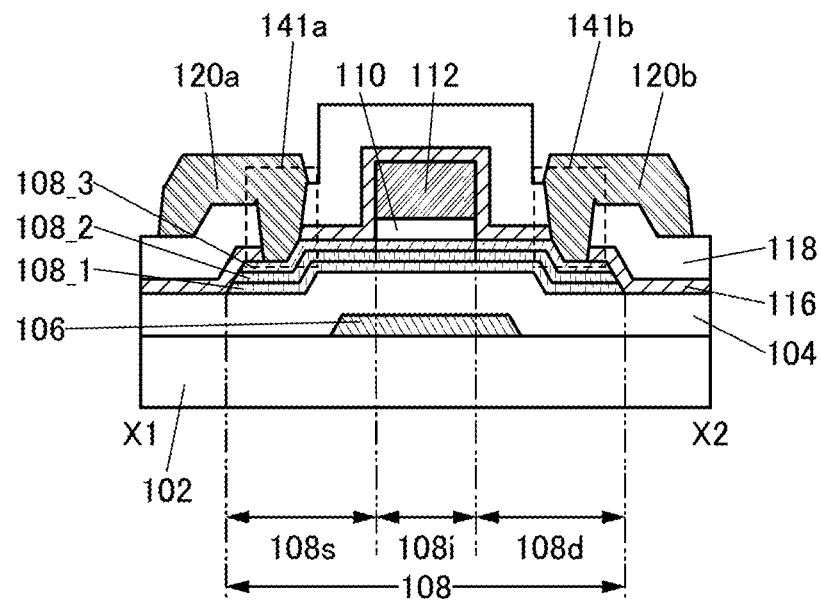
FIGS. 31A and 31B are cross-sectional views illustrating a semiconductor device.
Figure 31B:
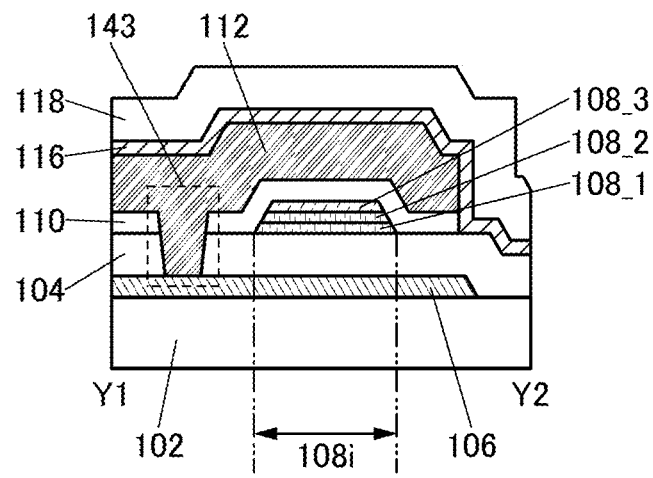
Figure 32A:
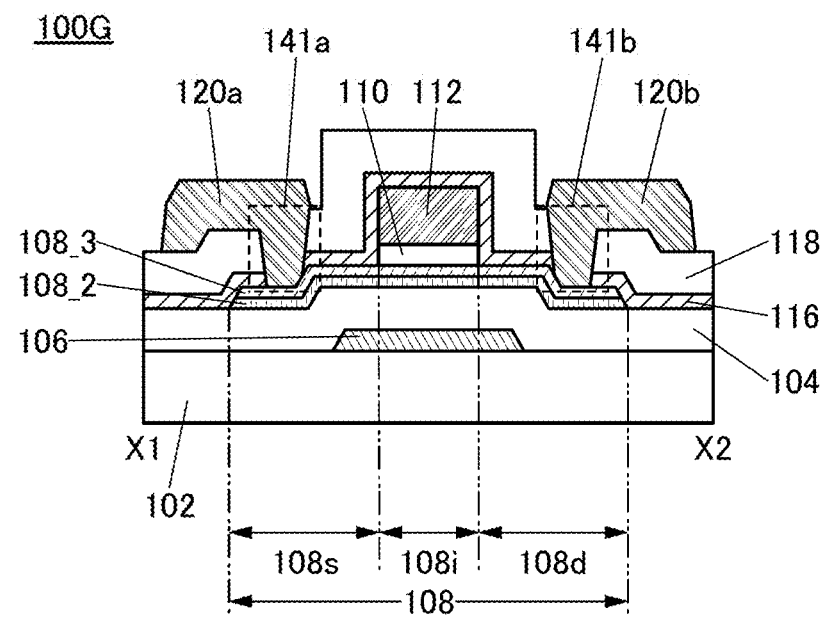
FIGS. 32A and 32B are cross-sectional views illustrating a semiconductor device.
Figure 32B:
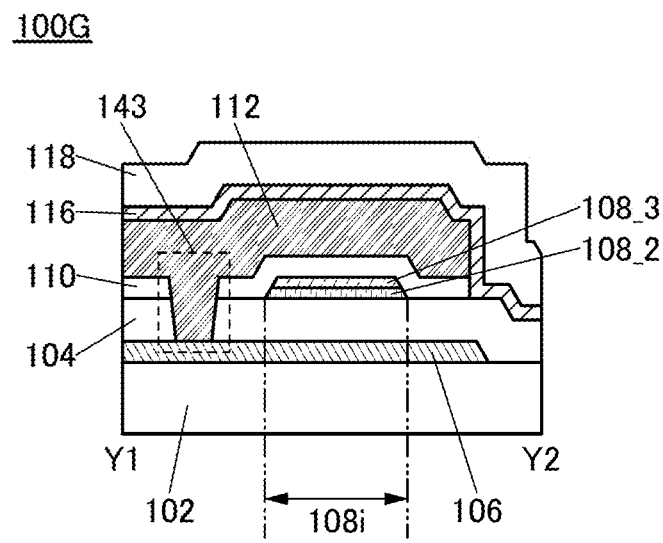
Figure 33A:
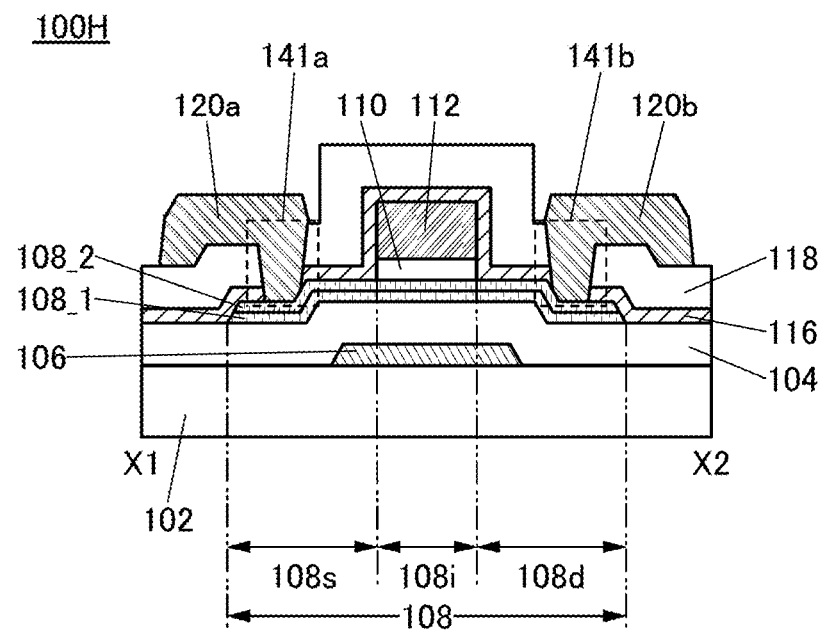
FIGS. 33A and 33B are cross-sectional views illustrating a semiconductor device.
Figure 33B:
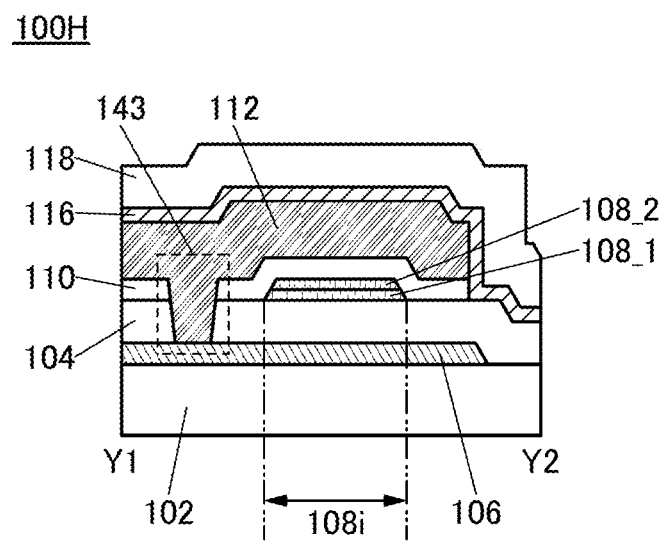
Figure 34A:
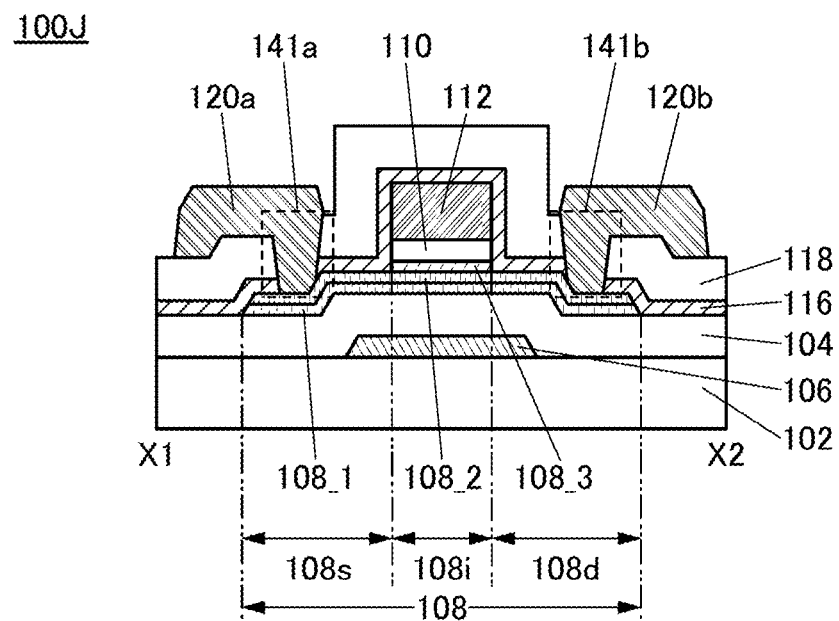
FIGS. 34A and 34B are cross-sectional views illustrating a semiconductor device.
Figure 34B:
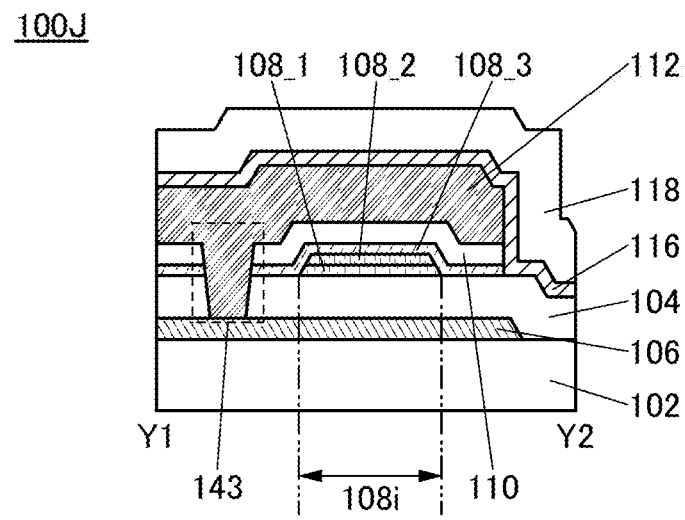
Figure 35A:
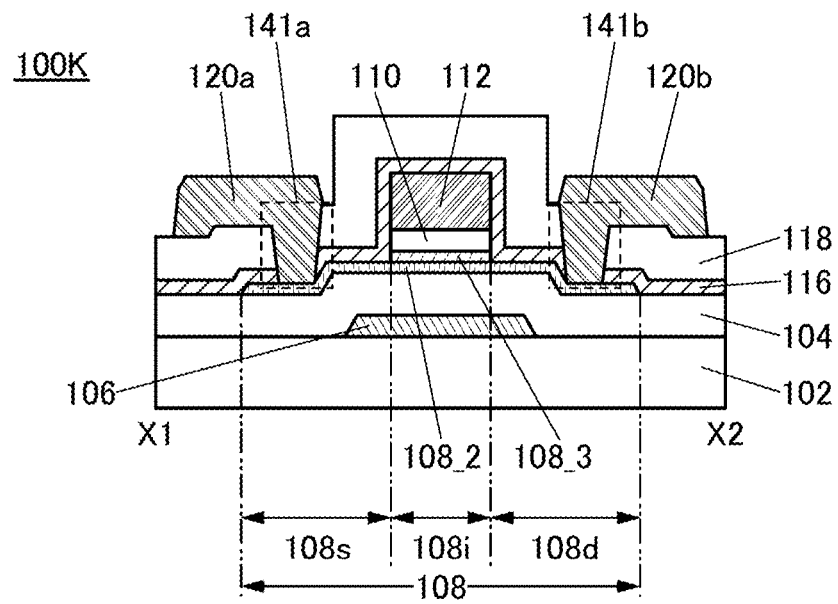
FIGS. 35A and 35B are cross-sectional views illustrating a semiconductor device.
Figure 35B:
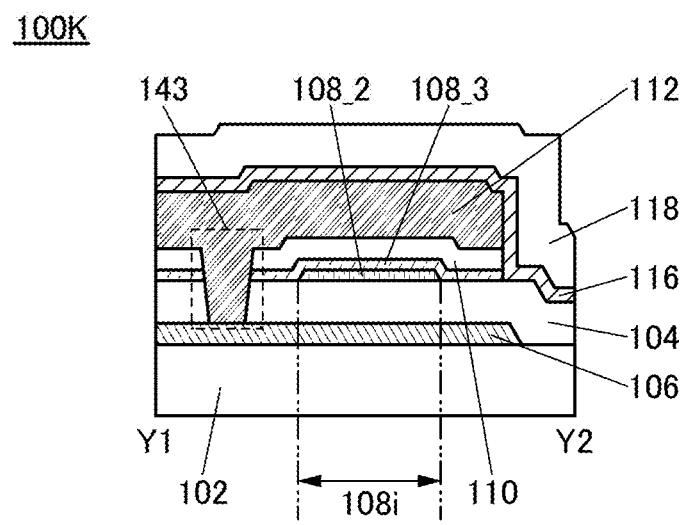

FIGS. 31A and 31B are cross-sectional views of a transistor 100F. FIGS. 32A and 32B are cross-sectional views of a transistor 100G. FIGS. 33A and 33B are cross-sectional views of a transistor 100H. FIGS. 34A and 34B are cross-sectional views of a transistor 100J. FIGS. 35A and 35B are cross-sectional views of a transistor 100K. Note that top views of the transistor 100F, the transistor 100G, the transistor 100H, the transistor 100J, and the transistor 100K are similar to that of the transistor 100A illustrated in FIG. 30A and thus are not described here.

The transistors 100F, 100G, 100H, 100J, and 100K are different from the above-described transistor 100A in the structure of the oxide semiconductor film 108. The other components of the transistors are similar to those of the transistor 100A described above and have similar effects.

The oxide semiconductor film 108 of the transistor 100F illustrated in FIGS. 31A and 31B includes an oxide semiconductor film 108_1 over the insulating film 104, an oxide semiconductor film 108_2 over the oxide semiconductor film 108_1, and an oxide semiconductor film 108_3 over the oxide semiconductor film 108_2. The channel region 108$i$, the source region 108$s$, and the drain region 108$d$ each have a three-layer structure of the oxide semiconductor film 108_1, the oxide semiconductor film 108_2, and the oxide semiconductor film 108_3.

The oxide semiconductor film 108 of the transistor 100G illustrated in FIGS. 32A and 32B includes the oxide semiconductor film 108_2 over the insulating film 104, and the oxide semiconductor film 108_3 over the oxide semiconductor film 108_2. The channel region 108$i$, the source region 108$s$, and the drain region 108$d$ each have a two-layer structure of the oxide semiconductor film 108_2 and the oxide semiconductor film 108_3.

The oxide semiconductor film 108 of the transistor 100H illustrated in FIGS. 33A and 33B includes the oxide semiconductor film 108_1 over the insulating film 104, and the oxide semiconductor film 108_2 over the oxide semiconductor film 108_1. The channel region 108i, the source region 108s, and the drain region 108d each have a two-layer structure of the oxide semiconductor film 108_1 and the oxide semiconductor film 108_2.

The oxide semiconductor film 108 of the transistor 100J illustrated in FIGS. 34A and 34B includes the oxide semiconductor film 108_1 over the insulating film 104, the oxide semiconductor film 108_2 over the oxide semiconductor film 108_1, and the oxide semiconductor film 108_3 over the oxide semiconductor film 108_2. The channel region 108i has a three-layer structure of the oxide semiconductor film 108_1, the oxide semiconductor film 108_2, and the oxide semiconductor film 108_3. The source region 108s and the drain region 108d each have a two-layer structure of the oxide semiconductor film 108_1 and the oxide semiconductor film 108_2. Note that in the cross section of the transistor 100J in the channel width (W) direction, the oxide semiconductor film 108_3 covers side surfaces of the oxide semiconductor film 108_1 and the oxide semiconductor film 108_2.

The oxide semiconductor film 108 of the transistor 100K illustrated in FIGS. 35A and 35B includes the oxide semiconductor film 108_2 over the insulating film 104, and the oxide semiconductor film 108_3 over the oxide semiconductor film 108_2. The channel region 108i has a two-layer structure of the oxide semiconductor film 108_2 and the oxide semiconductor film 108_3. The source region 108s and the drain region 108d each have a single-layer structure of the oxide semiconductor film 108_2. Note that in the cross section of the transistor 100K in the channel width (W) direction, the oxide semiconductor film 108_3 covers side surfaces of the oxide semiconductor film 108_2.

A side surface of the channel region 108i in the channel width (W) direction or a region in the vicinity of the side surface is easily damaged by processing, resulting in a defect (e.g., oxygen vacancy), or easily contaminated by an impurity attached thereto. Therefore, even when the channel region 108i is substantially intrinsic, stress such as an electric field applied thereto activates the side surface of the channel region 108i in the channel width (W) direction or the region in the vicinity of the side surface and turns it into a low-resistance (n-type) region easily. Moreover, if the side surface of the channel region 108i in the channel width (W) direction or the region in the vicinity of the side surface is an n-type region, a parasitic channel may be formed because the n-type region serves as a carrier path.

Thus, in the transistor 100J and the transistor 100K, the channel region 108i has a stacked-layer structure and side surfaces of the channel region 108i in the channel width (W) direction are covered with one layer of the stacked layers. With such a structure, defects on or in the vicinity of the side surfaces of the channel region 108i can be suppressed or adhesion of an impurity to the side surfaces of the channel region 108i or to regions in the vicinity of the side surfaces can be reduced.

<3-4. Band Structure>

Here, a band structure of the insulating film 104, the oxide semiconductor films 108_1, 108_2, and 108_3, and the insulating film 110, a band structure of the insulating film 104, the oxide semiconductor films 108_2 and 108_3, and the insulating film 110, and a band structure of the insulating film 104, the oxide semiconductor films 108_1 and 108_2, and the insulating film 110 are described with reference to FIGS. 36A to 36C. Note that FIGS. 36A to 36C are each a band structure of the channel region 108i.

Figure 36A:
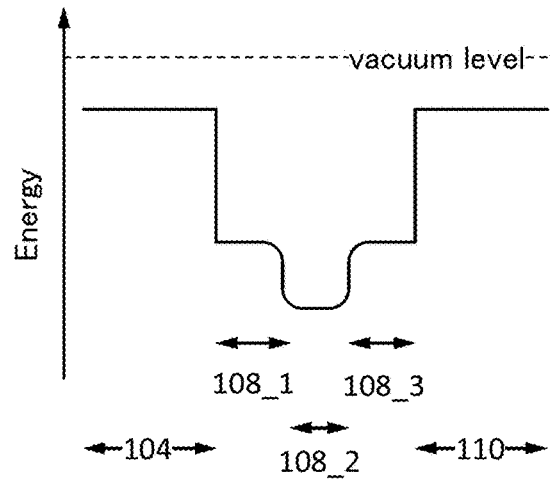
FIGS. 36A to 36C illustrate band structures.

FIG. 36A shows an example of a band structure in the thickness direction of a stack including the insulating film 104, the oxide semiconductor films 108_1, 108_2, and 108_3, and the insulating film 110. FIG. 36B shows an example of a band structure in the thickness direction of a stack including the insulating film 104, the oxide semiconductor films 108_2 and 108_3, and the insulating film 110. FIG. 36C shows an example of a band structure in the thickness direction of a stack including the insulating film 104, the oxide semiconductor films 108_1 and 108_2, and the insulating film 110. For easy understanding, the band structures show the conduction band minimum ($E_c$) of the insulating film 104, the oxide semiconductor films 108_1, 108_2, and 108_3, and the insulating film 110.

In the band structure of FIG. 36A, a silicon oxide film is used as each of the insulating films 104 and 110, an oxide semiconductor film formed using a metal oxide target whose atomic ratio of In to Ga and Zn is 1:3:2 is used as the oxide semiconductor film 108_1, an oxide semiconductor film formed using a metal oxide target whose atomic ratio of In to Ga and Zn is 4:2:4.1 is used as the oxide semiconductor film 108_2, and an oxide semiconductor film formed using a metal oxide target whose atomic ratio of In to Ga and Zn is 1:3:2 is used as the oxide semiconductor film 108_3.

Figure 36B:
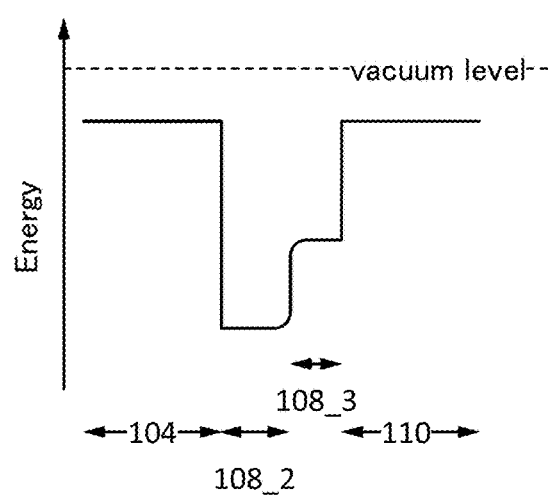
Figure 36C:
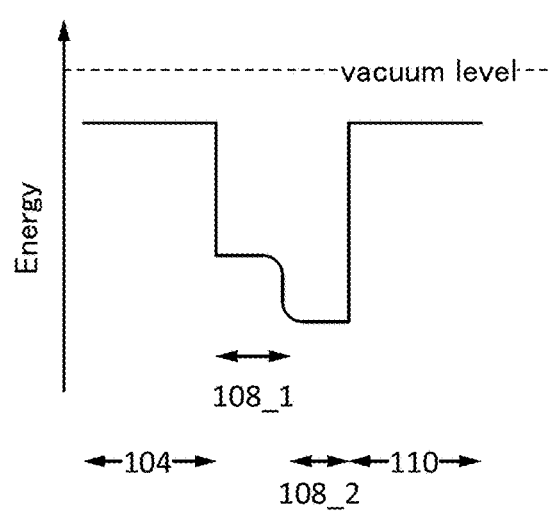

In the band structure of FIG. 36B, a silicon oxide film is used as each of the insulating films 104 and 110, an oxide semiconductor film formed using a metal oxide target whose atomic ratio of In to Ga and Zn is 4:2:4.1 is used as the oxide semiconductor film 108_2, and an oxide semiconductor film formed using a metal oxide target whose atomic ratio of In to Ga and Zn is 1:3:2 is used as the oxide semiconductor film 108_3.

In the band structure of FIG. 36C, a silicon oxide film is used as each of the insulating films 104 and 110, an oxide semiconductor film formed using a metal oxide target whose atomic ratio of In to Ga and Zn is 1:3:2 is used as the oxide semiconductor film 108_1, and an oxide semiconductor film formed using a metal oxide target whose atomic ratio of In to Ga and Zn is 4:2:4.1 is used as the oxide semiconductor film 108_2.

As illustrated in FIG. 36A, the conduction band minimum gradually varies between the oxide semiconductor films 108_1, 108_2, and 108_3. As illustrated in FIG. 36B, the conduction band minimum gradually varies between the oxide semiconductor films 108_2 and 108_3. As illustrated in FIG. 36C, the conduction band minimum gradually varies between the oxide semiconductor films 108_1 and 108_2. In other words, the conduction band minimum is continuously changed or continuously connected. To obtain such a band structure, there exists no impurity, which forms a defect state such as a trap center or a recombination center, at the interface between the oxide semiconductor films 108_1 and 108_2 or the interface between the oxide semiconductor films 108_2 and 108_3.

To form a continuous junction between the oxide semiconductor films 108_1, 108_2, and 108_3, it is necessary to form the films successively without exposure to the air with a multi-chamber deposition apparatus (sputtering apparatus) provided with a load lock chamber.

With the band structure of FIG. 36A, FIG. 36B, or FIG. 36C, the oxide semiconductor film 108_2 serves as a well, and a channel region is formed in the oxide semiconductor film 108_2 in the transistor with the stacked-layer structure.

By providing the oxide semiconductor films 108_1 and 108_3, the oxide semiconductor film 108_2 can be distanced away from trap states.

In addition, the trap states might be more distant from the vacuum level than the conduction band minimum ($E_c$) of the oxide semiconductor film 108_2 functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the conduction band minimum ($E_c$) of the oxide semiconductor film 108_2. Such a structure inhibits accumulation of electrons in the trap states. As a result, the on-state current and the field-effect mobility of the transistor can be increased.

The conduction band minimum of each of the oxide semiconductor films 108_1 and 108_3 is closer to the vacuum level than that of the oxide semiconductor film 108_2. A typical difference between the conduction band minimum of the oxide semiconductor film 108_2 and the conduction band minimum of each of the oxide semiconductor films 108_1 and 108_3 is 0.15 eV or more or 0.5 eV or more and 2 eV or less or 1 eV or less. That is, the difference between the electron affinity of each of the oxide semiconductor films 108_1 and 108_3 and the electron affinity of the oxide semiconductor film 108_2 is 0.15 eV or more or 0.5 eV or more and 2 eV or less or 1 eV or less.

In such a structure, the oxide semiconductor film 108_2 serves as a main path of a current. In other words, the oxide semiconductor film 108_2 serves as a channel region, and the oxide semiconductor films 108_1 and 108_3 function as oxide insulating films. It is preferable that the oxide semiconductor films 108_1 and 108_3 each include one or more metal elements constituting a part of the oxide semiconductor film 108_2 in which a channel region is formed. With such a structure, interface scattering hardly occurs at the interface between the oxide semiconductor film 108_1 and the oxide semiconductor film 108_2 or at the interface between the oxide semiconductor film 108_2 and the oxide semiconductor film 108_3. Thus, the transistor can have high field-effect mobility because the movement of carriers is not hindered at the interface.

To prevent each of the oxide semiconductor films 108_1 and 108_3 from functioning as part of a channel region, a material having sufficiently low conductivity is used for the oxide semiconductor films 108_1 and 108_3. Thus, the oxide semiconductor films 108_1 and 108_3 can be referred to as oxide insulating films for such properties and/or functions. Alternatively, a material that has a smaller electron affinity (a difference between the vacuum level and the conduction band minimum) than the oxide semiconductor film 108_2 and has a difference in the conduction band minimum from the oxide semiconductor film 108_2 (band offset) is used for the oxide semiconductor films 108_1 and 108_3. Furthermore, to inhibit generation of a difference in threshold voltage due to the value of the drain voltage, it is preferable to form the oxide semiconductor films 108_1 and 108_3 using a material whose conduction band minimum is closer to the vacuum level than that of the oxide semiconductor film 108_2. For example, a difference between the conduction band minimum of the oxide semiconductor film 108_2 and the conduction band minimum of each of the oxide semiconductor films 108_1 and 108_3 is preferably greater than or equal to 0.2 eV, more preferably greater than or equal to 0.5 eV.

It is preferable that the oxide semiconductor films 108_1 and 108_3 not have a spinel crystal structure. This is because if the oxide semiconductor films 108_1 and 108_3 have a spinel crystal structure, constituent elements of the conductive films 120a and 120b might be diffused into the oxide semiconductor film 108_2 at the interface between the spinel crystal structure and another region. Note that each of the oxide semiconductor films 108_1 and 108_3 is preferably a CAAC-OS film described later, in which case a higher blocking property against constituent elements of the conductive films 120a and 120b, for example, copper elements, can be obtained.

Although the example where an oxide semiconductor film formed using a metal oxide target whose atomic ratio of In to Ga and Zn is 1:3:2, is used as each of the oxide semiconductor films 108_1 and 108_3 is described in this embodiment, one embodiment of the present invention is not limited thereto. For example, an oxide semiconductor film formed using a metal oxide target whose atomic ratio of In to Ga and Zn is 1:1:1, 1:1:1.2, 1:3:4, 1:3:6, 1:4:5, 1:5:6, or 1:10:1 may be used as each of the oxide semiconductor films 108_1 and 108_3. Alternatively, oxide semiconductor films formed using a metal oxide target whose atomic ratio of Ga to Zn is 10:1 may be used as the oxide semiconductor films 108_1 and 108_3. In that case, it is suitable that an oxide semiconductor film formed using a metal oxide target whose atomic ratio of In to Ga and Zn is 1:1:1 is used as the oxide semiconductor film 108_2 because the difference between the conduction band minimum of the oxide semiconductor film 108_2 and the conduction band minimum of the oxide semiconductor film 108_1 or 108_3 can be 0.6 eV or more.

When the oxide semiconductor films 108_1 and 108_3 are formed using a metal oxide target whose atomic ratio of In to Ga and Zn is 1:1:1, the atomic ratio of In to Ga and Zn in the oxide semiconductor films 108_1 and 108_3 might be 1:$\beta 1$:$\beta 2$ ($0<\beta 1 \leq 2$, $0<\beta 2 \leq 2$). When the oxide semiconductor films 108_1 and 108_3 are formed using a metal oxide target whose atomic ratio of In to Ga and Zn is 1:3:4, the atomic ratio of In to Ga and Zn in the oxide semiconductor films 108_1 and 108_3 might be 1:$\beta 3$:$\beta 4$ ($1 \leq \beta 3 \leq 5$, $2 \leq 4 \leq 6$). When the oxide semiconductor films 108_1 and 108_3 are formed using a metal oxide target whose atomic ratio of In to Ga and Zn is 1:3:6, the atomic ratio of In to Ga and Zn in the oxide semiconductor films 108_1 and 108_3 might be 1:$\beta 5$:$\beta 6$ ($1 \leq \beta 5$, $4 \leq \beta 6 \leq 8$).

The structure and method described in this embodiment can be used in appropriate combination with with any of the other structures and methods described in the other embodiments.

Embodiment 4

In this embodiment, a transistor that can be used for the display device of one embodiment of the present invention is described in detail.

In this embodiment, an inverted staggered transistor is described with reference to FIGS. 37A to 37C, FIGS. 38A to 38C, FIGS. 39A to 39C, FIGS. 40A to 40C, and FIGS. 41A to 41D.

<4-1. Structure Example 1 of Transistor>

Figure 37A:
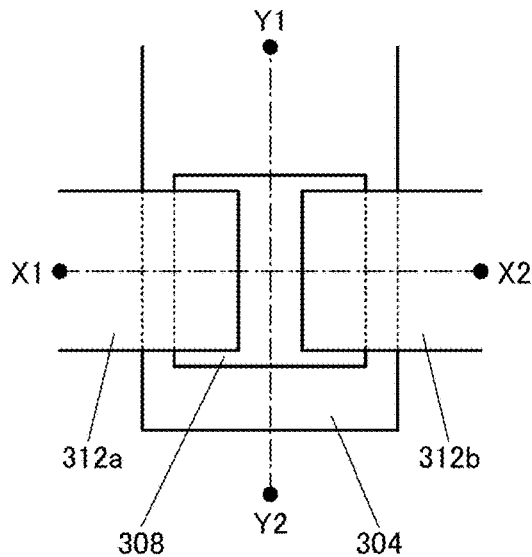
FIGS. 37A to 37C are a top view and cross-sectional views illustrating one embodiment of a transistor.
Figure 37B:
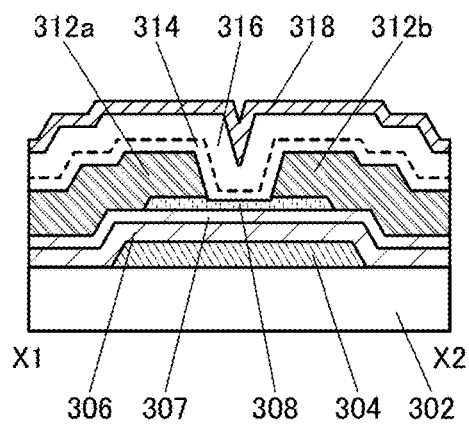
Figure 37C:
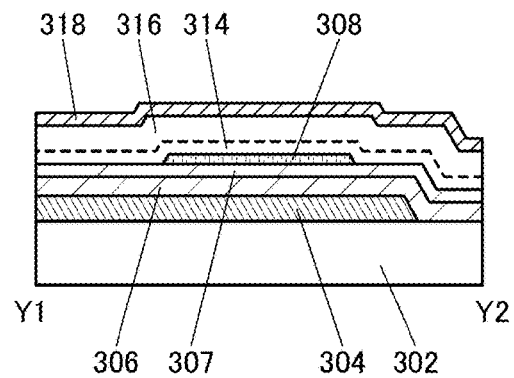

FIG. 37A is a top view of a transistor 300A. FIG. 37B is a cross-sectional view taken along dashed-dotted line X1-X2 in FIG. 37A. FIG. 37C is a cross-sectional view taken along dashed-dotted line Y1-Y2 in FIG. 37A. Note that in FIG. 37A, some components of the transistor 300A (e.g., an insulating film functioning as a gate insulating film) are not illustrated to avoid complexity. The direction of dashed-dotted line X1-X2 may be referred to as a channel length direction, and the direction of dashed-dotted line Y1-Y2 may be referred to as a channel width direction. As in FIG. 37A, some components are not illustrated in some cases in top views of transistors described below.

The transistor 300A includes a conductive film 304 functioning as a gate electrode over a substrate 302, an insulating film 306 over the substrate 302 and the conductive film 304, an insulating film 307 over the insulating film 306, an oxide semiconductor film 308 over the insulating film 307, a conductive film 312a functioning as a source electrode electrically connected to the oxide semiconductor film 308, and a conductive film 312b functioning as a drain electrode electrically connected to the oxide semiconductor film 308. Over the transistor 300A, specifically, over the conductive films 312a and 312b and the oxide semiconductor film 308, an insulating film 314, an insulating film 316, and an insulating film 318 are provided. The insulating films 314, 316, and 318 function as a protective insulating film for the transistor 300A.

<4-2. Structure Example 2 of Transistor>

FIG. 38A is a top view of a transistor 300B. FIG. 38B is a cross-sectional view taken along dashed-dotted line X1-X2 in FIG. 38A. FIG. 38C is a cross-sectional view taken along dashed-dotted line Y1-Y2 in FIG. 38A.

The transistor 300B includes the conductive film 304 functioning as a gate electrode over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312a functioning as a source electrode, and the conductive film 312b functioning as a drain electrode. The conductive film 312a is electrically connected to the oxide semiconductor film 308 through an opening 341a provided in the insulating films 314 and 316. The conductive film 312b is electrically connected to the oxide semiconductor film 308 through an opening 341b provided in the insulating films 314 and 316. Over the transistor 300B, specifically, over the conductive films 312a and 312b and the insulating film 316, the insulating film 318 is provided. The insulating films 314 and 316 function as a protective insulating film for the oxide semiconductor film 308. The insulating film 318 functions as a protective insulating film for the transistor 300B.

The transistor 300A has a channel-etched structure, whereas the transistor 300B in FIGS. 38A to 38C has a channel-protective structure.

<4-3. Structure Example 3 of Transistor>

Figure 39A:
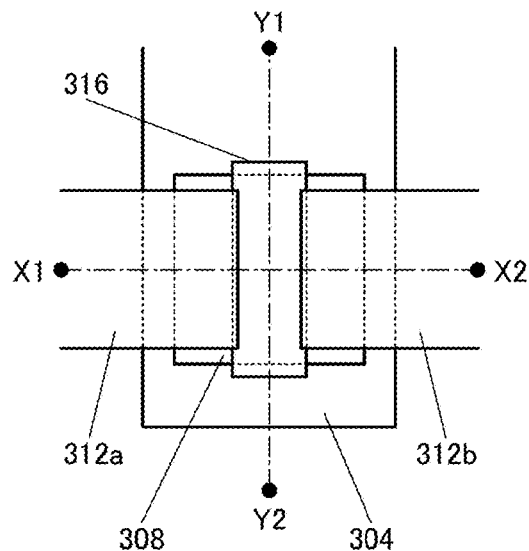
FIGS. 39A to 39C are a top view and cross-sectional views illustrating one embodiment of a transistor.
Figure 39B:
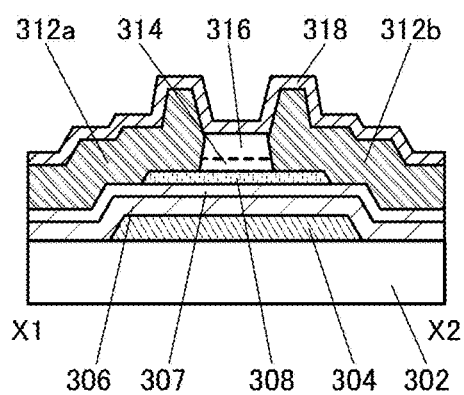
Figure 39C:
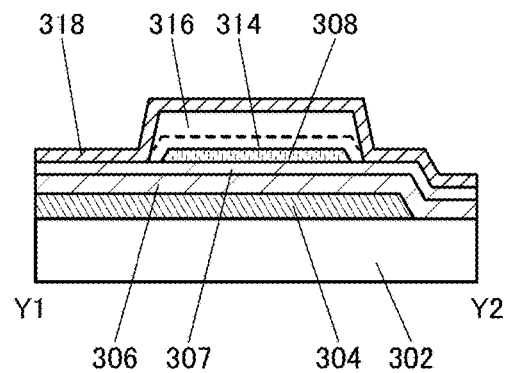

FIG. 39A is a top view of a transistor 300C. FIG. 39B is a cross-sectional view taken along dashed-dotted line X1-X2 in FIG. 39A. FIG. 39C is a cross-sectional view taken along dashed-dotted line Y1-Y2 in FIG. 39A.

The transistor 300C is different from the transistor 300B in FIGS. 38A to 38C in the shapes of the insulating films 314 and 316. Specifically, the insulating films 314 and 316 of the transistor 300C have island shapes and are provided over a channel region of the oxide semiconductor film 308. Other components are similar to those of the transistor 300B.

<4-4. Structure Example 4 of Transistor>

Figure 40A:
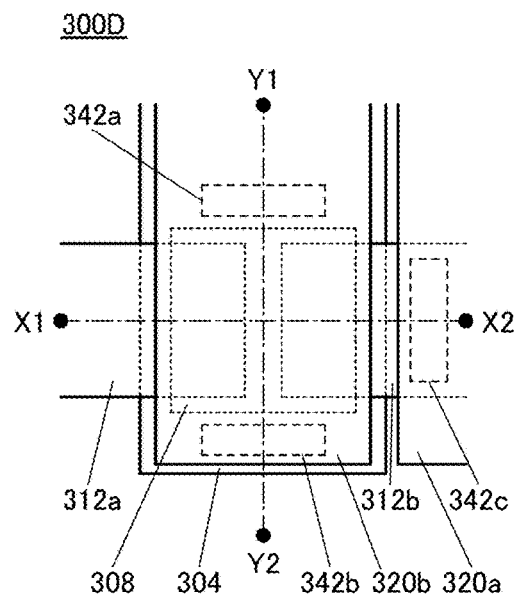
FIGS. 40A to 40C are a top view and cross-sectional views illustrating one embodiment of a transistor.
Figure 40B:
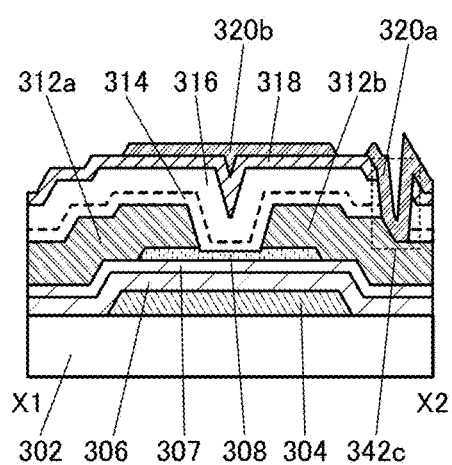
Figure 40C:
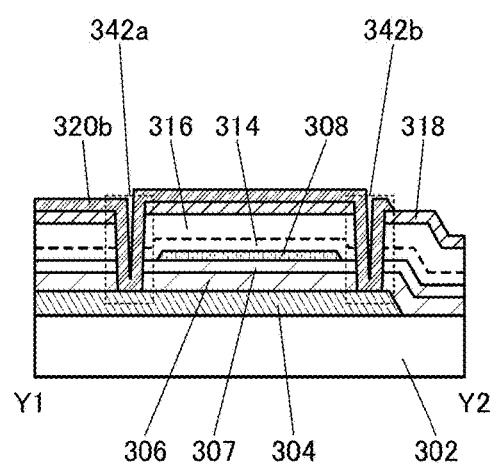

FIG. 40A is a top view of a transistor 300D. FIG. 40B is a cross-sectional view taken along dashed-dotted line X1-X2 in FIG. 40A. FIG. 40C is a cross-sectional view taken along dashed-dotted line Y1-Y2 in FIG. 40A.

The transistor 300D includes the conductive film 304 functioning as a first gate electrode over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312a functioning as a source electrode, the conductive film 312b functioning as a drain electrode, the insulating film 318 over the conductive films 312a and 312b and the insulating film 316, and a conductive film 320a and a conductive film 320b over the insulating film 318. The conductive films 312a and 312b are electrically connected to the oxide semiconductor film 308.

In the transistor 300D, the insulating films 314, 316, and 318 function as a second gate insulating film of the transistor 300D. Furthermore, the conductive film 320a in the transistor 300D functions as a pixel electrode used for the display device. The conductive film 320a is connected to the conductive film 312b through an opening 342c provided in the insulating films 314, 316, and 318. In the transistor 300D, the conductive film 320b functions as a second gate electrode (also referred to as a back gate electrode).

As illustrated in FIG. 40C, the conductive film 320b is connected to the conductive film 304, which functions as the first gate electrode, in an opening 342a and an opening 342b provided in the insulating films 306, 307, 314, 316, and 318. Thus, the same potential is applied to the conductive film 320b and the conductive film 304.

The structure of the transistor 300D is not limited to that described above, in which the openings 342a and 342b are provided so that the conductive film 320b is connected to the conductive film 304. For example, a structure in which only one of the openings 342a and 342b is provided so that the conductive film 320b is connected to the conductive film 304, or a structure in which the conductive film 320b is not connected to the conductive film 304 without providing the openings 342a and 342b may be employed. Note that in the case where the conductive film 320b is not connected to the conductive film 304, it is possible to apply different potentials to the conductive film 320b and the conductive film 304.

Note that the transistor 300D has the s-channel structure described above.

<4-5. Structure Example 5 of Transistor>

The oxide semiconductor film 308 included in the transistor 300A in FIGS. 37A to 37C may have a stacked-layer structure. FIGS. 41A to 41D illustrate examples of such a case.

Figure 41A:
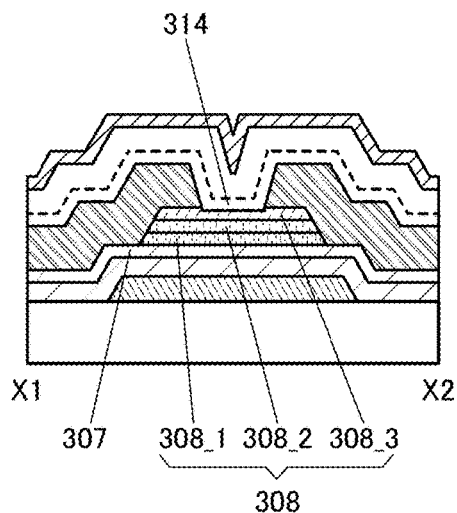
FIGS. 41A to 41D are cross-sectional views illustrating embodiments of transistors.
Figure 41B:
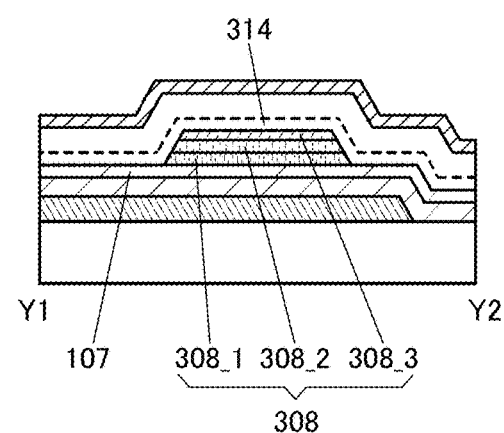
Figure 41C:
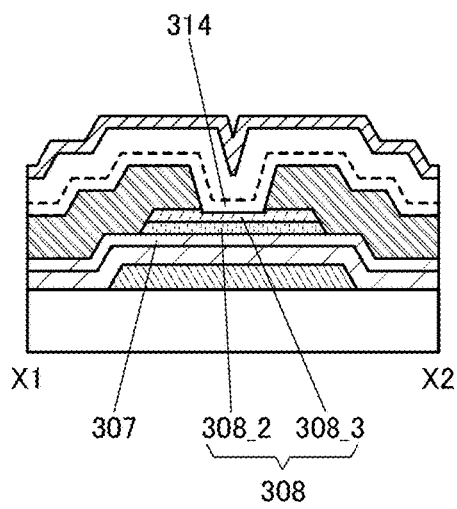
Figure 41D:
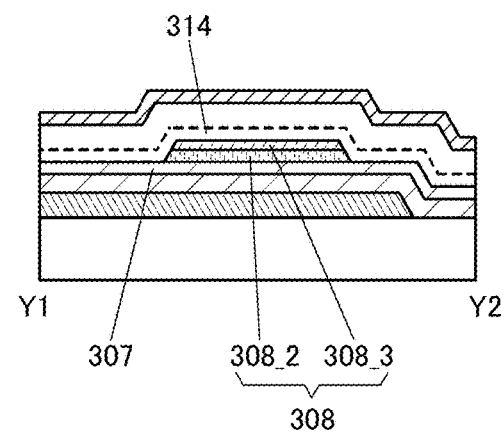

FIGS. 41A and 41B are cross-sectional views of a transistor 300E and FIGS. 41C and 41D are cross-sectional views of a transistor 300F. The top views of the transistors 300E and 300F are similar to that of the transistor 300A illustrated in FIG. 37A.

The oxide semiconductor film 308 of the transistor 300E illustrated in FIGS. 41A and 41B includes an oxide semiconductor film 308_1, an oxide semiconductor film 308_2, and an oxide semiconductor film 308_3. The oxide semiconductor film 308 of the transistor 300F illustrated in FIGS. 41C and 41D includes the oxide semiconductor film 308_2 and the oxide semiconductor film 308_3.

Note that the conductive film 304, the insulating film 306, the insulating film 307, the oxide semiconductor film 308, the oxide semiconductor film 308_1, the oxide semiconductor film 308_2, the oxide semiconductor film 308_3, the conductive film 312a, the conductive film 312b, the insulating film 314, the insulating film 316, the insulating film 318, and the conductive films 320a and 320b can be formed using the materials and formation methods of the conductive film 106, the insulating film 116, the insulating film 314, the oxide semiconductor film 108, the oxide semiconductor film 108_1, the oxide semiconductor film 108_2, the oxide semiconductor film 108_3, the conductive film 120a, the conductive film 120b, the insulating film 104, the insulating film 118, the insulating film 116, and the conductive film 112 described in Embodiment 3.

The structures of the transistors 300A to 300F can be freely combined with each other.

The structure described in this embodiment can be used in appropriate combination with any of the structures described in the other embodiments.

Embodiment 5

In this embodiment, the structure and the like of an oxide semiconductor are described with reference to FIGS. 42A to 42E, FIGS. 43A to 43E, FIGS. 44A to 44D, FIGS. 45A and 45B, and FIG. 46.

<5-1. Structure of Oxide Semiconductor>

An oxide semiconductor is classified into a single-crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of the crystalline oxide semiconductor include a single-crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

<5-2. CAAC-OS>

First, a CAAC-OS is described.

A CAAC-OS is one of oxide semiconductors and has a plurality of c-axis aligned crystal parts (also referred to as pellets).

Analysis of a CAAC-OS by X-ray diffraction (XRD) is described. For example, when the structure of a CAAC-OS including an InGaZnO$_4$ crystal, which is classified into the space group R-3m, is analyzed by an out-of-plane method, a peak appears at a diffraction angle (2θ) of around 31° as shown in FIG. 42A. This peak is derived from the (009) plane of the InGaZnO$_4$ crystal, which indicates that crystals in the CAAC-OS have c-axis alignment and that the c-axes are aligned in the direction substantially perpendicular to a surface over which the CAAC-OS is formed (also referred to as a formation surface) or a top surface of the CAAC-OS. Note that a peak sometimes appears at 2θ of around 36° in addition to the peak at 2θ of around 31°. The peak at 2θ of around 36° is attributed to a crystal structure classified into the space group Fd-3m; thus, this peak is preferably not exhibited in the CAAC-OS.

On the other hand, in structural analysis of the CAAC-OS by an in-plane method in which an X-ray is incident on the CAAC-OS in the direction parallel to the formation surface, a peak appears at 2θ of around 56°. This peak is derived from the (110) plane of the InGaZnO$_4$ crystal. When analysis (φ scan) is performed with 2θ fixed at around 56° while the sample is rotated around a normal vector to the sample surface as an axis (φ axis), as shown in FIG. 42B, a peak is not clearly observed. In contrast, in the case where single-crystal InGaZnO$_4$ is subjected to φ scan with 2θ fixed at around 56°, as shown in FIG. 42C, six peaks which are derived from crystal planes equivalent to the (110) plane are observed. Accordingly, the structural analysis using XRD shows that the directions of the a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in the direction parallel to the formation surface of the CAAC-OS, a diffraction pattern (also referred to as a selected-area electron diffraction pattern) in FIG. 42D can be obtained. This diffraction pattern includes spots derived from the (009) plane of the InGaZnO$_4$ crystal. Thus, the results of electron diffraction also indicate that pellets included in the CAAC-OS have c-axis alignment and that the c-axes are aligned in the direction substantially perpendicular to the formation surface or the top surface of the CAAC-OS. Meanwhile, FIG. 42E shows a diffraction pattern obtained in such a manner that an electron beam with a probe diameter of 300 nm is incident on the same sample in the direction perpendicular to the sample surface. In FIG. 42E, a ring-like diffraction pattern is observed. Thus, the results of electron diffraction using an electron beam with a probe diameter of 300 nm also indicate that the a-axes and b-axes of the pellets included in the CAAC-OS do not have regular alignment. The first ring in FIG. 42E is derived from the (010) plane, the (100) plane, and the like of the InGaZnO$_4$ crystal. The second ring in FIG. 42E is derived from the (110) plane and the like.

In a combined analysis image (also referred to as a high-resolution transmission electron microscope (TEM) image) of a bright-field image and a diffraction pattern of a CAAC-OS, which is obtained using a TEM, a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 43A:
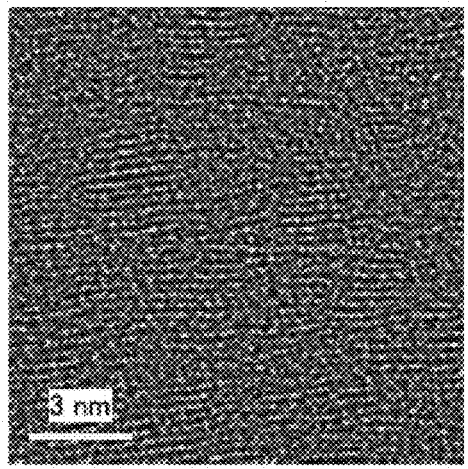
FIGS. 43A to 43E show a cross-sectional TEM image and plan-view TEM images of a CAAC-OS and images obtained through analysis thereof.

FIG. 43A shows a high-resolution TEM image of a cross section of the CAAC-OS which is observed in the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 43A shows pellets in which metal atoms are arranged in a layered manner. FIG. 43A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS and is parallel to the formation surface or the top surface of the CAAC-OS.

Figure 43B:
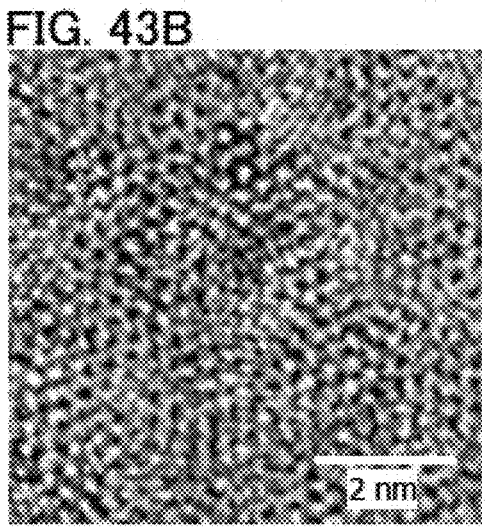
Figure 43C:
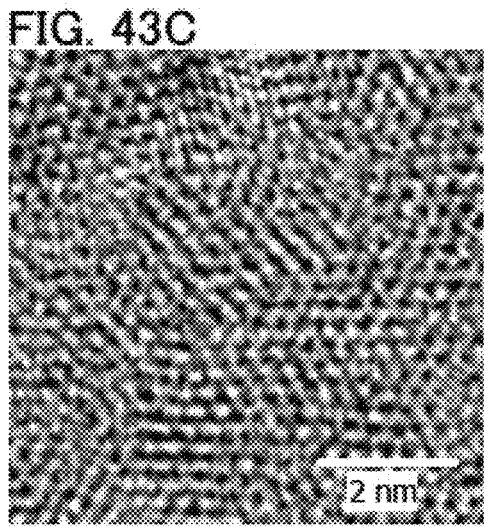
Figure 43D:
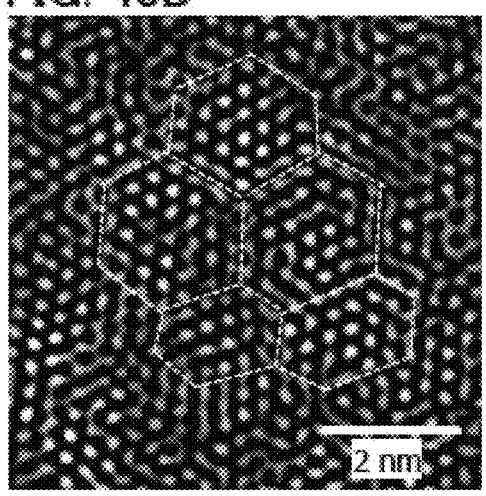
Figure 43E:
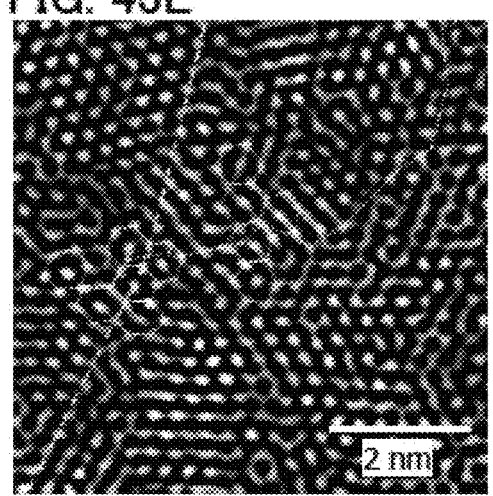

FIGS. 43B and 43C show Cs-corrected high-resolution TEM images of a plane of the CAAC-OS observed in the direction substantially perpendicular to the sample surface. FIGS. 43D and 43E are images obtained by image processing of FIGS. 43B and 43C. The method of image processing is as follows. The image in FIG. 43B is subjected to fast Fourier transform (FFT) to obtain an FFT image. Then, mask processing is performed on the obtained FFT image such that part in the range of 2.8 nm$^{-1}$ to 5.0 nm$^{-1}$ from the reference point is left. After the mask processing, the FFT image is subjected to inverse fast Fourier transform (IFFT) to obtain a processed image. The image obtained in this manner is referred to as an FFT filtering image. The FFT filtering image is a Cs-corrected high-resolution TEM image from which a periodic component is extracted and shows a lattice arrangement.

In FIG. 43D, a portion in which the lattice arrangement is broken is shown by dashed lines. A region surrounded by dashed lines corresponds to one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 43E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, a distorted pentagon, or a distorted heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in the a-b plane direction, and its crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (e.g., silicon) having stronger bonding force to oxygen than a metal element constituting a part of an oxide semiconductor extracts oxygen from the oxide semiconductor, which results in a disordered atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having few impurities and oxygen vacancies is an oxide semiconductor with a low carrier density (specifically, lower than $8 \times 10^{11}$ cm$^{-3}$, preferably lower than $1 \times 10^{11}$ cm$^{-3}$, further preferably lower than $1 \times 10^{10}$ cm$^{-3}$, and higher than or equal to $1 \times 10^{-9}$ cm$^{-3}$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be regarded as an oxide semiconductor having stable characteristics.

<5-3. nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 44A:
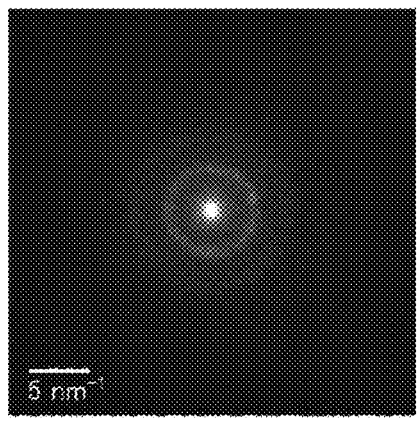
FIGS. 44A to 44D show electron diffraction patterns and a cross-sectional TEM image of an nc-OS.
Figure 44B:
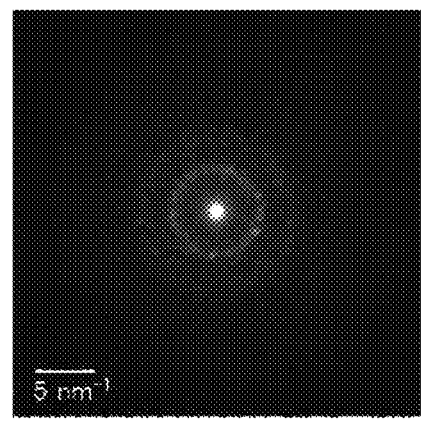

For example, when an electron beam with a probe diameter of 50 nm is incident on a 34-nm-thick region of a thinned nc-OS including an InGaZnO$_4$ crystal in the direction parallel to the formation surface, a ring-like diffraction pattern (nanobeam electron diffraction pattern) shown in FIG. 44A is observed. FIG. 44B shows a diffraction pattern (nanobeam electron diffraction pattern) obtained when an electron beam with a probe diameter of 1 nm is incident on the same sample. In FIG. 44B, a plurality of spots are observed in a ring-like region. Thus, ordering in an nc-OS is not observed with an electron beam with a probe diameter of 50 nm but is observed with an electron beam with a probe diameter of 1 nm.

Figure 44C:
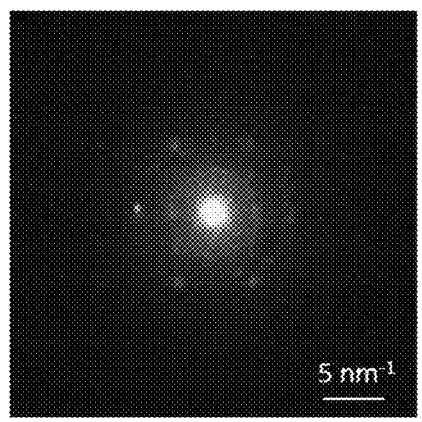

When an electron beam with a probe diameter of 1 nm is incident on a region with a thickness less than 10 nm, an electron diffraction pattern in which spots are arranged in an approximately regular hexagonal shape as shown in FIG. 44C is observed in some cases. This means that an nc-OS has a well-ordered region, that is, a crystal, in the thickness range of less than 10 nm. Note that an electron diffraction pattern having regularity is not observed in some regions because crystals are aligned in various directions.

Figure 44D:
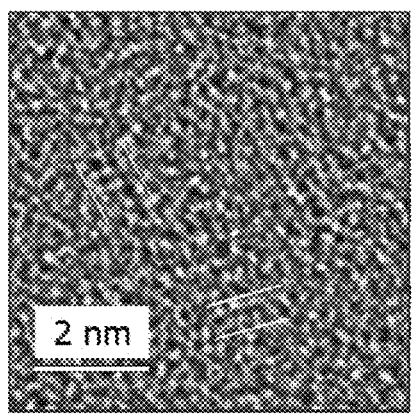

FIG. 44D shows a Cs-corrected high-resolution TEM image of a cross section of an nc-OS observed in the direction substantially parallel to the formation surface. In the high-resolution TEM image, the nc-OS has a region in which a crystal part is observed as indicated by additional lines and a region in which a crystal part is not clearly observed. In most cases, the size of a crystal part included in the nc-OS is greater than or equal to 1 nm and less than or equal to 10 nm, specifically greater than or equal to 1 nm and less than or equal to 3 nm. Note that an oxide semiconductor including a crystal part whose size is greater than 10 nm and less than or equal to 100 nm may be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS.

<5-4. a-like OS>

An a-like OS has a structure between the structure of an nc-OS and the structure of an amorphous oxide semiconductor.

Figure 45A:
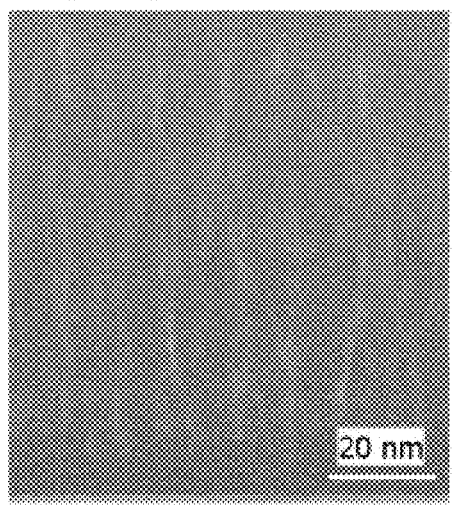
FIGS. 45A and 45B show cross-sectional TEM images of an a-like OS.
Figure 45B:
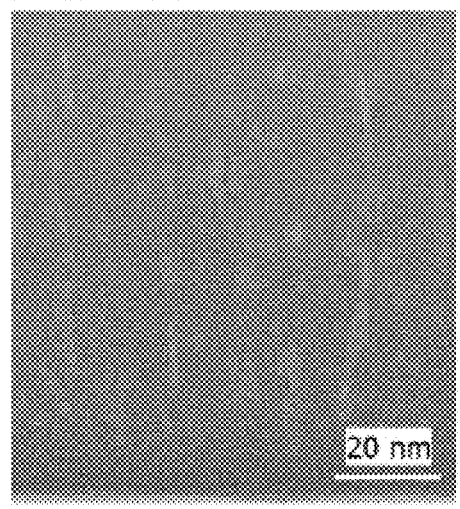

FIGS. 45A and 45B show high-resolution cross-sectional TEM images of an a-like OS. The high-resolution cross-sectional TEM image of the a-like OS in FIG. 45A is taken at the start of the electron irradiation. The high-resolution cross-sectional TEM image of the a-like OS in FIG. 45B is taken after the irradiation with electrons ($e^-$) at $4.3\times10^8$ $e^-/nm^2$. FIGS. 45A and 45B show that striped bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion in which the spacing between lattice fringes is greater than or equal to 0.28 nm and less than or equal to 0.30 nm is regarded as a crystal part of $InGaZnO_4$ in the following description. Each lattice fringe corresponds to the a-b plane of the $InGaZnO_4$ crystal.

Figure 46:
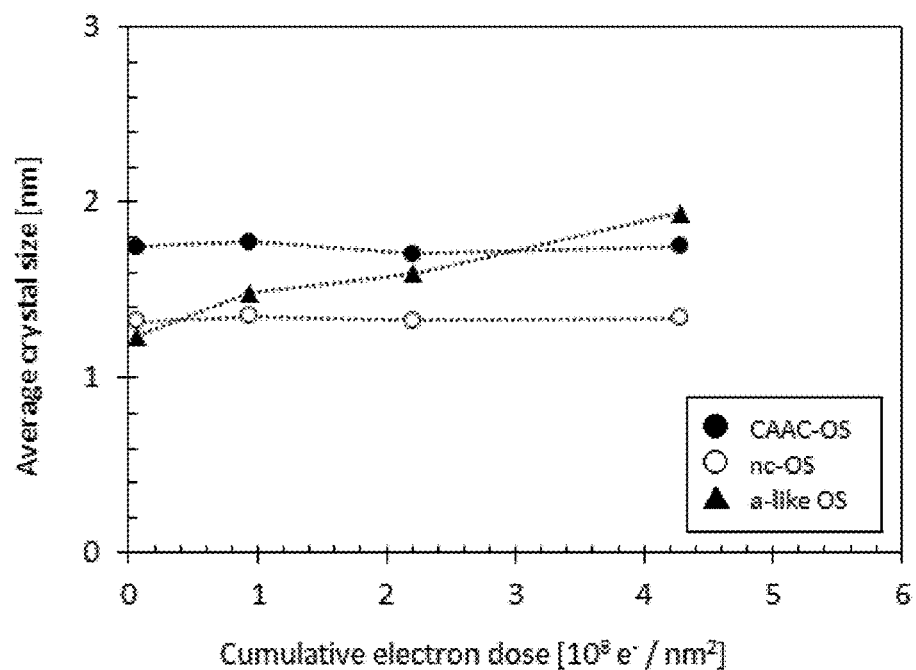
FIG. 46 shows a change in crystal part of an In—Ga—Zn oxide induced by electron irradiation.

FIG. 46 shows a change in the average size of crystal parts (at 22 points to 30 points) in each sample. Note that the crystal part size corresponds to the length of a lattice fringe. FIG. 46 indicates that the crystal part size in the a-like OS increases with an increase in the cumulative electron dose in obtaining TEM images, for example. As shown in FIG. 46, a crystal part with a size of approximately 1.2 nm (also referred to as an initial nucleus) at the start of TEM observation grows to a size of approximately 1.9 nm at a cumulative electron (e) dose of $4.2\times10^8$ $e^-/nm^2$. In contrast, the crystal part sizes in the nc-OS and the CAAC-OS show few changes from the start of electron irradiation to a cumulative electron dose of $4.2\times10^8$ $e^-/nm^2$. As shown in FIG. 46, the crystal part sizes in the nc-OS and the CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of the electron beam irradiation were as follows: the accelerating voltage was 300 kV; the current density was $6.7\times10^5$ $e^-/(nm^2 \cdot s)$; and the diameter of an irradiation region was 230 nm.

In this manner, growth of the crystal part in the a-like OS may be induced by electron irradiation. In contrast, in the nc-OS and the CAAC-OS, growth of the crystal part is hardly induced by electron irradiation. That is, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single-crystal oxide semiconductor having the same composition. The density of the nc-OS and the density of the CAAC-OS are each higher than or equal to 92.3% and lower than 100% of the density of the single-crystal oxide semiconductor having the same composition. It is difficult to deposit an oxide semiconductor having a density lower than 78% of the density of the single-crystal oxide semiconductor.

For example, in the case of an oxide semiconductor whose atomic ratio of In to Ga and Zn is 1:1:1, the density of single-crystal $InGaZnO_4$ with a rhombohedral crystal structure is 6.357 $g/cm^3$. Accordingly, in the case of the oxide semiconductor whose atomic ratio of In to Ga and Zn is 1:1:1, the density of the a-like OS is higher than or equal to 5.0 $g/cm^3$ and lower than 5.9 $g/cm^3$, for example. In the case of the oxide semiconductor whose atomic ratio of In to Ga and Zn is 1:1:1, the density of the nc-OS and the density of the CAAC-OS are each higher than or equal to 5.9 $g/cm^3$ and lower than 6.3 $g/cm^3$, for example.

In the case where an oxide semiconductor having a certain composition does not exist in a single-crystal state, single-crystal oxide semiconductors with different compositions are combined at an adequate ratio, which makes it possible to calculate a density equivalent to that of a single-crystal oxide semiconductor with the desired composition. The density of a single-crystal oxide semiconductor having the desired composition may be calculated using a weighted average with respect to the combination ratio of the single-crystal oxide semiconductors with different compositions. Note that it is preferable to use as few kinds of single-crystal oxide semiconductors as possible to calculate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

The structure described in this embodiment can be combined with any of the structures described in the other embodiments.

Embodiment 6

In this embodiment, a display module and electronic devices that include the display device of one embodiment of the present invention are described with reference to FIG. 47, FIGS. 48A to 48E, FIGS. 49A to 49E, and FIGS. 50A and 50B.

<6-1. Display Module>

Figure 47:
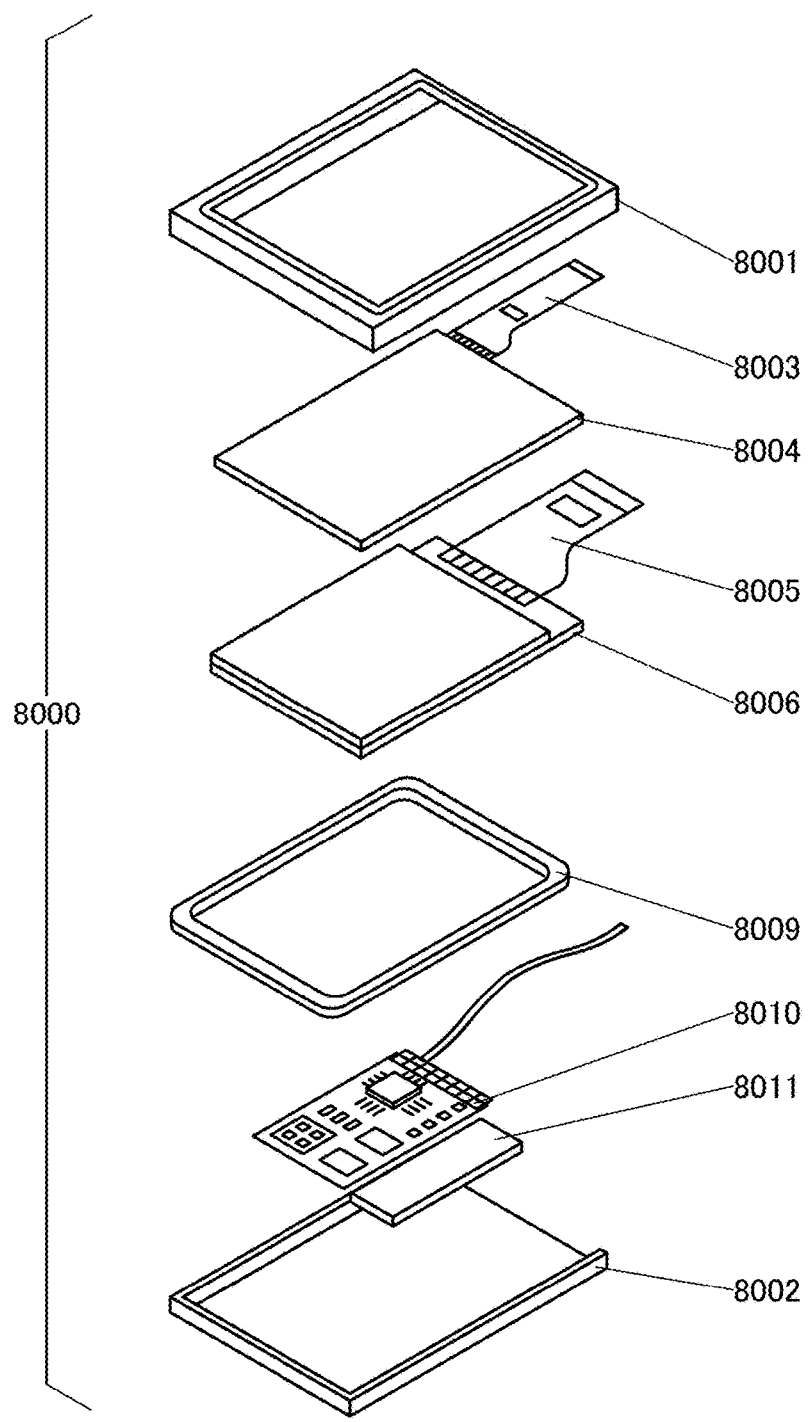
FIG. 47 illustrates a display module.

In a display module 8000 illustrated in FIG. 47, a touch panel 8004 connected to an FPC 8003, a display panel 8006 connected to an FPC 8005, a frame 8009, a printed board 8010, and a battery 8011 are provided between an upper cover 8001 and a lower cover 8002.

The display device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may overlap with the display panel 8006. Alternatively, a counter substrate (sealing substrate) of the display panel 8006 can have a touch panel function. Alternatively, a photosensor may be provided in each pixel of the display panel 8006 so as to function as an optical touch panel.

The frame 8009 protects the display panel 8006 and functions as an electromagnetic shield for blocking electromagnetic waves generated by the operation of the printed board 8010. The frame 8009 can function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<6-2. Electronic Device>

FIGS. 48A to 48E and FIGS. 49A to 49E illustrate electronic devices. These electronic devices can include a housing 9000, a display portion 9001, a camera 9002, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 48A to 48E and FIGS. 49A to 49E can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions of the electronic devices illustrated in FIGS. 48A to 48E and FIGS. 49A to 49E are not limited thereto, and the electronic devices may have other functions.

The electronic devices illustrated in FIGS. 48A to 48E and FIGS. 49A to 49E are described in detail below.

Figure 48A:
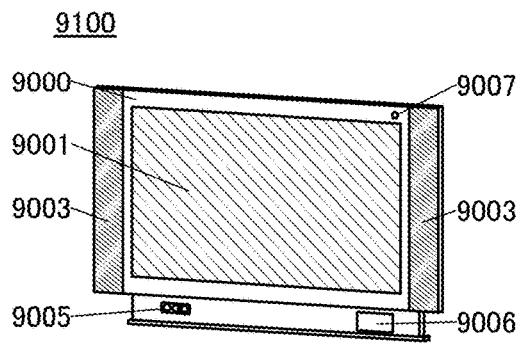
FIGS. 48A to 48E illustrate electronic devices.

FIG. 48A is a perspective view illustrating a television device 9100. The television device 9100 can include the display portion 9001 having a large screen size of, for example, 50 inches or more, 80 inches or more, or 100 inches or more.

FIG. 48B, FIG. 48C, FIG. 48D, and FIG. 48E are perspective views illustrating a portable information terminal 9101, a portable information terminal 9102, a portable information terminal 9103, and a portable information terminal 9104, respectively.

Figure 48B:
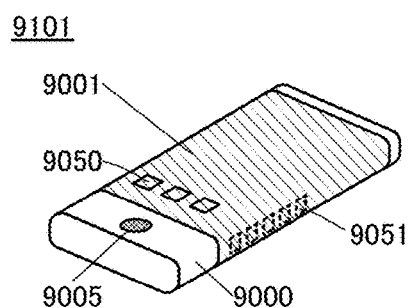

The portable information terminal 9101 illustrated in FIG. 48B has, for example, one or more of a function of a telephone set, a notebook, and an information browsing system. Specifically, the portable information terminal 9101 can be used as a smartphone. Although not illustrated, the speaker 9003, the connection terminal 9006, the sensor 9007, and the like may be provided in the portable information terminal 9101. The portable information terminal 9101 can display characters and image information on its plurality of surfaces. For example, three operation buttons 9050 (also referred to as operation icons or simply icons) can be displayed on one surface of the display portion 9001. Furthermore, information 9051 indicated by dashed rectangles can be displayed on another surface (for example, a side surface) of the display portion 9001. Examples of the information 9051 include notification from a social networking service (SNS), display indicating reception of an e-mail or an incoming call, the title of the e-mail, the SNS, or the like, the sender of the e-mail, the SNS, or the like, the date, the time, remaining battery, and the strength of a received signal. Alternatively, the operation buttons 9050 or the like may be displayed in place of the information 9051. The display portion 9001 of the portable information terminal 9101 partly has a curved surface.

Figure 48D:
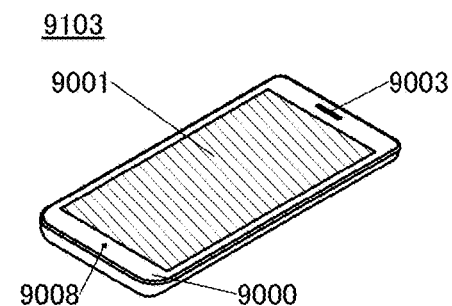
Figure 48C:
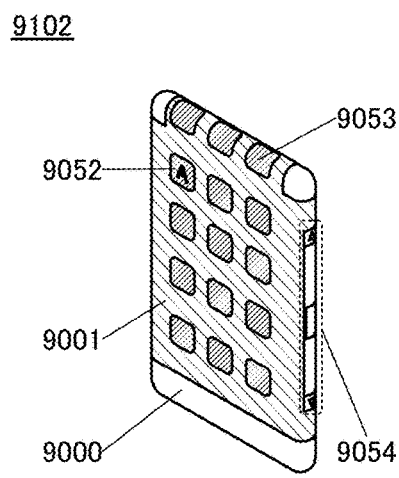

The portable information terminal 9102 illustrated in FIG. 48C has a function of displaying information, for example, on three or more sides of the display portion 9001. Here, information 9052, information 9053, and information 9054 are displayed on different sides. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call. The display portion 9001 of the portable information terminal 9102 partly has a curved surface.

Unlike in the portable information terminals 9101 and 9102 described above, the display portion 9001 does not have a curved surface in the portable information terminal 9103 illustrated in FIG. 48D.

Figure 48E:
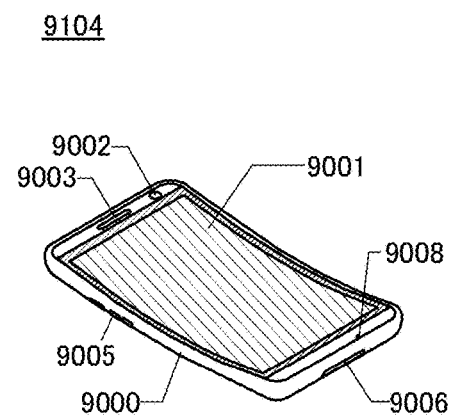

The display portion 9001 of the portable information terminals 9104 illustrated in FIG. 48E is curved. As illustrated in FIG. 48E, it is preferable that the portable information terminal 9104 be provided with a camera 9002 to have a function of taking a still image, a function of taking a moving image, a function of storing the taken image in a memory medium (an external memory medium or a memory medium incorporated in the camera), a function of displaying the taken image on the display portion 9001, or the like.

Figure 49A:
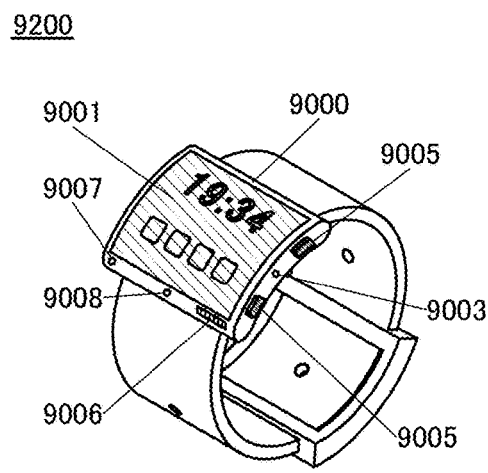
FIGS. 49A to 49E are perspective views illustrating a display device.
Figure 49B:
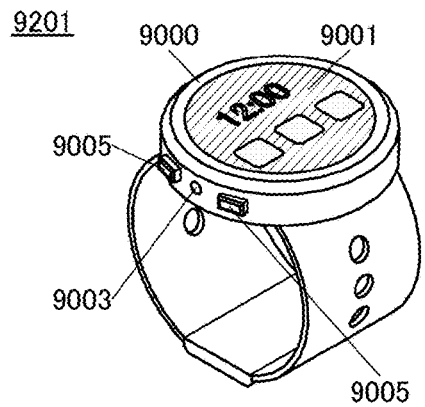

FIG. 49A is a perspective view of a watch-type portable information terminal 9200. FIG. 49B is a perspective view of a watch-type portable information terminal 9201.

The portable information terminal 9200 illustrated in FIG. 49A is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. Moreover, the portable information terminal 9200 includes the connection terminal 9006, and data can be directly transmitted to and received from another information terminal via a connector. Charging through the connection terminal 9006 is possible. Note that the charging operation may be performed by wireless power feeding without using the connection terminal 9006.

Unlike in the portable information terminal 9200 illustrated in FIG. 49A, the display surface of the display portion 9001 is not curved in the portable information terminal 9201 illustrated in FIG. 49B. Furthermore, the external state of the display portion of the portable information terminal 9201 is a non-rectangular shape (a circular shape in FIG. 49B).

Figure 49C:
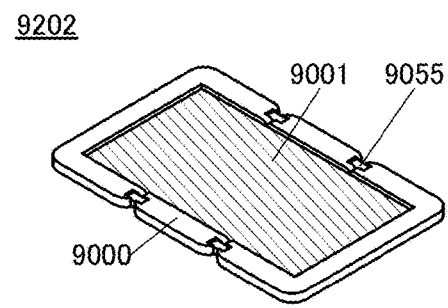
Figure 49D:
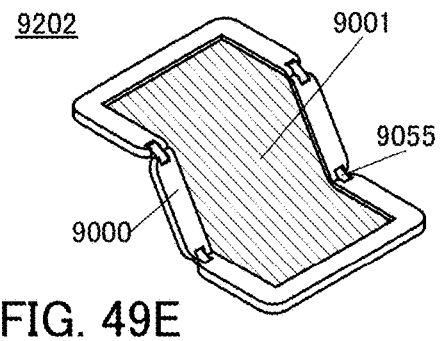
Figure 49E:
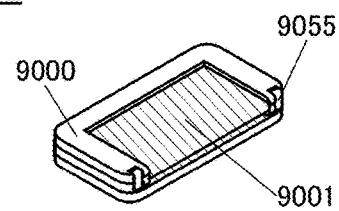

FIGS. 49C, 49D, and 49E are perspective views of a foldable portable information terminal 9202. FIG. 49C is a perspective view illustrating the portable information terminal 9202 that is opened. FIG. 49D is a perspective view illustrating the portable information terminal 9202 that is being opened or being folded. FIG. 49E is a perspective view illustrating the portable information terminal 9202 that is folded.

The folded portable information terminal 9202 is highly portable, and the opened portable information terminal 9202 is highly browsable due to a seamless large display region. The display portion 9001 of the portable information terminal 9202 is supported by three housings 9000 joined together by hinges 9055. By folding the portable information terminal 9202 at a connection portion between two housings 9000 with the hinges 9055, the portable information terminal 9202 can be reversibly changed in shape from opened to folded. For example, the portable information terminal 9202 can be bent with a radius of curvature of greater than or equal to 1 mm and less than or equal to 150 mm.

The display device which is one embodiment of the present invention can be preferably used for the display portion 9001.

Figure 50A:
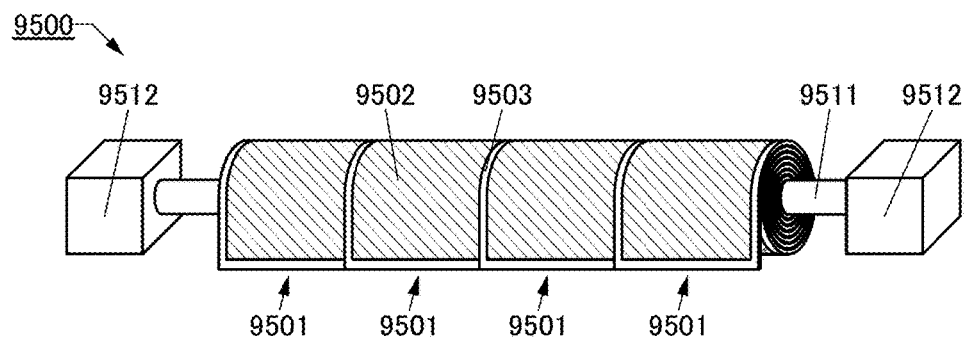
FIGS. 50A and 50B are perspective views illustrating a display device.
Figure 50B:
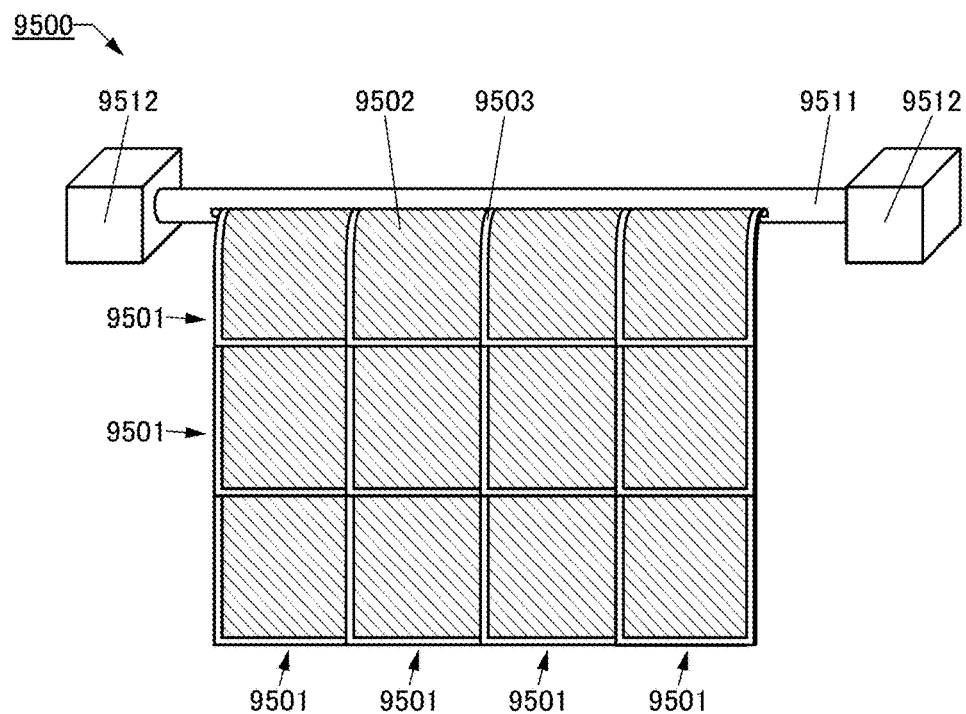

FIGS. 50A and 50B are perspective views of a display device 9500 including a plurality of display panels. Note that the plurality of display panels are wound in the perspective view in FIG. 50A, and are unwound in the perspective view in FIG. 50B.

The display device 9500 illustrated in FIGS. 50A and 50B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 50A and 50B, without limitation to this structure, the display regions 9502 of the adjacent display panels 9501 may overlap with each other without any space so that a continuous display region 9502 is obtained, for example.

The display device of one embodiment of the present invention can be preferably used in the display panel 9501.

Electronic devices described in this embodiment are characterized by having a display portion for displaying some sort of information. Note that the semiconductor device of one embodiment of the present invention can also be used for an electronic appliance that does not have a display portion.

The structure described in this embodiment can be used in appropriate combination with any of the structures described in the other embodiments.

Embodiment 7

In this embodiment, the structure of a data processor including the display device of one embodiment of the present invention is described with reference to FIGS. 51A and 51B.

Figure 51A:
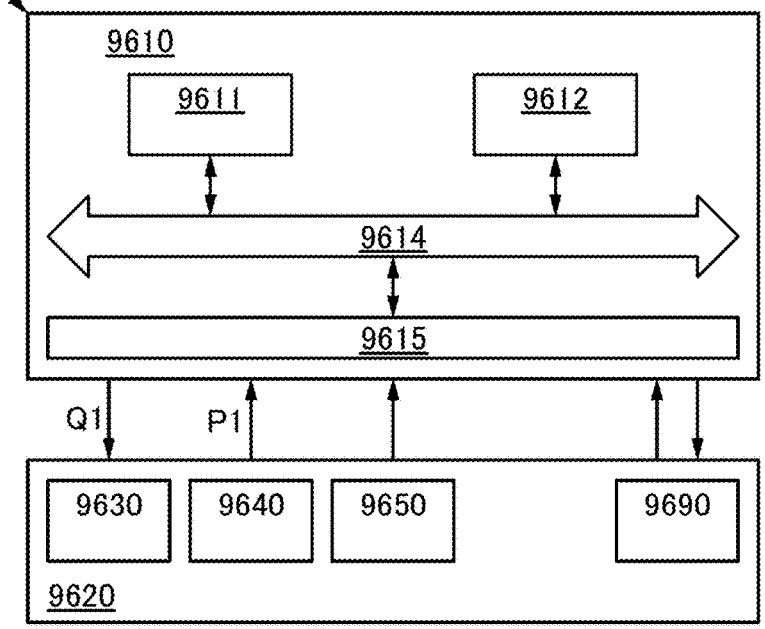
FIGS. 51A and 51B illustrate a structure of a data processor.
Figure 51B:
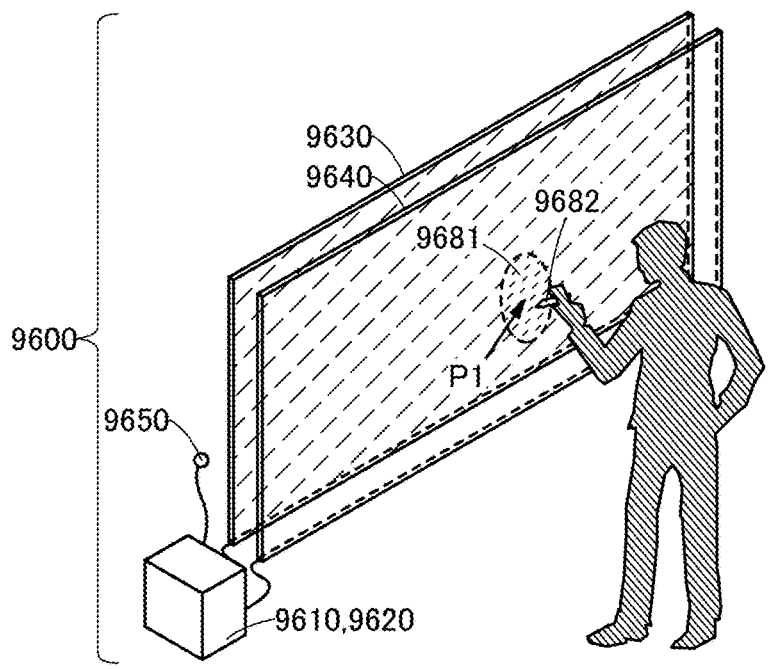

FIG. 51A is a block diagram illustrating the structure of a data processor 9600 including the display device of one embodiment of the present invention. FIG. 51B is a schematic diagram illustrating the data processor 9600 being in operation.

The following describes components of the data processor 9600. In some cases, the components cannot be clearly distinguished from each other and one component also serves as another component or includes part of another component.

<7. Structure Example of Data Processor>

The data processor 9600 includes an arithmetic device 9610 and an input/output device 9620.
[Arithmetic Unit]

The arithmetic device 9610 includes an arithmetic portion 9611, a memory portion 9612, a transmission path 9614, and an input/output interface 9615.
[Arithmetic Portion]

The arithmetic portion 9611 has a function of executing a program.
[Memory Portion]

The memory portion 9612 has a function of storing a program executed by the arithmetic portion 9611, initial information, setting information, an image, or the like. Specifically, a hard disk, a flash memory, a memory including a transistor formed using an oxide semiconductor, or the like can be used as the memory portion 9612.
[Program]

A program is executed by the arithmetic portion 9611 through three steps described below with reference to FIG. 51B, for example.

In a first step, positional data P1 is acquired.

In a second step, a first region 9681 is determined on the basis of the positional data P1.

In a third step, an image (image data Q1) with higher luminance than an image displayed on a region other than the first region 9681 is produced as an image displayed on the first region 9681.

For example, the arithmetic device 9610 determines the first region 9681 on the basis of the positional data P1. The first region 9681 can have, specifically, an elliptical shape, a circular shape, a polygonal shape, a rectangular shape, or the like. A region within a 60-cm radius, preferably within a 5-30-cm radius, from the positional data P1 is determined as the first region 9681, for example.

To produce an image with higher luminance than an image displayed on a region other than the first region 9681 as an image displayed on the first region 9681, the luminance of the image displayed on the first region 9681 is increased to 110% or more, preferably 120% or more and 200% or less, of the luminance of the image displayed on the region other than the first region 9681. Alternatively, the average luminance of the image displayed on the first region 9681 is increased to 110% or more, preferably 120% or more and 200% or less, of the average luminance of the image displayed on the region other than the first region 9681.

As a result of the program, the data processor 9600 can generate the image data Q1 with higher luminance than an image displayed on a region other than the first region 9681 as an image displayed on the first region 9681 on the basis of the positional data P1. Consequently, the data processor 9600 can have high convenience and can provide operators with comfortable operation.

[Input/Output Interface]

The input/output interface 9615 includes a terminal or a wiring. The input/output interface 9615 has a function of supplying data and a function of receiving data. The input/output interface 9615 can be electrically connected to the transmission path 9614 and/or the input/output device 9620, for example.

[Transmission Path]

The transmission path 9614 includes a wiring. The transmission path 9614 has a function of supplying data and a function of receiving data. The transmission path 9614 can be electrically connected to the arithmetic portion 9611, the memory portion 9612, or the input/output interface 9615, for example.

[Input/Output Device]

The input/output device 9620 includes a display portion 9630, an input portion 9640, a sensor portion 9650, and a communication portion 9690.

[Display Portion]

The display portion 9630 includes a display panel. The display panel includes a pixel having a structure including a reflective display element and a transmissive light-emitting element. The luminance of a displayed image can be increased by increasing the reflectance of the reflective display element or the luminance of the light-emitting element with the use of the image data. That is, the display device of one embodiment of the present invention can be preferably used in the display portion 9630.

[Input Portion]

The input portion 9640 includes an input panel. The input panel includes, for example, a proximity sensor. The proximity sensor has a function of sensing a pointer 9682. Note that a finger, a stylus pen, or the like can be used as the pointer 9682. For the stylus pen, a light-emitting element such as a light-emitting diode, a metal piece, a coil, or the like can be used.

As the proximity sensor, a capacitive proximity sensor, an electromagnetic inductive proximity sensor, an infrared proximity sensor, a proximity sensor including a photoelectric conversion element, or the like can be used.

The capacitive proximity sensor includes a conductive film and has a function of sensing the proximity to the conductive film. To determine positional data, for example, a plurality of conductive films are provided in different regions of the input panel and a region where a finger or the like used as the pointer 9682 approaches can be determined in accordance with a change in parasitic capacitance of the conductive films.

The electromagnetic inductive proximity sensor includes a function of sensing the proximity of a metal piece, a coil, or the like to a sensor circuit. To determine positional data, for example, a plurality of oscillation circuits are provided in different regions of the input panel and a region where a metal piece, a coil, or the like included in a stylus pen or the like used as the pointer 9682 approaches can be determined in accordance with a change in the circuit constant of the oscillation circuits.

The photo-detection proximity sensor has a function of sensing the proximity of a light-emitting element. To determine positional data, for example, a plurality of photoelectric conversion elements are provided in different regions of the input panel and a region where a light-emitting element included in a stylus pen or the like used as the pointer 9682 approaches can be determined in accordance with a change in the electromotive force of the photoelectric conversion elements.

[Sensor Portion]

As the sensor portion 9650, an illuminance sensor that senses the environmental brightness, a human motion sensor, or the like can be used.

[Communication Portion]

The communication portion 9690 has a function of supplying data to a network and acquiring data from the network.

The data processor 9600 described above can be used for education, or can be used for a digital signage or a smart television system, for example.

Note that this embodiment can be combined with any of the other embodiments in this specification as appropriate.

Example 1

In Example 1, examples of fabricating light-emitting elements that can be used in the display device of one embodiment of the present invention are described. Note that in Example 1, a light-emitting element 1, a light-emitting element 2, and a light-emitting element 3 were fabricated.

Figure 52A:
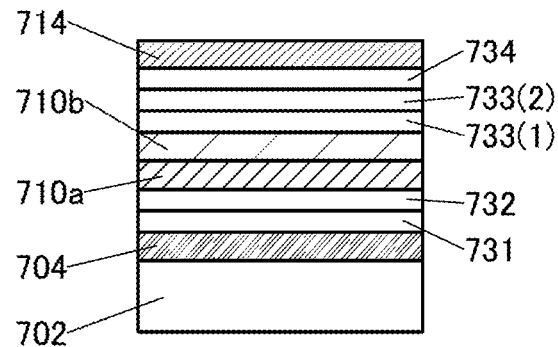
FIGS. 52A to 52C are cross-sectional views illustrating light-emitting elements in Example.
Figure 52B:
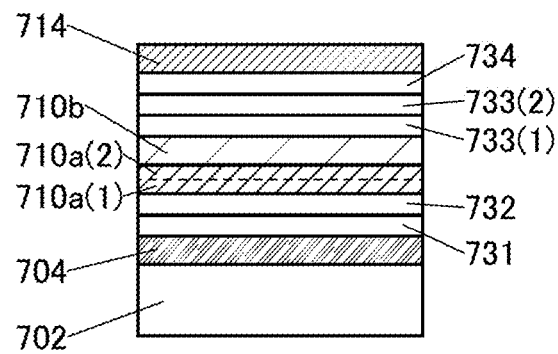
Figure 52C:
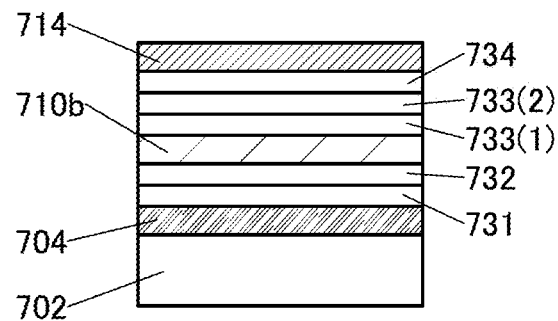
Figure 53:
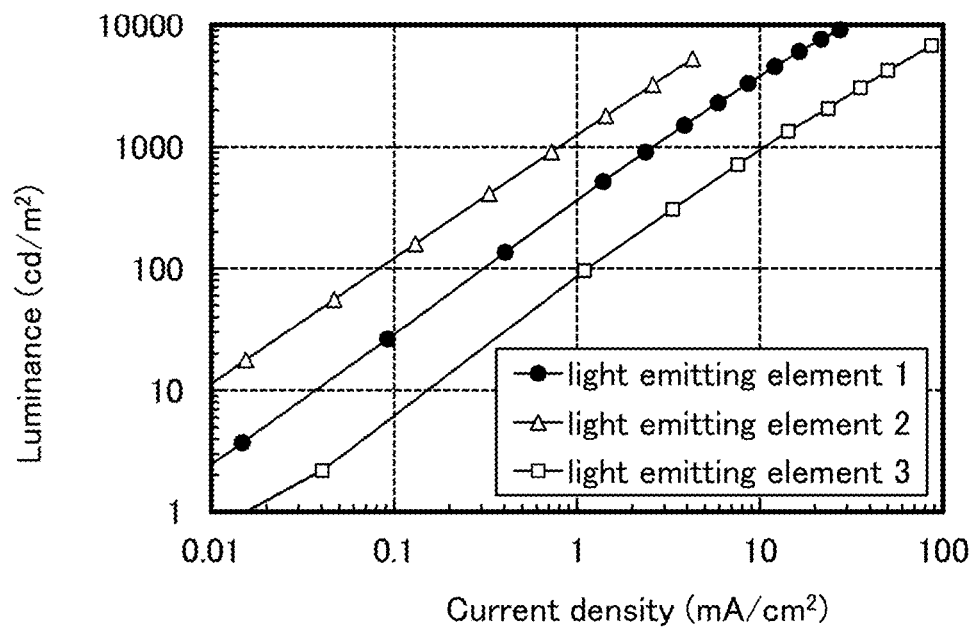
FIG. 53 is a graph showing luminance-current density characteristics of light-emitting elements in Example.
Figure 54:
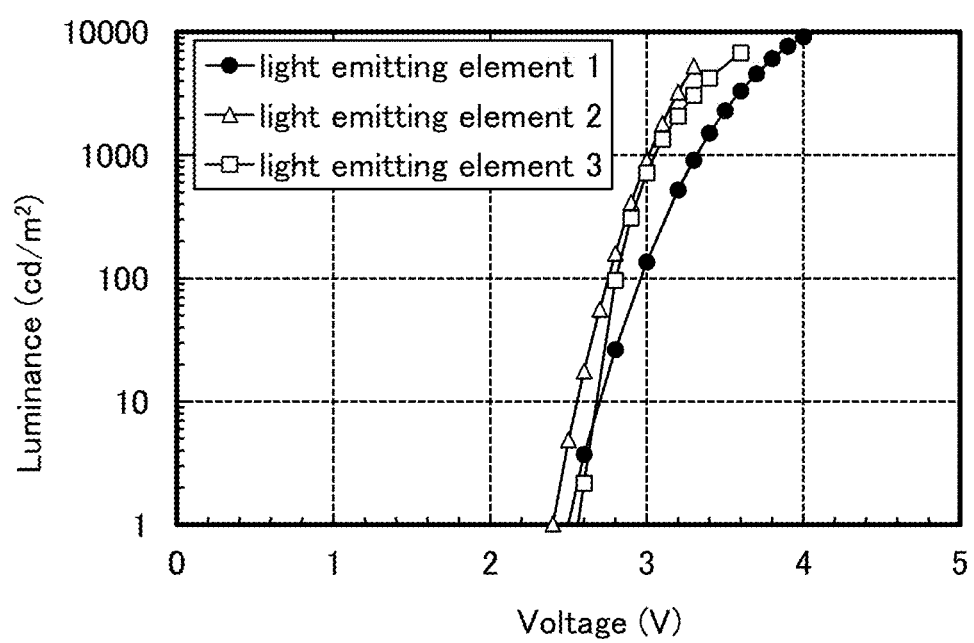
FIG. 54 is a graph showing luminance-voltage characteristics of light-emitting elements in Example.
Figure 55:
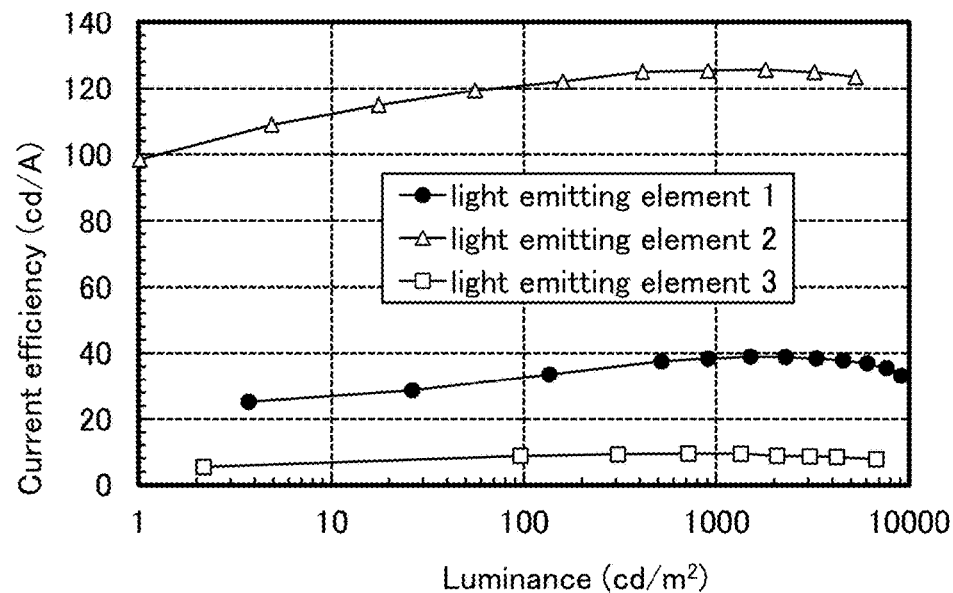
FIG. 55 is a graph showing current efficiency-luminance characteristics of light-emitting elements in Example.
Figure 56:
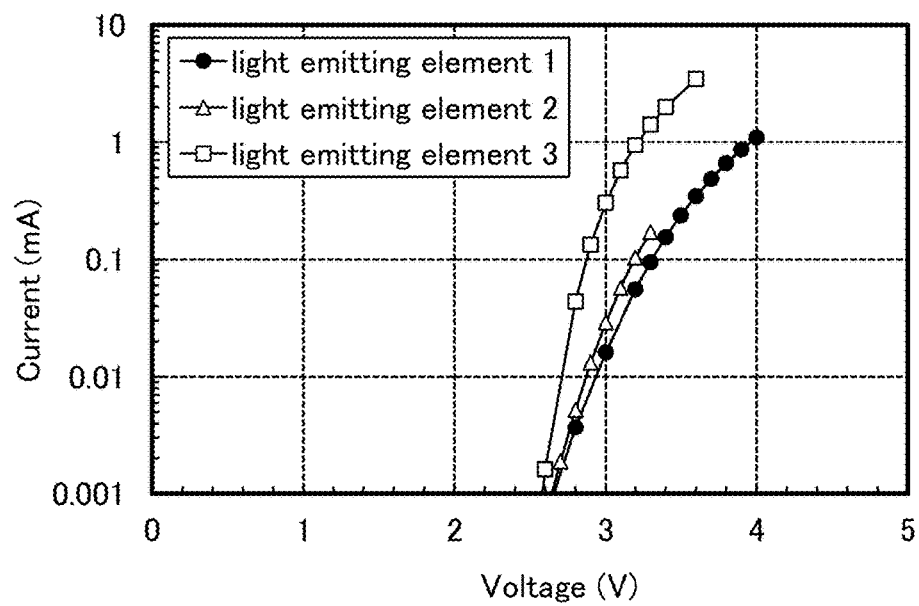
FIG. 56 is a graph showing current-voltage characteristics of light-emitting elements in Example.

FIGS. 52A, 52B, and 52C are schematic cross-sectional views of the light-emitting element 1, the light-emitting element 2, and the light-emitting element 3, respectively. Table 1 lists detailed element structures of the light-emitting elements 1 to 3, and structures and abbreviations of compounds used for the light-emitting elements are shown below.

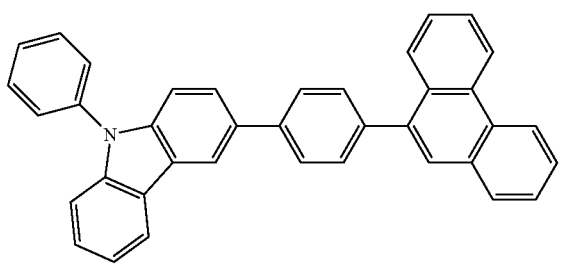

PCPPn

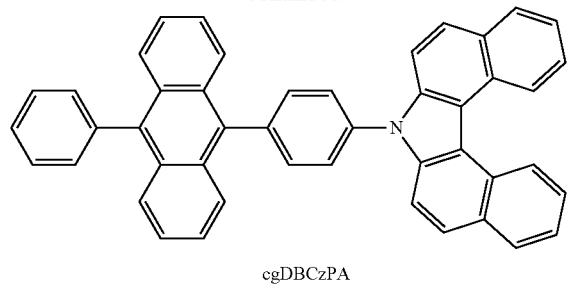
cgDBCzPA
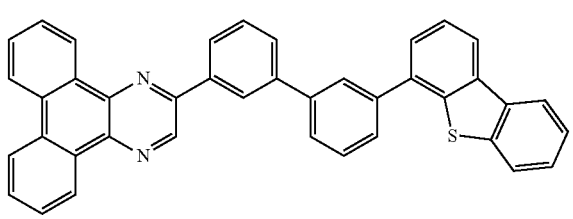
2mDBTBPDBq-II
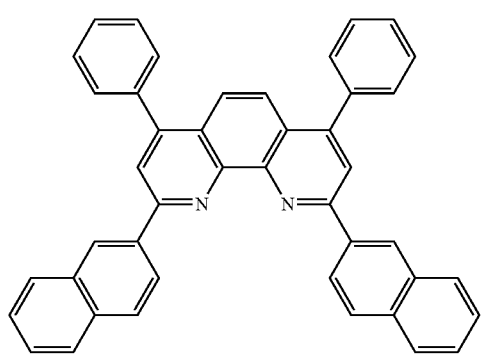
NBphen
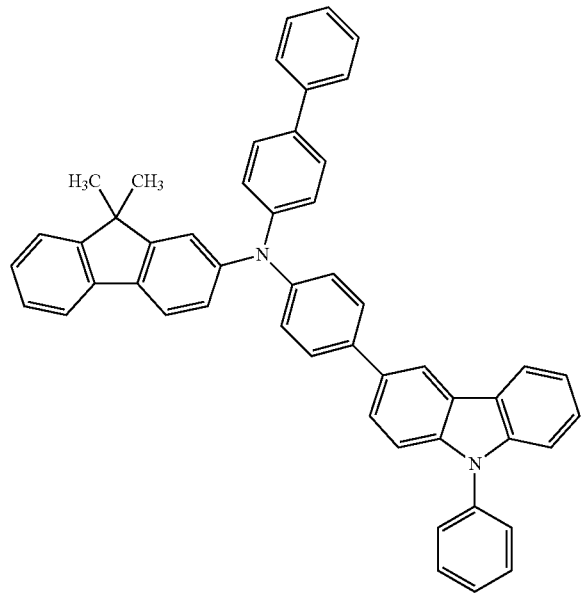
PCBBiF
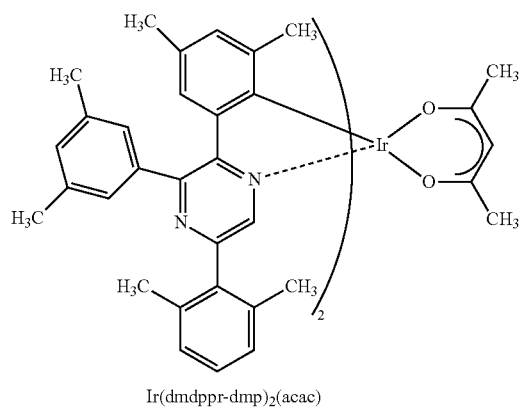
Ir(dmdppr-dmp)$_2$(acac)
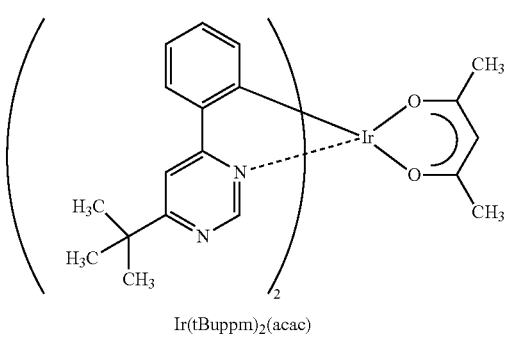
Ir(tBuppm)$_2$(acac)
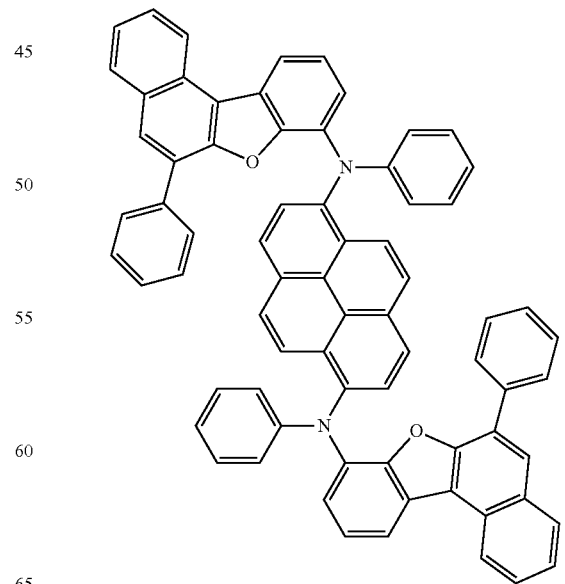
1,6BnfAPrn-03

TABLE 1

| | Layer | Reference | Thickness (nm) | Material | Weight ratio |
|---|---|---|---|---|---|
| Light-emitting element 1 | Upper electrode | 714 | 200 | Al | — |
| | Electron-injection layer | 734 | 1 | LiF | — |
| | Electron-transport layer (2) | 733(2) | 15 | NBphen | — |
| | Electron-transport layer (1) | 733(1) | 5 | cgDBCzPA | — |
| | Light-emitting layer b | 710b | 25 | cgDBCzPA:1,6BnfAPrn-03 | 1:0.05 |
| | Light-emitting layer a | 710a | 30 | 2mDBTBPDBq-II:PCBBiF:Ir(dmdppr-dmp)$_2$(acac) | 0.8:0.2:0.06 |
| | Hole-transport layer | 732 | 20 | PCPPn | — |
| | Hole-injection layer | 731 | 35 | PCPPn:MoOx | 2:1 |
| | Lower electrode | 704 | 70 | ITSO | — |
| Light-emitting element 2 | Upper electrode | 714 | 200 | Al | — |
| | Electron-injection layer | 734 | 1 | LiF | — |
| | Electron-transport layer (2) | 733(2) | 15 | NBphen | — |
| | Electron-transport layer (1) | 733(1) | 5 | cgDBCzPA | — |
| | Light-emitting layer b | 710b | 25 | cgDBCzPA:1,6BnfAPrn-03 | 1:0.05 |
| | Light-emitting layer a(2) | 710a(2) | 10 | 2mDBTBPDBq-II:Ir(tBuppm)$_2$(acac) | 0.7:0.06 |
| | Light-emitting layer a(1) | 710a(1) | 20 | 2mDBTBPDBq-II:PCBBiF:Ir(tBuppm)$_2$(acac) | 0.7:0.3:0.06 |
| | Hole-transport layer | 732 | 20 | PCPPn | — |
| | Hole-injection layer | 731 | 35 | PCPPn:MoOx | 2:1 |
| | Lower electrode | 704 | 70 | ITSO | — |
| Light-emitting element 3 | Upper electrode | 714 | 200 | Al | — |
| | Electron-injection layer | 734 | 1 | LiF | — |
| | Electron-transport layer (2) | 733(2) | 15 | NBphen | — |
| | Electron-transport layer (1) | 733(1) | 5 | cgDBCzPA | — |
| | Light-emitting layer b | 710b | 25 | cgDBCzPA:1,6BnfAPrn-03 | 1:0.05 |
| | Hole-transport layer | 732 | 20 | PCPPn | — |
| | Hole-injection layer | 731 | 35 | PCPPn:MoOx | 2:1 |
| | Lower electrode | 704 | 70 | ITSO | — |

<1-1. Method for Fabricating Light-Emitting Element 1>

First, over a substrate 702, an ITSO film was formed as a lower electrode 704 by a sputtering method. Note that the thickness of the lower electrode 704 was 70 nm, and the area of the lower electrode 704 was 4 mm$^2$ (2 mm×2 mm).

Then, for pretreatment before deposition of an organic compound layer by evaporation, the lower electrode 704 side of the substrate 702 was washed with water, baking was performed at 200° C. for 1 hour, and then UV ozone treatment was performed on a surface of the lower electrode 704 for 370 seconds.

After that, the substrate 702 was transferred into a vacuum evaporation apparatus where the pressure had been reduced to approximately 10$^{-4}$ Pa, and was subjected to vacuum baking at 170° C. for 60 minutes in a heating chamber of the vacuum evaporation apparatus, and then the substrate 702 was cooled down for approximately 30 minutes.

Next, the substrate 702 was fixed to a holder provided in the vacuum evaporation apparatus such that a surface of the substrate over which the lower electrode 704 was formed faced downward.

In the light-emitting element 1, by a vacuum evaporation method, a hole-injection layer 731, a hole-transport layer 732, a light-emitting layer 710a, a light-emitting layer 710b, an electron-transport layer 733(1), an electron-transport layer 733(2), an electron-injection layer 734, and an upper electrode 714 were sequentially formed. The fabrication method is described in detail below.

First, the pressure in a vacuum apparatus was reduced to 10$^{-4}$ Pa, followed by formation of the hole-injection layer 731 over the lower electrode 704. For the hole-injection layer 731, 9-[4-(9-phenyl-9H-carbazol-3-yl)phenyl]phenanthrene (abbreviation: PCPPn) and molybdenum oxide were deposited by co-evaporation such that the weight ratio of PCPPn to molybdenum oxide was 2:1. The thickness of the hole-injection layer 731 was 35 nm.

Then, the hole-transport layer 732 was formed on the hole-injection layer 731. As the hole-transport layer 732, PCPPn was deposited by evaporation. The thickness of the hole-transport layer 732 was 20 nm.

Next, the light-emitting layer 710a was formed over the hole-transport layer 732. The light-emitting layer 710a was formed by co-evaporation of 2-[3'-(dibenzothiophen-4-yl)biphenyl-3-yl]dibenzo[f,h]quinoxaline (abbreviation: 2mDBTBPDBq-II), N-(1,1'-biphenyl-4-yl)-9,9-dimethyl-N-[4-(9-phenyl-9H-carbazol-3-yl)phenyl]-9H-fluor en-2-amine (abbreviation: PCBBiF), and bis{4,6-dimethyl-2-[5-(2,6-dimethylphenyl)-3-(3,5-dimethylphenyl)-2-pyrazinyl-κN]phenyl-κC}(2,4-pentanedionato-κ$^2$O,O')iridium(III) (abbreviation: Ir(dmdppr-dmp)$_2$(acac)) with a weight ratio of 2mDBTBPDBq-II to PCBBiF and Ir(dmdppr-dmp)$_2$(acac)=0.8:0.2:0.06. Note that the thickness of the light-emitting layer 710a was 30 nm. In the light-emitting layer 710a, 2mDBTBPDBq-II is a host material, PCBBiF is an assist material, and Ir(dmdppr-dmp)$_2$(acac) is a phosphorescent material (a guest material).

Next, the light-emitting layer 710b was formed over the light-emitting layer 710a. The light-emitting layer 710b was formed by co-evaporation of 7-[4-(10-phenyl-9-anthryl)phenyl]-7H-dibenzo[c,g]carbazole (abbreviation: cgDBCzPA) and N,N'-(pyrene-1,6-diyl)bis[(6,N-diphenylbenzo[b]naphtho[1,2-d]furan)-8-amine] (abbreviation: 1,6BnfAPrn-03) at a weight ratio of 1:0.05 (=cgDBCzPA: 1,6BnfAPrn-03). The thickness of the light-emitting layer 710b was 25 nm. Note that cgDBCzPA was the host material and 1,6BnfAPrn-03 was the fluorescent material (the guest material) in the light-emitting layer 710b.

Next, on the light-emitting layer 710b, the electron-transport layer 733(1) was formed by evaporation of cgDBCzPA to a thickness of 5 nm. Then, on the electron-transport layer 733(1), the electron-transport layer 733(2) was formed by evaporation of 2,9-bis(naphthalen-2-yl)-4,7-diphenyl-1,10-phenanthroline (abbreviation: NBphen) to a thickness of 15 nm. Then, on the electron-transport layer 733(2), the electron-injection layer 734 was formed by evaporation of lithium fluoride (LiF) to a thickness of 1 nm.

Then, on the electron-injection layer 734, a 200-nm-thick aluminum film was formed as the upper electrode 714.

Through the above steps, the light-emitting element over the substrate 702 was formed.

Next, the light-emitting element over the substrate 702 was sealed by being bonded to a sealing substrate (not illustrated) in a glove box in a nitrogen atmosphere so as not to be exposed to the air (specifically, a sealant was applied to surround the element, and irradiation with ultraviolet light having a wavelength of 365 nm at 6 J/cm² and heat treatment at 80° C. for one hour were performed for sealing).

<1-3. Characteristics of Light-Emitting Elements 1 to 3>

FIG. 53, FIG. 54, FIG. 55, and FIG. 56 show luminance-current density characteristics, luminance-voltage characteristics, current efficiency-luminance characteristics, and current-voltage characteristics, respectively, of the light-emitting elements 1 to 3. Note that the characteristics of the light-emitting elements were measured at room temperature (in an atmosphere kept at 25° C.).

Table 2 shows element characteristics of the light-emitting elements 1 to 3 at around 1000 cd/m².

TABLE 2

|  | Voltage (V) | Current (mA) | Current density (mA/cm²) | Chromaticity coordinates (x, y) | Luminance (cd/m²) | Current efficiency (cd/A) | External quantum efficiency (%) |
|---|---|---|---|---|---|---|---|
| Light-emitting element 1 | 3.3 | 0.09 | 2.4 | (0.66, 0.34) | 909 | 38.4 | 26.0 |
| Light-emitting element 2 | 3.0 | 0.03 | 0.7 | (0.41, 0.59) | 910 | 125.4 | 32.4 |
| Light-emitting element 3 | 3.0 | 0.30 | 7.6 | (0.14, 0.10) | 716 | 9.5 | 10.9 |

Through the above process, the light-emitting element 1 was fabricated.

<1-2. Method for Fabricating Light-Emitting Element 2>

The light-emitting element 2 was fabricated through the same steps as those for the above-described light-emitting element 1 except steps described below.

A light-emitting layer 710a(1) was formed over the hole-transport layer 732. The light-emitting layer 710a(1) was formed by co-evaporation of 2mDBTBPDBq-II, PCBBiF, and (acetylacetonato)bis(6-tert-butyl-4-phenylpyrimidinato)iridium(III) (abbreviation: [Ir(tBuppm)$_2$(acac)]) at a mass ratio of 0.7:0.3:0.06 (=2mDBTBPDBq-II: PCBBiF: [Ir(tBuppm)$_2$(acac)]). The thickness of the light-emitting layer 710a(1) was 20 nm. Note that 2mDBTBPDBq-II was the host material, PCBBiF was the assist material, and Ir(tBuppm)$_2$(acac) was the phosphorescent material (the guest material) in the light-emitting layer 710a(1).

Next, the light-emitting layer 710a(2) was formed over the light-emitting layer 710a(1). The light-emitting layer 710a(2) was formed by co-evaporation of 2mDBTBPDBq-II and Ir(tBuppm)$_2$(acac) at a weight ratio of 0.7:0.06 (=2mDBTBPDBq-II: Ir(tBuppm)$_2$(acac)). The thickness of the light-emitting layer 710a(2) was 10 nm. Note that 2mDBTBPDBq-II was the host material and Ir(tBuppm)$_2$(acac) was the phosphorescent material (the guest material) in the first light-emitting layer 710a(2).

<1-3. Method for Fabricating Light-Emitting Element 3>

The light-emitting element 3 was fabricated through the same steps as those for the above-described light-emitting element 1 except steps described below.

The light-emitting layer 710b was formed over the hole-transport layer 732. The light-emitting layer 710b was formed by co-evaporation of cgDBCzPA and 1,6BnfAPrn-03 at a weight ratio of 1:0.05 (=cgDBCzPA: 1,6BnfAPrn-03). The thickness of the light-emitting layer 710b was 25 nm. Note that cgDBCzPA was the host material and 1,6BnfAPrn-03 was the fluorescent material (the guest material) in the light-emitting layer 710b.

Note that in all the above evaporation steps for the light-emitting elements 1 to 3, a resistance heating method was used as an evaporation method.

Figure 57:
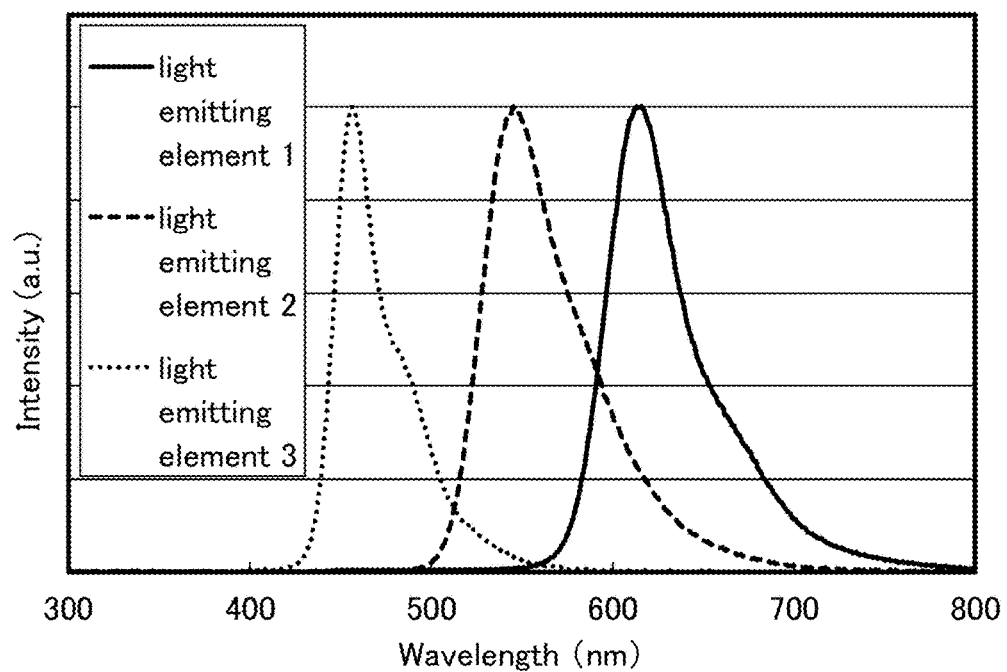
FIG. 57 is a graph showing emission spectra of light-emitting elements in Example.

FIG. 57 shows emission spectra when a current at a current density of 2.5 mA/cm² was supplied to the light-emitting elements 1 to 3. As shown in FIG. 57, an emission spectrum of the light-emitting element 1 has a peak in the red wavelength range, an emission spectrum of the light-emitting element 2 has a peak in the green wavelength range, and an emission spectrum of the light-emitting element 3 has a peak in the blue wavelength range.

As shown in Table 2, FIG. 53 to FIG. 57, the light-emitting elements 1 to 3 each have element characteristics having high efficiency and light emission in a desired wavelength range. Moreover, it is found that, in each of the light-emitting elements 1 and 2, the guest material in the light-emitting layer 510b does not contribute to light emission.

The structure described in Example 1 can be used in appropriate combination with any of the structures described in the other example and the embodiments.

Example 2

In Example 2, examples of fabricating light-emitting elements that can be used in the display device of one embodiment of the present invention are described. Note that in Example 2, a light-emitting element 4, a light-emitting element 5, and a light-emitting element 6 were fabricated.

Figure 58A:
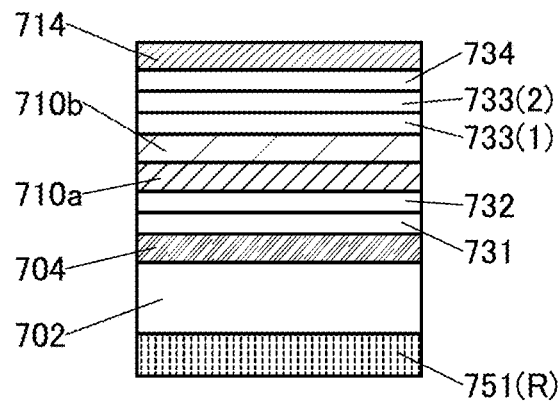
FIGS. 58A to 58C are cross-sectional views illustrating light-emitting elements in Example.
Figure 58B:
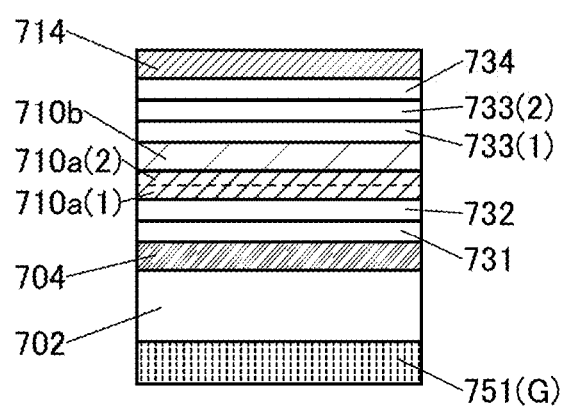
Figure 58C:
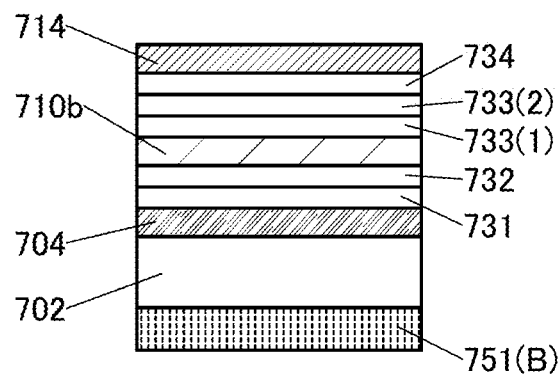
Figure 59:
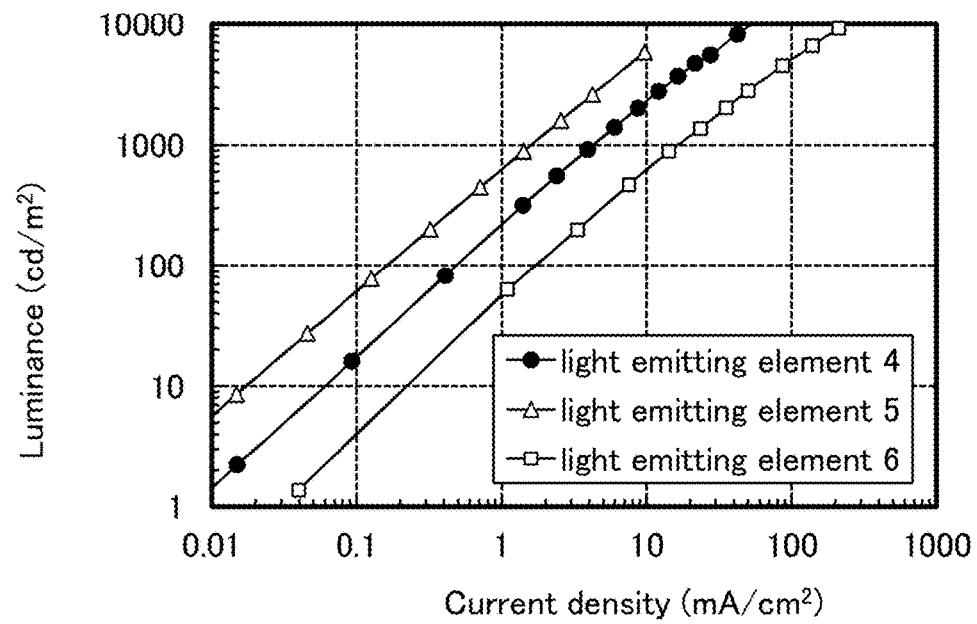
FIG. 59 is a graph showing luminance-current density characteristics of light-emitting elements in Example.
Figure 60:
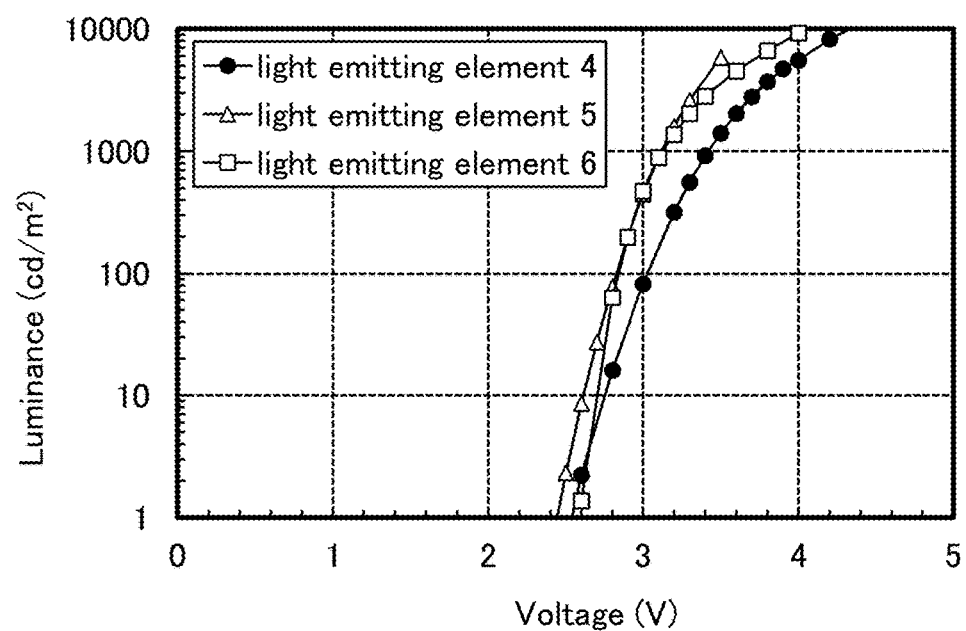
FIG. 60 is a graph showing luminance-voltage characteristics of light-emitting elements in Example.
Figure 61:
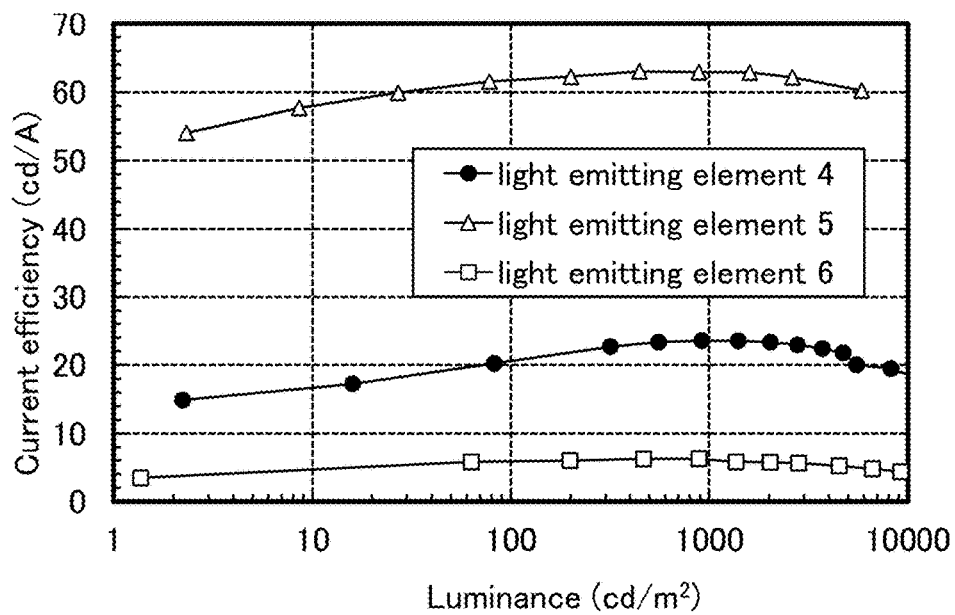
FIG. 61 is a graph showing current efficiency-luminance characteristics of light-emitting elements in Example.
Figure 62:
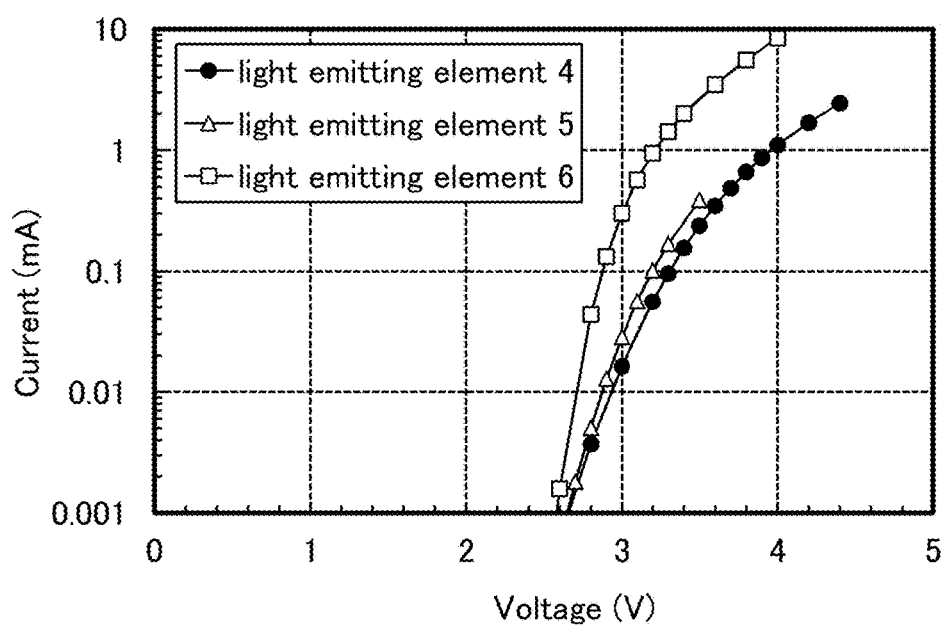
FIG. 62 is a graph showing current-voltage characteristics of light-emitting elements in Example.

FIGS. 58A, 58B, and 58C are schematic cross-sectional views of the light-emitting element 4, the light-emitting element 5, and the light-emitting element 6, respectively.

The light-emitting element 4 has a structure in which a color film 751(R) is provided in the light-emitting element 1. The light-emitting element 5 has a structure in which a color film 751(G) is provided in the light-Emitting element 2. The light-emitting element 6 has a structure in which a color film 751(B) is provided in the light-emitting element 3. Materials, manufacturing methods, and the like used for the light-emitting elements 4 to 6 were the same as those used for the light-emitting elements 1 to 3 described in Example 1.

The color film 751(R) was a color filter that transmits light in a red wavelength range, the color film 751(G) was a color filter that transmits light in a green wavelength range, and the color film 751(B) was a color filter that transmits light in a blue wavelength range.

<2. Characteristics of Light-Emitting Elements 4 to 6>

FIG. 59, FIG. 60, FIG. 61, and FIG. 62 show luminance-current density characteristics, luminance-voltage characteristics, current efficiency-luminance characteristics, and current-voltage characteristics, respectively, of the light-emitting elements 4 to 6. Note that the characteristics of the light-emitting elements were measured at room temperature (in an atmosphere kept at 25° C.).

Table 3 shows element characteristics of the light-emitting elements 4 to 6 at around 1000 cd/m².

TABLE 3

|  | Voltage (V) | Current (mA) | Current density (mA/cm²) | Chromaticity coordinates (x, y) | Luminance (cd/m²) | Current efficiency (cd/A) | External quantum efficiency (%) |
| --- | --- | --- | --- | --- | --- | --- | --- |
| Light-emitting element 4 | 3.4 | 0.16 | 3.9 | (0.68, 0.32) | 917 | 23.5 | 20.0 |
| Light-emitting element 5 | 3.1 | 0.06 | 1.4 | (0.33, 0.66) | 887 | 62.9 | 14.2 |
| Light-emitting element 6 | 3.1 | 0.57 | 14.3 | (0.14, 0.08) | 890 | 6.2 | 8.9 |

Figure 63:
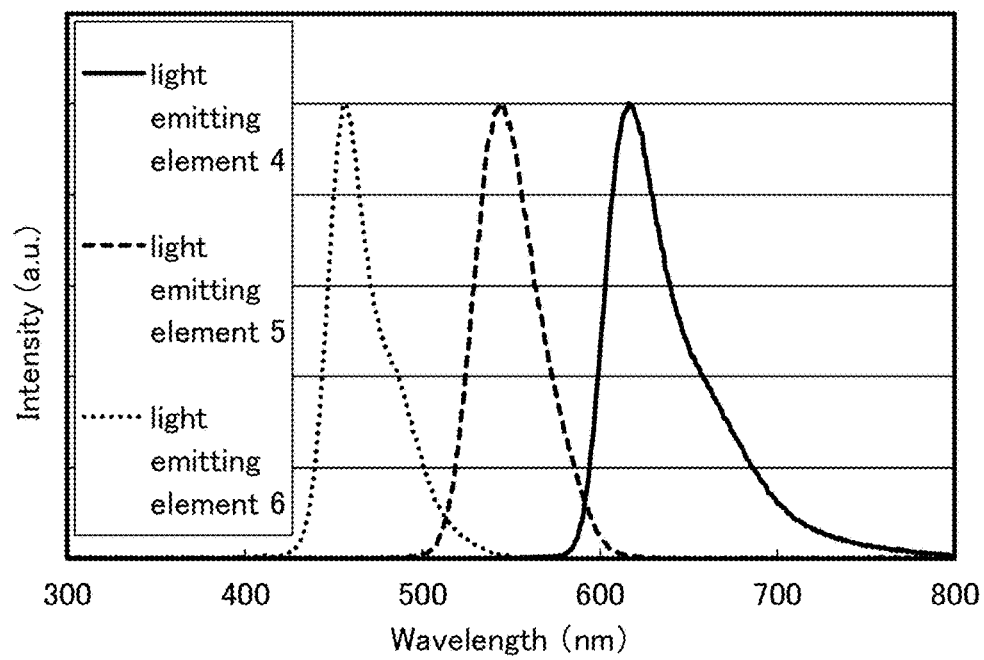
FIG. 63 is a graph showing emission spectra of light-emitting elements in Example.

FIG. 63 shows emission spectra when a current at a current density of 2.5 mA/cm² was supplied to the light-emitting elements 4 to 6. As shown in FIG. 63, an emission spectrum of the light-emitting element 4 has a peak in the red wavelength range, an emission spectrum of the light-emitting element 5 has a peak in the green wavelength range, and an emission spectrum of the light-emitting element 6 has a peak in the blue wavelength range.

As shown in Table 3, FIG. 59 to FIG. 63, the light-emitting elements 4 to 6 each have element characteristics having high efficiency and light emission in a desired wavelength range. Moreover, it is found that, in each of the light-emitting elements 4 and 5, the guest material in the light-emitting layer 710b does not contribute to light emission.

The light-emitting elements 4 to 6 include the color film 756(R), the color film 756(G), and the color film 756(B), respectively, and thus have higher color purities than the light-emitting elements 1 to 3 described in Example 1. However, the light-emitting elements 4 to 6 have lower current efficiency and external quantum efficiency owing to the color films (the color film 756(R), the color film 756(G), and the color film 756(B)). Therefore, the optimum element structure may be selected by a practitioner.

The structure described in Example 2 can be used in appropriate combination with any of the structures described in the other example and the embodiments.

EXPLANATION OF REFERENCE

10: pixel, 11: display element, 11d: display region, 12: display element, 12d: display region, 12B: light-emitting element, 12G: light-emitting element, 12R: light-emitting element, 100: transistor, 100A: transistor, 100F: transistor, 100G: transistor, 100H: transistor, 100J: transistor, 100K: transistor, 102: substrate, 104: insulating film, 106: conductive film, 108: oxide semiconductor film, 108_1: oxide semiconductor film, 108_2: oxide semiconductor film, 108_3: oxide semiconductor film, 108d: drain region, 108i: channel region, 108s: source region, 110: insulating film, 112: conductive film, 116: insulating film, 118: insulating film, 120a: conductive film, 120b: conductive film, 141a: opening, 141b: opening, 143: opening, 300A: transistor, 300B: transistor, 300C: transistor, 300D: transistor, 300E: transistor, 300F: transistor, 302: substrate, 304: conductive film, 306: insulating film, 307: insulating film, 308: oxide semiconductor film, 308_1: oxide semiconductor film, 308_2: oxide semiconductor film, 308_3: oxide semiconductor film, 312a: conductive film, 312b: conductive film, 314: insulating film, 316: insulating film, 318: insulating film, 320a: conductive film, 320b: conductive film, 341a: opening, 341b: opening, 342a: opening, 342b: opening, 342c: opening, 401: substrate, 402: conductive film, 403a: conductive film, 403b: conductive film, 403c: conductive film, 404: insulating film, 405a: conductive film, 405b: conductive film, 405c: conductive film, 405d: conductive film, 406: insulating film, 407a: conductive film, 407b: conductive film, 407c: conductive film, 407d: conductive film, 407e: conductive film, 407f: conductive film, 407g: conductive film, 408: insulating film, 409a: oxide semiconductor film, 409b: oxide semiconductor film, 409c: oxide semiconductor film, 410a: insulating film, 410b: insulating film, 410c: insulating film, 411a: oxide semiconductor film, 411b: oxide semiconductor film, 411c: oxide semiconductor film, 412: insulating film, 413: insulating film, 414a: conductive film, 414b: conductive film, 414c: conductive film, 414d: conductive film, 414e: conductive film, 414f: conductive film, 414g: conductive film, 414h: conductive film, 416: insulating film, 417: conductive film, 417B: conductive film, 417G: conductive film, 417R: conductive film, 418: insulating film, 419: EL layer, 420: conductive film, 450: opening, 452: substrate, 454: sealing material, 481: shadow mask, 482: opening, 500: display device, 502: pixel portion, 504a: gate driver circuit portion, 504b: gate driver circuit portion, 506: source driver circuit portion, 508a: external circuit, 508b: external circuit, 510b: light-emitting layer, 602: light-blocking film, 604: color film, 606: insulating film, 608: conductive film, 610a: structure body, 610b: structure body, 618a: alignment film, 618b: alignment film, 620: liquid crystal layer, 622: sealant, 624: conductor, 626: functional film, 652: substrate, 662: light-blocking film, 663: insulating film, 664: electrode, 665: electrode, 666: insulating film, 667: electrode, 668: insulating film, 670: substrate, 672: substrate, 674: bonding material, 681: insulating film, 682: conductive film, 691: touch panel, 692: touch panel, 693: touch panel, 702: substrate, 704: lower electrode, 710a: light-emitting layer, 710b: light-emitting layer, 714: upper electrode, 731: hole-injection layer, 732: hole-transport layer, 733: electron-transport layer, 734: electron-injection layer, 751: color film, 756: color film, 8000: display module, 8001: upper cover, 8002: lower cover, 8003: FPC, 8004: touch panel, 8005: FPC, 8006: display panel, 8009: frame, 8010: printed substrate, 8011: battery, 9000: housing, 9001: display portion, 9002: camera, 9003: speaker, 9005: operation key, 9006: connection terminal, 9007: sensor, 9008:

microphone, 9050: operation button, 9051: information, 9052: information, 9053: information, 9054: information, 9055: hinge, 9100: television device, 9101: partable information terminal, 9102: partable information terminal, 9103: partable information terminal, 9104: partable information terminal, 9200: partable information terminal, 9201: partable information terminal, 9202: partable information terminal, 9500: display device, 9501: display panel, 9502: display region, 9503: region, 9511: axis portion, 9512: bearing, 9600: data processor, 9610: arithmetic device, 9611: arithmetic portion, 9612: memory portion, 9614: transmission path, 9615: input/output interface, 9620: input/output device, 9630: display portion, 9640: input portion, 9650: sensor portion, 9681: region, 9682: pointer, 9690: communication portion This application is based on Japanese Patent Application serial no. 2015-195939 filed with Japan Patent Office on Oct. 1, 2015, the entire contents of which are hereby incorporated by reference.

The invention claimed is:

1. A display device comprising:
a first pixel; and
a second pixel,
wherein the first pixel and the second pixel are adjacent to each other,
wherein each of the first pixel and the second pixel comprises a first display region and a second display region,
wherein the first display region is configured to reflect incident light,
wherein the second display region is positioned inside the first display region and configured to emit light, and
wherein a position of the second display region inside the first display region in the first pixel and a position of the second display region inside the first display region in the second pixel are different from each other.

2. The display device according to claim 1,
wherein an interval between the second display region in the first pixel and the second display region in the second pixel is greater than or equal to 20 µm.

3. A display module comprising:
the display device according to claim 1; and
a touch sensor.

4. An electronic device comprising:
the display device according to claim 1; and
a battery.

5. A display device comprising:
a first pixel; and
a second pixel,
wherein the first pixel and the second pixel are adjacent to each other,
wherein each of the first pixel and the second pixel comprises a first display region, a second display region, a first display element, and a second display element,
wherein the first display region is configured to reflect incident light,
wherein the second display region is positioned inside the first display region and configured to emit light,
wherein the first display element overlaps with the first display region,
wherein the second display element overlaps with the second display region, and
wherein a position of the second display region inside the first display region in the first pixel and a position of the second display region inside the first display region in the second pixel are different from each other.

6. The display device according to claim 5,
wherein the first display element comprises a liquid crystal layer, and
wherein the second display element comprises a light-emitting layer.

7. The display device according to claim 5,
wherein colors of light emitted from the second display element in the first pixel and the second display element in the second pixel are different.

8. The display device according to claim 5,
wherein the first display element and the second display element are connected to different transistors and independently controlled.

9. The display device according to claim 8,
wherein each of the transistors comprises an oxide semiconductor film in a channel region.

10. The display device according to claim 5,
wherein an interval between the second display region in the first pixel and the second display region in the second pixel is greater than or equal to 20 µm.

11. A display module comprising:
the display device according to claim 5; and
a touch sensor.

12. An electronic device comprising:
the display device according to claim 5; and
a battery.

13. A display device comprising:
a first pixel; and
a second pixel,
wherein the first pixel and the second pixel are adjacent to each other,
wherein each of the first pixel and the second pixel comprises a first display element and a second display element,
wherein the first display element comprises a reflective film including an opening,
wherein the second display element comprises a light-emitting layer,
wherein the opening overlaps with the light-emitting layer, and
wherein a position of the opening in the first pixel and a position of the opening in the second pixel are different from each other.

14. The display device according to claim 13,
wherein the first display element comprises a liquid crystal layer.

15. The display device according to claim 13,
wherein colors of light emitted from the second display element in the first pixel and the second display element in the second pixel are different.

16. The display device according to claim 13,
wherein the first display element and the second display element are connected to different transistors and independently controlled.

17. The display device according to claim 16,
wherein each of the transistors comprises an oxide semiconductor film in a channel region.

18. The display device according to claim 13,
wherein an interval between the opening in the first pixel and the opening in the second pixel is greater than or equal to 20 µm.

19. A display module comprising:
the display device according to claim 13; and
a touch sensor.

20. An electronic device comprising:
the display device according to claim 13; and
a battery.

* * * * *